United States Patent
Togashi et al.

(10) Patent No.: US 11,974,444 B2
(45) Date of Patent: Apr. 30, 2024

(54) SOLID-STATE IMAGE SENSOR, SOLID-STATE IMAGING DEVICE, ELECTRONIC APPARATUS, AND METHOD OF MANUFACTURING SOLID-STATE IMAGE SENSOR

(71) Applicants: SONY CORPORATION, Tokyo (JP); SONY SEMICONDUCTOR SOLUTIONS CORPORATION, Kanagawa (JP)

(72) Inventors: Hideaki Togashi, Kumamoto (JP); Iwao Yagi, Kanagawa (JP); Masahiro Joei, Kanagawa (JP); Fumihiko Koga, Kanagawa (JP); Kenichi Murata, Kanagawa (JP); Shintarou Hirata, Kanagawa (JP); Yosuke Saito, Tokyo (JP); Akira Furukawa, Kumamoto (JP)

(73) Assignees: SONY CORPORATION, Tokyo (JP); SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 153 days.

(21) Appl. No.: 16/973,272

(22) PCT Filed: Jun. 11, 2019

(86) PCT No.: PCT/JP2019/023068
§ 371 (c)(1),
(2) Date: Dec. 8, 2020

(87) PCT Pub. No.: WO2019/240121
PCT Pub. Date: Dec. 19, 2019

(65) Prior Publication Data
US 2021/0249474 A1 Aug. 12, 2021

(30) Foreign Application Priority Data
Jun. 15, 2018 (JP) .................................. 2018-114469

(51) Int. Cl.
*H10K 39/32* (2023.01)
(52) U.S. Cl.
CPC .................................... *H10K 39/32* (2023.02)
(58) Field of Classification Search
CPC ......... H01L 27/14612; H01L 27/14623; H01L 27/14634; H01L 27/14636;
(Continued)

(56) References Cited

U.S. PATENT DOCUMENTS

| 8,502,212 B2* | 8/2013 | Hente | H01L 27/3204 257/40 |
| 2005/0205901 A1 | 9/2005 | Suzuki | |
| 2005/0230775 A1* | 10/2005 | Watanabe | H01L 27/14647 257/444 |
| 2009/0108757 A1* | 4/2009 | Lee | H01L 51/5281 315/51 |

(Continued)

FOREIGN PATENT DOCUMENTS

| JP | H11121731 A | 4/1999 |
| JP | 2005353626 A | 12/2005 |

(Continued)

OTHER PUBLICATIONS

International Search Report prepared by the Japan Patent Office dated Aug. 14, 2019, for International Application No. PCT/JP2019/023068.

*Primary Examiner* — Meiya Li
(74) *Attorney, Agent, or Firm* — SHERIDAN ROSS P.C.

(57) ABSTRACT

There is provided a solid-state image sensor, a solid-state imaging device, an electronic apparatus, and a method of manufacturing a solid-state image sensor capable of improving characteristics. There is provided a solid-state image sensor including a stacked structure that includes a semiconductor substrate, a first photoelectric converter provided above the semiconductor substrate and converting light into charges, and a second photoelectric converter provided above the first photoelectric converter and converting light into charges, where the first photoelectric converter and the (Continued)

second photoelectric converter include a photoelectric conversion stacked structure in which a common electrode, a photoelectric conversion film, and a readout electrode are stacked so that the first photoelectric converter and the second photoelectric converter are in a line-symmetrical relationship with each other with a vertical plane perpendicular to a stacking direction of the stacked structure as an axis of symmetry.

19 Claims, 45 Drawing Sheets

(58) Field of Classification Search
CPC .......... H01L 27/14638; H01L 27/1464; H01L 27/14643; H01L 27/14665; H01L 27/307; H10K 39/32
See application file for complete search history.

(56) References Cited

U.S. PATENT DOCUMENTS

| | | |
|---|---|---|
| 2014/0160327 A1 | 6/2014 | Enoki et al. |
| 2014/0307134 A1 | 10/2014 | Kanda |
| 2018/0076252 A1 | 3/2018 | Togashi et al. |
| 2018/0219046 A1 | 8/2018 | Yamaguchi et al. |
| 2019/0221594 A1* | 7/2019 | Sasago ................. H04N 5/3745 |

FOREIGN PATENT DOCUMENTS

| | | |
|---|---|---|
| JP | 2006269922 A | 10/2006 |
| JP | 2008-288404 | 11/2008 |
| JP | 2014-116380 | 6/2014 |
| JP | 2017-157816 | 9/2016 |
| JP | 2017-037952 | 2/2017 |
| JP | 2017-098513 | 6/2017 |
| JP | 2017-183992 | 10/2017 |
| WO | WO 2014/027588 | 2/2014 |

* cited by examiner

SOLID-STATE IMAGE SENSOR, SOLID-STATE IMAGING DEVICE, ELECTRONIC APPARATUS, AND METHOD OF MANUFACTURING SOLID-STATE IMAGE SENSOR

CROSS REFERENCE TO RELATED APPLICATIONS

This application is a national stage application under 35 U.S.C. 371 and claims the benefit of PCT Application No. PCT/JP2019/023068 having an international filing date of 11 Jun. 2019, which designated the United States, which PCT application claimed the benefit of Japanese Patent Application No. 2018-114469 filed 15 Jun. 2018, the entire disclosures of each of which are incorporated herein by reference.

FIELD

The present disclosure relates to a solid-state image sensor, a solid-state imaging device, an electronic apparatus, and a method of manufacturing a solid-state image sensor.

BACKGROUND

In recent years, in solid-state image sensors such as charge coupled device (CCD) image sensors and complementary metal-oxide-semiconductor (CMOS) image sensors, there is proposed a stacked structure in which three layers, that is, a photoelectric conversion element for detecting red light, a photoelectric conversion element for detecting green light, and a photoelectric conversion element for detecting blue light in unit pixels are vertically stacked, and one unit pixel can detect light of three colors (e.g., Patent Literatures 1 to 3 below).

CITATION LIST

Patent Literature

Patent Literature 1: JP 2017-157816 A
Patent Literature 2: WO 2014/027588 A
Patent Literature 3: JP 2013-55252 A

SUMMARY

Technical Problem

However, when a plurality of photoelectric conversion elements is stacked as in Patent Literatures 1 to 3 described above, it is difficult to avoid an increase in the distance between the photoelectric conversion element located above and the photoelectric conversion element located below in the stacking direction. In such a stacked structure, due to the fact that the distance is long, it is difficult to suitably focus light on all the stacked photoelectric conversion elements, and this becomes one of the factors that hinders the improvement of the characteristics of the solid-state image sensor. Accordingly, in order to improve the characteristics of the solid-state image sensor, further studies on the stacked structure in the unit pixels have been required.

In addition, in conventional proposals, it is difficult to say that a suitable arrangement of pixel transistors for outputting charge from each photoelectric conversion element as a pixel signal has been specifically studied. Therefore, in order to improve the characteristics of the solid-state image sensor, further studies on the stacked structure have been required from the viewpoint of the arrangement of the pixel transistors.

In view of the above circumstances, the present disclosure proposes new and improved solid-state image sensor, solid-state imaging device, electronic apparatus, and method of manufacturing a solid-state image sensor in which characteristics can be improved.

Solution to Problem

According to the present disclosure, a solid-state image sensor is provided that includes: a stacked structure that includes a semiconductor substrate, a first photoelectric converter provided above the semiconductor substrate and converting light into charges, and a second photoelectric converter provided above the first photoelectric converter and converting light into charges, wherein the first photoelectric converter and the second photoelectric converter include a photoelectric conversion stacked structure in which a common electrode, a photoelectric conversion film, and a readout electrode are stacked so that the first photoelectric converter and the second photoelectric converter are in a line-symmetrical relationship with each other with a vertical plane perpendicular to a stacking direction of the stacked structure as an axis of symmetry.

Moreover, according to the present disclosure, a solid-state imaging device is provided that includes a plurality of solid-state image sensors, wherein each of the solid-state image sensors includes a stacked structure that includes a first photoelectric converter provided above a semiconductor substrate and converting light into charges, and a second photoelectric converter provided above the first photoelectric converter and converting light into charges, wherein the first photoelectric converter and the second photoelectric converter include a photoelectric conversion stacked structure in which a common electrode, a photoelectric conversion film, and a readout electrode are stacked so that the first photoelectric converter and the second photoelectric converter are in a line-symmetrical relationship with each other with a vertical plane perpendicular to a stacking direction of the stacked structure as an axis of symmetry.

Moreover, according to the present disclosure, an electronic apparatus is provided that includes a solid-state imaging device including a plurality of solid-state image sensors, wherein each of the solid-state image sensors includes a stacked structure that includes a first photoelectric converter provided above a semiconductor substrate and converting light into charges, and a second photoelectric converter provided above the first photoelectric converter and converting light into charges, wherein the first photoelectric converter and the second photoelectric converter include a photoelectric conversion stacked structure in which a common electrode, a photoelectric conversion film, and a readout electrode are stacked so that the first photoelectric converter and the second photoelectric converter are in a line-symmetrical relationship with each other with a vertical plane perpendicular to a stacking direction of the stacked structure as an axis of symmetry.

Moreover, according to the present disclosure, a method of manufacturing a solid-state image sensor is provided that includes: sequentially stacking a first readout electrode, a first photoelectric conversion film, and a first common electrode on a first substrate; sequentially stacking a second readout electrode, a second photoelectric conversion film, and a second common electrode on a second substrate; and bonding the first substrate to the second substrate so that the first common electrode and the second common electrode face each other.

Furthermore, according to the present disclosure, a method of manufacturing a solid-state image sensor is provided that includes: bonding a third substrate on which a first photoelectric converter and a second photoelectric converter converting light into charges are stacked to a fourth substrate on which a plurality of pixel transistors is formed; and removing the plurality of pixel transistors located in a predetermined region.

Advantageous Effects of Invention

As described above, according to the present disclosure, it is possible to provide a solid-state image sensor, a solid-state imaging device, an electronic apparatus, and a method of manufacturing a solid-state image sensor, which can improve characteristics.

It is noted that the above effects are not necessarily limited, and, along with or instead of the above effects, any of the effects described in the present specification or other effects which can be understood from the present specification may be exhibited.

DESCRIPTION OF EMBODIMENTS

Figure 1:
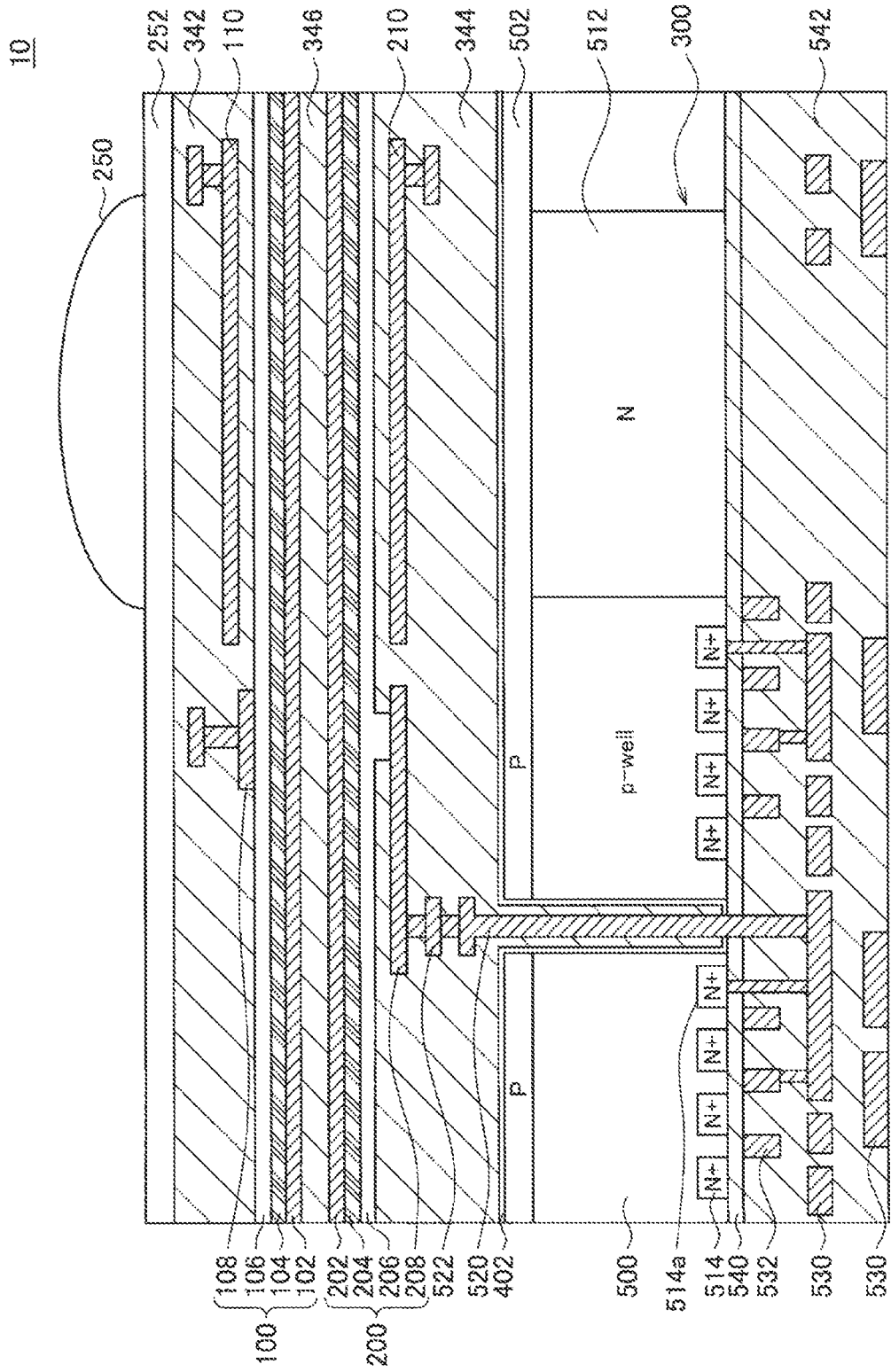
FIG. 1 is a sectional view of a solid-state image sensor 10 according to a first embodiment of the present disclosure.

Hereinafter, preferred embodiments of the present disclosure will be described in detail with reference to the accompanying drawings. Note that in the present specification and drawings, components having substantially the same functional configuration will be denoted by the same reference numerals, and a redundant description thereof will be omitted.

In addition, in this specification and the drawings, a plurality of components having substantially the same or similar functional configuration may be distinguished from each other by the same reference numeral followed by different numerals. However, when it is unnecessary to particularly distinguish each of the plurality of components having substantially the same or similar functional configuration, only the same reference numeral is assigned. Further, similar components in different embodiments may be distinguished by adding different alphabets after the same reference numerals. However, when it is unnecessary to particularly distinguish each of similar components, only the same reference numeral is assigned.

The drawings referred to in the following description are drawings for facilitating the description and understanding of an embodiment of the present disclosure. Therefore, shapes, dimensions and ratios illustrated in the drawings might be different from the actual case. Furthermore, the design of the solid-state image sensor illustrated in the drawing can be appropriately changed in design in consideration of the following description and known techniques.

In the description using a cross-sectional view of the solid-state image sensor, the up-down direction of the stacked structure of the solid-state image sensor corresponds to the relative direction when the light incident surface of the solid-state image sensor is defined as an upper direction. Therefore, the direction in description might be different from an up-down direction according to the actual gravitational acceleration.

Furthermore, in the following description of the circuit configuration, unless otherwise specified, "connection" means electrically connecting a plurality of elements. In addition, the "connection" in the following description does not only encompass a case where the plurality of elements is directly and electrically connected, but also a case where the plurality of elements is indirectly and electrically connected through other elements.

Further, in the following description, a "gate" refers to a gate electrode of a field effect transistor (FET). A "drain" refers to a drain electrode or drain region of the FET, and a "source" refers to a source electrode or source region of the FET.

Note that the description will be given in the following order.

Figure 39:
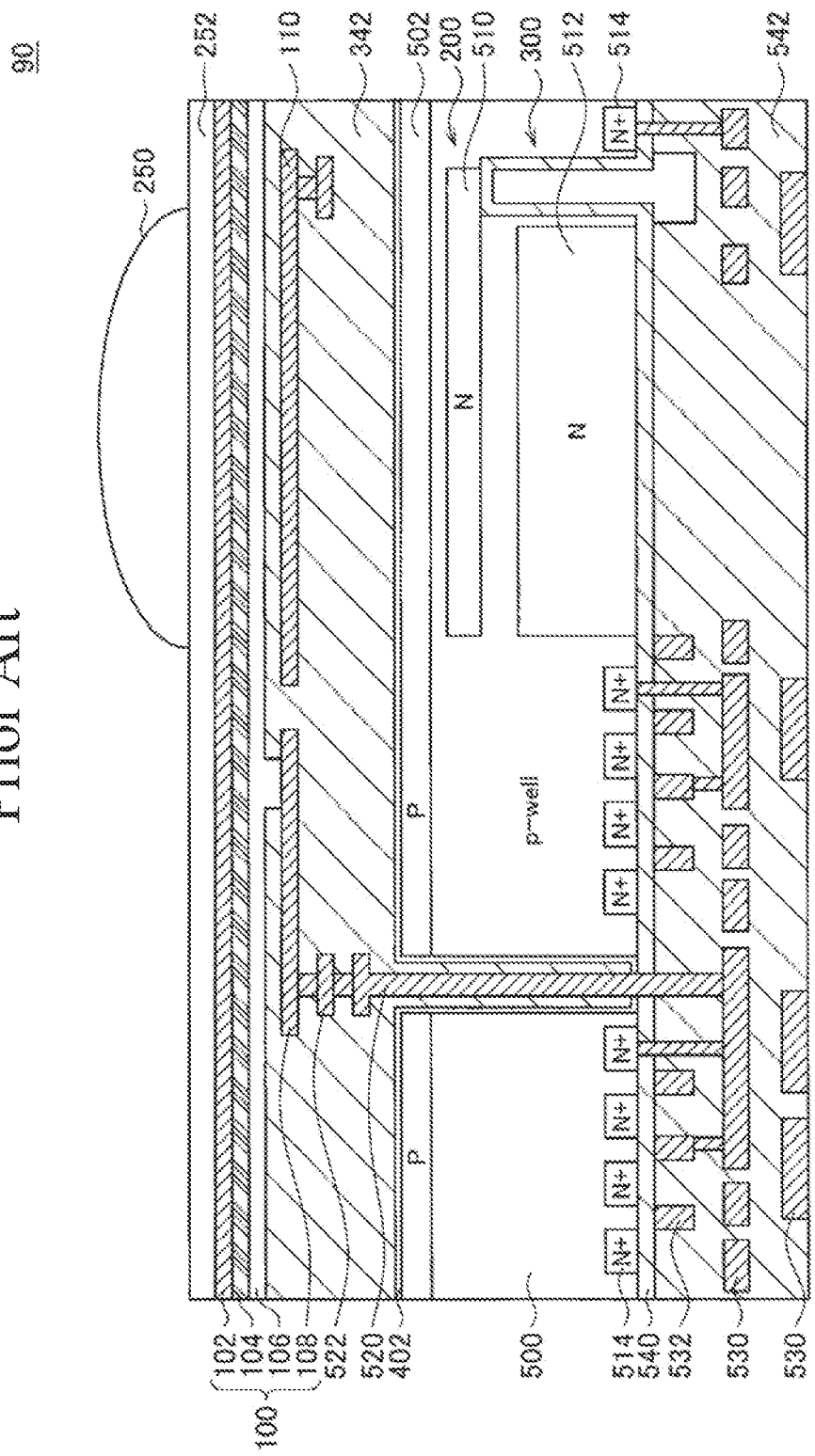
FIG. 39 is a sectional view of a solid-state image sensor 90 according to a comparative example.
Figure 40:
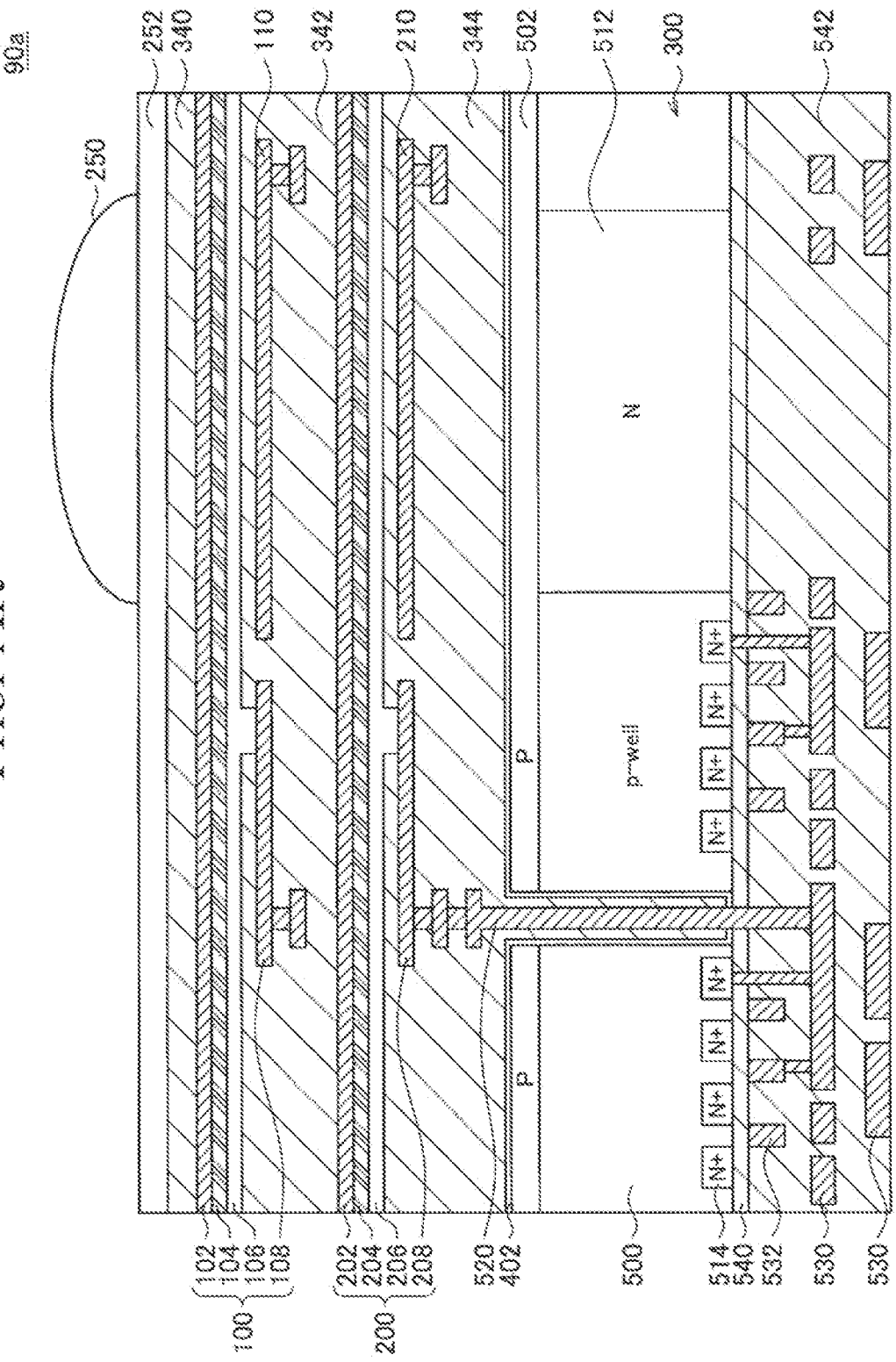
FIG. 40 is a sectional view of a solid-state image sensor 90a according to a comparative example.

1. Background of creation of embodiments of the present disclosure on the side of the inventors
2. First embodiment
   2.1 Stacked structure of solid-state image sensor
   2.2 Schematic configuration of solid-state imaging device 1
   2.3 Equivalent circuit of solid-state image sensor 10
   2.4 Layout configuration of solid-state image sensor 10
3. Second embodiment
4. Third embodiment
5. Fourth embodiment
6. Fifth embodiment
7. Sixth embodiment
8. Seventh embodiment
9. Eighth embodiment
   9.1 Stacked structures of solid-state image sensors 10c and 10d
   9.2 Layout configurations of solid-state image sensors 10c and 10d
10. Ninth embodiment
11. Tenth embodiment
12. Eleventh embodiment
13. Conclusion
14. Application example to mobile body
15. Application example to endoscopic surgery system
16. Supplement 1. Background of Creation of Embodiments of the Present Disclosure on the Side of the Inventors First, before describing the details of individual embodiments according to the present disclosure, a background of embodiments of the present disclosure on the side of the inventors will be described with reference to FIGS. 39 and 40. Note that FIG. 39 is a sectional view of a solid-state image sensor 90 according to a comparative example, and FIG. 40 is a sectional view of a solid-state image sensor 90a according to a comparative example. Here, the comparative example refers to a solid-state image sensor that the inventors have repeatedly studied before making the embodiments of the present disclosure.

As described above, in the solid-state image sensor, there is proposed a stacked structure in which three layers, that is, a photoelectric conversion element for detecting red light, a photoelectric conversion element for detecting green light, and a photoelectric conversion element for detecting blue light in unit pixels are vertically stacked, and one unit pixel can detect light of three colors.

For example, in the solid-state image sensor 90 according to the comparative example, as illustrated in FIG. 39, two photoelectric conversion elements (PDs) 200 and 300 are provided in a semiconductor substrate 500, and a PD 100 having a photoelectric conversion film 104 is stacked on the semiconductor substrate 500. Specifically, the PD 100 includes a photoelectric conversion stacked structure that includes a common electrode 102 provided on a light incident side on which light is incident, a readout electrode 108 provided on a side opposite to the light incident side, and the photoelectric conversion film 104 and a semiconductor layer 106 sandwiched between the common electrode 102 and the readout electrode 108. Moreover, the PD 200 includes a semiconductor region 510 and the PD 300 includes a semiconductor region 512 each having a second conductivity type (for example, N-type) provided in a semiconductor region 502 having a first conductivity type (for example, P-type) of the semiconductor substrate 500 formed of silicon, for example. Further, the PD 100 further includes a storage electrode 110 that is in contact with the photoelectric conversion film 104 through an insulating film 342 and the semiconductor layer 106 so as to face the surface of the photoelectric conversion film 104 that is located on the side opposite to the common electrode 102. Since the solid-state image sensor 90 according to the comparative example has the PDs 100, 200, and 300 stacked, the utilization efficiency of light incident on the solid-state image sensor 90 is increased, and signal/noise ratio (S/N) characteristics are improved. However, in principle, it is difficult to avoid color mixing in the PDs 200 and 300 stacked in the semiconductor substrate 500.

Therefore, other stacked structures have been proposed in order to avoid color mixing. For example, in the solid-state image sensor 90a according to the comparative example, as illustrated in FIG. 40, one PD 300 is provided in the semiconductor substrate 500. Further, in the solid-state image sensor 90a according to the comparative example, PDs 100 and 200 having the same configuration as the PD 100 of the solid-state image sensor 90 according to the comparative example illustrated in FIG. 39 are stacked on the semiconductor substrate 500. In the solid-state image sensor 90a according to the comparative example, the photoelectric conversion films 104 and 204 of the PDs 100 and 200 are formed by a material that absorbs only light of a specific wavelength and performs photoelectric conversion, whereby it is expected to avoid the color mixing between the PDs 100 and 200.

However, when a plurality of PDs 100, 200, and 300 is stacked as described above, it is difficult to avoid an increase in the distance between the PD 100 located above and the PD 300 located below in the stacking direction. In such a stacked structure, due to the fact that the distance is long, it is difficult to suitably focus light on each of the stacked PDs 100, 200, and 300, and this becomes one of the factors that hinders the improvement of the characteristics of the solid-state image sensor. Therefore, in order to improve the characteristics of the solid-state image sensor, the inventors of the present invention have intensively studied a suitable stacked structure of the solid-state image sensor in which the distance between the stacked PDs 100 and 300 in the stacking direction can be further shortened, and a process capable of realizing the stacked structure.

Further, as described above, in the conventional proposals, in the stacked structure in which a plurality of PDs 100, 200, and 300 as described above is stacked, specific studies have not been performed on a suitable arrangement of pixel transistors for outputting charge from the PD 100 located on the light incident side as a pixel signal and a suitable arrangement of wiring lines. Therefore, in order to further improve the characteristics of the solid-state image sensor, the inventors of the present invention have intensively progressed the study on a suitable stacked structure of the solid-state image sensor and a process capable of realizing the structure, from the viewpoint of arrangement of pixel transistors and the like.

Then, the inventors of the present invention have achieved to create embodiments of the present disclosure, according to the solid-state image sensor, the solid-state imaging device, the electronic apparatus, and the method of manufacturing the solid-state image sensor in which characteristics can be improved, through their own studies. Details of the embodiments according to the present disclosure will be sequentially described below.

2. First Embodiment

<2.1 Stacked Structure of Solid-State Image Sensor 10>

First, a stacked structure of the solid-state image sensor 10 according to the first embodiment of the present disclosure will be described with reference to FIG. 1. FIG. 1 is a sectional view of the solid-state image sensor 10 according to the present embodiment. Specifically, in FIG. 1, the solid-state image sensor 10 is illustrated so that a light incident surface of the solid-state image sensor 10 on which light is incident faces upward. In the following description, the stacked structure of the solid-state image sensor 10 will be described in ascending order from the semiconductor substrate 500 located below the solid-state image sensor 10 to the photoelectric conversion element (PD) 200 (first photoelectric converter) located above the semiconductor substrate 500 and the PD 100 (second photoelectric converter).

Specifically, as illustrated in FIG. 1, in the solid-state image sensor 10, a semiconductor region 512 having a second conductivity type (for example, N-type) is provided in a semiconductor region having a first conductivity type (for example, P-type) of the semiconductor substrate 500 formed of silicon, for example. The photoelectric conversion element (PD) 300 (fourth photoelectric converter) is formed in the semiconductor substrate 500 by the PN junction of the semiconductor region 512. Note that, in the present embodiment, the PD 300 is, for example, a photoelectric conversion element that absorbs red light (for example, light having a wavelength of 600 nm to 700 nm) and generates charges.

Further, in the semiconductor substrate 500, on the side opposite to the semiconductor region 512 (in other words, the opposite side of the light receiving surface) (the lower side of FIG. 1), a wiring line layer including a wiring line 530 formed of tungsten (W), aluminum (Al), copper (Cu), cobalt (Co), ruthenium (Ru), or the like is provided. In the wiring line layer, a plurality of electrodes 532 formed of W, Al, Cu, or the like is provided as gate electrodes of a plurality of pixel transistors that read out the charges generated in the PD 300. Specifically, the electrodes 532 are provided so as to face the semiconductor region having the first conductivity type (for example, P-type) in the semiconductor substrate 500 through an insulating film 540. Further, in the semiconductor substrate 500, semiconductor regions 514 having a second conductivity type (for example, N-type) are provided so as to sandwich the semiconductor region having the first conductivity type, and the semiconductor regions 514 function as source/drain regions of the pixel transistors.

Further, as illustrated in FIG. 1, the semiconductor substrate 500 is provided with a through electrode 520 for extracting the charges generated in the photoelectric conversion films 104 and 204 described later to the wiring line 530 so as to penetrate the semiconductor substrate 500. Note that FIG. 1 illustrates the through electrode 520 for extracting the charge generated in the photoelectric conversion film 204. On the other hand, a through electrode (not illustrated) for extracting the charge generated in the photoelectric conversion film 104 can be provided, for example, around a pixel array unit 2 (see FIG. 2) in which a plurality of solid-state image sensors 10 is arranged, in a similar manner to the through electrode 520.

Further, an insulating film 344 formed of a silicon oxide film ($SiO_x$) or the like is provided on the outer periphery of the through electrode 520 in order to prevent a short circuit between the through electrode 520 and the semiconductor substrate 500. The interface state of the insulating film 344 is preferably low in order to reduce an interface state with the semiconductor substrate 500 and to suppress generation of a dark current from an interface between the semiconductor substrate 500 and the insulating film 344.

The through electrode 520 may be connected to a floating diffusion portion 514a provided in the semiconductor region having the second conductivity type (for example, N-type) provided in the semiconductor substrate 500 or the electrode 532 by the wiring line 530 provided in the above-described wiring line layer. The floating diffusion portion 514a is a region that temporarily accumulates charges generated by the photoelectric conversion films 104 and 204. The semiconductor substrate 500 may be provided with an isolation insulating film (not illustrated) so as to be adjacent to the floating diffusion portion 514a or the source/drain region 514 of each of the pixel transistors.

In addition, a semiconductor region 502 having the first conductivity type (for example, P-type) may be provided on the light incident side surface of the semiconductor substrate 500, and further an anti-reflection film 402 formed of an aluminum oxide ($Al_xO_y$) film may be provided on the semiconductor region 502. The anti-reflection film 402 may be, for example, a film having fixed charges having the same polarity as the charges generated in the photoelectric conversion film 204.

Then, as illustrated in FIG. 1, the insulating film 344, which is formed of, for example, a $SiO_x$ film or the like and is capable of transmitting light, is provided on the semiconductor substrate 500. Since the insulating film 344 can transmit light, the PD 300 provided below the insulating film 344 can receive light and perform photoelectric conversion, that is, can detect light.

Further, a wiring line 522 which is electrically connected to the through electrode 520 and functions as a light shielding film is provided in the insulating film 344. For example, W and a stacked film of a titanium (Ti) film and a titanium nitride (TiN) film serving as a barrier metal can be used for the wiring line 522. However, in the present embodiment, the material for forming the wiring line 522 is not particularly limited.

Then, above the insulating film 344, the photoelectric conversion film (first photoelectric conversion film) 204 is provided so as to be sandwiched between a common electrode (first common electrode) 202 shared between adjacent solid-state image sensors 10 and a readout electrode (first readout electrode) 208 for reading out the charge generated in the photoelectric conversion film 204. The photoelectric conversion film 204, the common electrode 202, and the readout electrode 208 are configured to form a part of the photoelectric conversion stacked structure of the PD 200 (first photoelectric converter). In the present embodiment, the PD 200 is, for example, a photoelectric conversion element that absorbs blue light (for example, light having a wavelength of 400 nm to 500 nm) and generates charges (photoelectric conversion). Note that the common electrode 202 and the readout electrode 208 are preferably formed of a transparent conductive film. Further, the material for forming the photoelectric conversion film 204 will be described below.

Further, as illustrated in FIG. 1, the PD 200 has a storage electrode 210 facing the common electrode 202 through the photoelectric conversion film 204 in order to temporarily accumulate the charge generated in the photoelectric conversion film 204 in the photoelectric conversion film 204. Specifically, the storage electrode 210 is in contact with the photoelectric conversion film 204 through the insulating film 344 or through the insulating film 344 and a semiconductor layer 206. In other words, the storage electrode 210 is provided so as to face a surface (first surface) of the photoelectric conversion film 204 located on the side opposite to the common electrode 202. Further, the semiconductor layer 206 is provided so as to be sandwiched between the photoelectric conversion film 204 and the readout electrode 208. Note that, in the present embodiment, the semiconductor layer 206 is provided in order to more efficiently accumulate charges, and is preferably formed of an oxide semiconductor material capable of transmitting light.

Further, the common electrode 202, the readout electrode 208, and the storage electrode 210 are electrically connected to a wiring line or the like (not illustrated). These wiring lines or the like are used, whereby desired potentials are applied to the common electrode 202, the readout electrode 208, and the storage electrode 210. Specifically, the readout electrode 208 is in contact with the photoelectric conversion film 204 through the semiconductor layer 206. In addition, the readout electrode 208 is connected to the above-mentioned floating diffusion portion 514a provided on the semiconductor substrate 500 through the through electrode 520. Therefore, in the present embodiment, controlling the potentials applied to the readout electrode 208 and the storage electrode 210 makes it possible to store the charges generated in the photoelectric conversion film 204 in the photoelectric conversion film 204 or the interface of the photoelectric conversion film 204 or possible to extract the charges to the floating diffusion portion 514a. In other words, the storage electrode 210 can function as a charge storage electrode for attracting the charge generated in the photoelectric conversion film 204 in accordance with the applied potential and storing the charge in the photoelectric conversion film 204. In the present embodiment, in order to effectively use the light incident on the solid-state image sensor 10, it is preferable to form the storage electrode 210 such that when the solid-state image sensor 10 is viewed from above the light incident surface, an area of the storage electrode 210 is larger than that of the readout electrode 208.

Further, the storage electrode 210 is preferably formed of a transparent conductive film, similarly to the common electrode 202 and the readout electrode 208 as described above. Accordingly, in the present embodiment, the common electrode 202, the readout electrode 208, and the storage electrode 210 are formed of a transparent conductive film, the light incident on the solid-state image sensor 10 can be detected even by the PD 300.

Further, the insulating film 344 is provided between the readout electrode 208 and the storage electrode 210 and between the semiconductor layer 206 and the storage electrode 210 in order to electrically insulate them.

Furthermore, the PD 100 (second photoelectric converter) is provided above the common electrode 202 through an insulating film 346. For example, the PD 100 is a photoelectric conversion element that absorbs green light (for example, a wavelength of 500 nm to 600 nm) and generates charges (photoelectric conversion).

Specifically, as the PD 100, the common electrode (second common electrode) 102, the photoelectric conversion film (second photoelectric conversion film) 104, the semiconductor layer 106, the insulating film 342, the readout electrode (second readout electrode) 108 and the storage electrode 110 are sequentially stacked on the insulating film 346.

As illustrated in FIG. 1, the PD 100 and the PD 200 have the common electrode 102 and the common electrode 202, the photoelectric conversion film 104 and the photoelectric conversion film 204, the semiconductor layer 106 and the semiconductor layer 206, and the readout electrode 108 and the readout electrode 208, respectively, in the stacked structure of the solid-state image sensor 10. However, in the photoelectric conversion stacked structure of each of the PD 100 and the PD 200, the order of the above-mentioned layers to be stacked is different. Specifically, in the photoelectric conversion stacked structure of the PD 100, the common electrode 102, the photoelectric conversion film 104, the semiconductor layer 106, and the readout electrode 108 are sequentially stacked from the bottom. On the other hand, in the photoelectric conversion stacked structure of the PD 200, the readout electrode 208, the semiconductor layer 206, the photoelectric conversion film 204, and the common electrode 202 are sequentially stacked from the bottom. That is, in the present embodiment, the PD 100 has a photoelectric conversion stacked structure in which the common electrode 102, the photoelectric conversion film 104, the semiconductor layer 106, and the readout electrode 108 are stacked and the PD 200 has a photoelectric conversion stacked structure in which the common electrode 202, the photoelectric conversion film 204, the semiconductor layer 206, and the readout electrode 208 are stacked, so that the PD 100 and the PD 200 are in a line-symmetrical relationship with each other with a vertical plane (for example, the plane of the insulating film 346) perpendicular to a stacking direction of the stacked structure of the solid-state image sensor 10 as an axis of symmetry. In other words, the photoelectric conversion stacked structure of the PD 200 has a structure in which the photoelectric conversion stacked structure of the PD 100 is inverted around the vertical plane as an axis.

Note that, in the present embodiment, in the stacked structure of the solid-state image sensor 10, the PD 100 and the PD 200 may have a photoelectric conversion stacked structure in which each layer is stacked, so that the PD 100 and the PD 200 are in a line-symmetrical relationship with each other with a vertical plane perpendicular to the stacking direction of the stacked structure of the solid-state image sensor 10 as the axis of symmetry. That is, in the present embodiment, the PD 100 and the PD 200 do not need to be stacked in the order described above. Further, in the present embodiment, when the solid-state image sensor 10 is viewed from above the light incident surface, the readout electrodes 108 and 208 of the PD 100 and PD 200 and the storage electrodes 110 and 210 need not overlap with each other, and need not be provided so as to have the symmetrical relationship. That is, in the present embodiment, when the solid-state image sensor 10 is viewed from above the light incident surface, the layout of each layer included in the PDs 100 and 200 is not particularly limited. Furthermore, in the present embodiment, the wiring line and the like may be shared between the PD 100 and the PD 200.

Then, as illustrated in FIG. 1, the insulating film 342 formed of a material such as a $SiO_x$ film that is capable of transmitting light is provided above the PD 100. In addition, a high refractive index layer 252 formed of an inorganic film such as $Si_xN_y$, $Si_xO_yN_z$, or $Si_xC_y$ is provided on the insulating film 342. Further, an on-chip lens 250 is provided for each solid-state image sensor 10 on the high refractive index layer 252. The on-chip lens 250 can be formed of, for example, a silicon nitride film or a resin material such as a styrene resin, an acrylic resin, a styrene-acrylic copolymer resin, or a siloxane resin.

The above-described photoelectric conversion films 104 and 204 can be formed of an organic material (organic photoelectric conversion film) or an inorganic material (inorganic photoelectric conversion film). For example, in formation of the photoelectric conversion film from an organic material, it is possible to select one from four modes: (a) P-type organic semiconductor material, (b) N-type organic semiconductor material, (c) a stacked structure using at least two out of P-type organic semiconductor material layer, N-type organic semiconductor material layer, or a mixed layer (bulk heterostructure) of a P-type organic semiconductor material and an N-type organic semiconductor material, and (d) a mixed layer of a P-type organic semiconductor material and an N-type organic semiconductor material. Note that the photoelectric conversion film using an organic material includes, for example, an electron blocking and buffer film in contact with a readout electrode, a photoelectric conversion film, a hole blocking film, a hole blocking and buffer film, and a stacked structure such as a work function adjustment film.

Specific examples of the P-type organic semiconductor material include a naphthalene derivative, an anthracene derivative, a phenanthrene derivative, a pyrene derivative, a perylene derivative, a tetracene derivative, a pentacene derivative, a quinacridone derivative, a coumarin derivative, a pyrromethene derivative, a pyran derivative, a phenoxazone derivative, a thiophene derivative, a thienothiophene derivative, a benzothiophene derivative, a benzothienobenzothiophene (BTBT) derivative, a dinaphthothienothiophene (DNTT) derivative, a dianthracenothienothiophene (DATT) derivative, a benzobisbenzothiophene (BBBT) derivative, a naphthalene bis-benzothiophene (NBBT), a thienobisbenzothiophene (TBBT) derivative, a dibenzothienobisbenzothiophene (DBTBT) derivative, a dithienobenzodithiophene (DTBDT) derivative, a dibenzothienodithiophene (DBTDT) derivative, a benzodithiophene (BDT) derivative, a naphthodithiophene (NDT) derivative, an anthracenodithiophene (ADT) derivative, a tetracenodithiophene (TDT) derivative, a pentacenodithiophene (PDT) derivative, a triallylamine derivative, a carbazole derivative, a picene derivative, a chrysene derivative, a fluoranthene derivative, a phthalocyanine derivative, a subphthalocyanine derivative, a subporphyrazine derivative, a metal complex having a heterocyclic compound as a ligand, a polythiophene derivative, a polybenzothiadiazole derivative, and a polyfluorene derivative.

In addition, examples of the N-type organic semiconductor material include fullerenes and fullerene derivatives (e.g., fullerenes (higher fullerenes) such as C60, C70, and C74 or the like, endohedral fullerenes, or the like) or fullerene derivatives (e.g., fullerene fluoride or Phenyl-$C_{61}$-Butyric Acid Methyl Ester (PCBM), fullerene compounds, fullerene multimers, etc.)), organic semiconductors with deeper Highest Occupied Molecular Orbital (HOMO) and Lowest Unoccupied Molecular Orbital (LUMO) than those of P-type organic semiconductors, and inorganic metal oxides capable of transmitting light. More specific examples of the N-type organic semiconductor material include a heterocyclic compound containing a nitrogen atom, an oxygen atom, or a sulfur atom, for example, organic molecules and organometallic complexes having pyridine derivatives, pyrromethene derivatives, pyrazine derivatives, pyrimidine derivatives, triazine derivatives, quinoline derivatives, quinoxaline derivatives, isoquinoline derivatives, coumarin derivatives, pyran derivatives, phenoxazone derivatives, perylene derivatives, acridine derivatives, phenazine derivatives, phenanthroline derivatives, tetrazole derivatives, pyrazole derivatives, imidazole derivatives, thiazole derivatives, oxazole derivatives, imidazole derivatives, benzimidazole derivatives, benzotriazole derivatives, benzoxazole derivatives, benzoxazole derivatives, carbazole derivatives, benzofuran derivatives, dibenzofuran derivatives, subporphyrazine derivatives, polyphenylene vinylene derivatives, polybenzothiadiazole derivatives, polyfluorene derivatives, and the like, as a part of the molecular skeleton, and subphthalocyanine derivatives. In addition, examples of a group or the like included in the fullerene derivatives include a branched or cyclic alkyl group or a phenyl group; a group having a linear or condensed aromatic compound; a group having a halide; a partial fluoroalkyl group; a perfluoroalkyl group; silylalkyl group; a silylalkoxy group; an arylsilyl group; an arylsulfanyl group; an alkylsulfanyl group; an arylsulfonyl group; an alkylsulfonyl group; an arylsulfide group; an alkylsulfide group; an amino group; an alkylamino group; an arylamino group; a hydroxy group; an alkoxy group; an acylamino group; an acyloxy group; a carbonyl group; a carboxy group; a carboxamide group; a carboalkoxy group; an acyl group; a sulfonyl group; a cyano group; a nitro group; a group having a chalcogenide; a phosphine group; a phosphone group; and derivatives thereof. Note that the thickness of the photoelectric conversion film formed of an organic material is not limited, and may be, for example, $1 \times 10^{-8}$ m to $5 \times 10^{-7}$ m, preferably $2.5 \times 10^{-8}$ m to $3 \times 10^{-7}$ m, more preferably $2.5 \times 10^{-8}$ m to $2 \times 10^{-7}$ m. In the above description, organic semiconductor materials are classified into P-type and N-type, in which P-type means that holes are easily transported, and N-type means that electrons are easily transported. That is, in the organic semiconductor materials, the types are not be limited to the interpretation of having holes or electrons as majority carriers for thermal excitation, unlike the case of inorganic semiconductor materials.

Furthermore, when the photoelectric conversion films 104 and 204 are formed from an inorganic material, examples of the inorganic semiconductor material include crystalline silicon, amorphous silicon, microcrystalline silicon, crystalline selenium, amorphous selenium, chalcopyrite compounds such as CIGS(CuInGaSe), CIS($CuInSe_2$), $CuInS_2$, $CuAlS_2$, $CuAlSe_2$, $CuGaS_2$, $CuGaSe_2$, $AgAlS_2$, $AgAlSe_2$, and $AgInS_2$, $AgInSe_2$; or III-V group compounds such as GaAs, InP, AlGaAs, InGaP, AlGaInP, and InGaAsP; and compound semiconductors such as CdSe, CdS, $In_2Se_3$, $In_2S_3$, $Bi_2Se_3$, $Bi_2S_3$, ZnSe, ZnS, PbSe, and PbS. Additionally, in the present embodiment, quantum dots formed of these materials can be used as the photoelectric conversion films 104 and 204.

Further, the photoelectric conversion films 104 and 204 may be formed of a polymer such as phenylene vinylene, fluorene, carbazole, indole, pyrene, pyrrole, picoline, thiophene, acetylene or diacetylene, or a derivative thereof.

Further, preferably usable examples of the material for forming the photoelectric conversion films 104 and 204 for detecting blue light and green light include a chain compound in which condensed polycyclic aromatic and aromatic or heterocyclic compounds such as a metal complex pigment, a rhodamine-based pigment, a quinacridone-based pigment, a cyanine-based pigment, a melacyanine-based pigment, a phenylxanthene-based pigment, a triphenylmethane-based pigment, a rhodacyanine-based pigment, a xanthene-based pigment, a macrocyclic azaannulene-based pigment, an azulene-based pigment, naphthoquinone, an anthraquinone-based pigment, anthracene, pyrene, and so forth are condensed; or two nitrogen-containing heterocycles such as quinoline, benzothiazole, benzoxazole or the like having a squarylium group and a croconic methine group as binding chains; or a cyanine-like pigment bonded by a squarylium group and a croconic methine group; or the like. Further, as the metal complex pigment, a dithiol metal complex-based pigment, a metallophthalocyanine pigment, a metalloporphyrin pigment or a ruthenium complex pigment is preferable, and a ruthenium complex pigment is particularly preferable, but it is not limited to the above examples.

Further, when causing the photoelectric conversion films 104 and 204 to function as a photoelectric conversion film that detects red light, the photoelectric conversion film may include phthalocyanine-based pigment, subphthalocyanine-based pigment (subphthalocyanine derivative), or the like.

Note that, in the present embodiment, the photoelectric conversion films 104 and 204 can be formed by mixing several kinds of materials or can be stacked in order to improve characteristics. Further, in the present embodiment, the photoelectric conversion films 104 and 204 can be formed by stacking or mixing materials that do not directly contribute to photoelectric conversion, in order to improve the characteristics.

Note that, as the insulating films 342, 344, and 346 described above, for example, a silicon oxide film ($SiO_x$) capable of transmitting light, an aluminum oxide film ($Al_xO_y$), a tetra ethyl ortho silicate (TEOS) film, a silicon nitride film ($Si_xN_y$), a silicon oxynitride film ($Si_xO_yN_z$), a silicon carbide ($Si_xC_y$) film, a carbon-containing silicon oxide film ($Si_xC_yO_z$) or the like can be used, and there is no particular limitation on the examples. Examples of the method for forming these films include a chemical vapor deposition (CVD) method, a physical vapor deposition (PVD) method, and an atomic layer deposition (ALD) method. However, in the present embodiment, the material and method for forming the insulating films 342, 344, and 346 are not particularly limited.

Further, the common electrodes 102 and 202, the readout electrodes 108 and 208, and the storage electrodes 110 and 210 can be formed of, for example, a transparent conductive film capable of transmitting light such as tin-indium oxide (including ITO, crystalline ITO, and amorphous ITO). However, in the present embodiment, the material for forming the common electrodes 102 and 202, the readout electrodes 108 and 208, and the storage electrodes 110 and 210 is not limited to ITO as described above, and other materials may be used. For example, the transparent conductive film is preferably formed of a material having a band gap of 2.5 eV or more, preferably 3.1 eV or more. Examples of tin oxide-based materials as the transparent conductive film include tin oxide, antimony-tin oxide (Sb as a dopant is added to $SnO_2$, e.g., ATO), and fluorine-tin oxide (F as a dopant is added to $SnO_2$, e.g., FTO). Examples of zinc oxide-based materials include aluminum-zinc oxide (in which Al is added to ZnO as a dopant, e.g., AZO), gallium-zinc oxide (in which Ga is added to ZnO as a dopant, e.g., GZO), indium-zinc oxide (in which In is added to ZnO as a dopant, e.g., IZO), indium-gallium-zinc oxide (in which In and Ga are added to $ZnO_4$ as a dopant, e.g., IGZO), indium-tin-zinc oxide (in which In and Sn are added to ZnO as a dopant, e.g., ITZO). Other examples include indium-gallium oxide (In as a dopant is added to $Ga_2O_3$, e.g., IGO), $CuInO_2$, $MgIn_2O_4$, CuI, $InSbO_4$, ZnMgO, CdO, $ZnSnO_3$, and graphene.

Further, in the present embodiment, the semiconductor layers 106 and 206 are preferably formed using a material having a higher charge mobility than a charge mobility of the photoelectric conversion films 104 and 204 and having a large band gap. For example, the band gap of the constituent material in the semiconductor layers 106 and 206 is preferably 3.0 eV or more. Examples of the material include oxide semiconductor materials such as IGZO and organic semiconductor materials. Examples of the organic semiconductor materials include transition metal dichalcogenide, silicon carbide, diamond, graphene, carbon nanotube, condensed polycyclic hydrocarbon compounds, and condensed heterocyclic compounds. The semiconductor layers 106 and 206 may be formed of a single film or may be formed by stacking a plurality of films.

As described above, the solid-state image sensor 10 according to an embodiment of the present disclosure has a stacked structure in which the PD 100, the PD 200, and the PD 300 each detecting three colors of light are stacked. That is, the solid-state image sensor 10 described above can be defined, for example, as a vertical spectral type solid-state image sensor that performs photoelectric conversion on the green light by the photoelectric conversion film 104 (PD 100) formed above the semiconductor substrate 500, performs photoelectric conversion on the blue light by the photoelectric conversion film 204 (PD 200) provided below the PD 100, and performs photoelectric conversion on the red light by the PD 300 provided in the semiconductor substrate 500.

Note that, in the present embodiment, the solid-state image sensor 10 described above is not limited to the stacked structure of the vertical spectral type as described above. For example, the blue light may be photoelectrically converted by the photoelectric conversion film 104 formed above the semiconductor substrate 500, and the green light may be photoelectrically converted by the photoelectric conversion film 204 provided below the PD 100.

As described above, in the present embodiment, in the stacked structure of the solid-state image sensor 10, the PD 100 and the PD 200 have a photoelectric conversion stacked structure in which each layer is stacked, so that the PD 100 and the PD 200 are in a line-symmetrical relationship with each other with a vertical plane perpendicular to the stacking direction of the stacked structure of the solid-state image sensor 10 as the axis of symmetry. According to the present embodiment, the PD 100 and the PD 200 have such a photoelectric conversion stacked structure, whereby a distance between the PD 100 located above and the PD 300 located below can be further shortened. As a result, according to the present embodiment, it becomes easy to suitably focus light on all the stacked PDs 100, 200, and 300, and it is possible to improve the shading characteristics, sensitivity characteristics, and reliability of the solid-state image sensor 10.

<2.2 Schematic Configuration of Solid-State Imaging Device 1>

Figure 2:
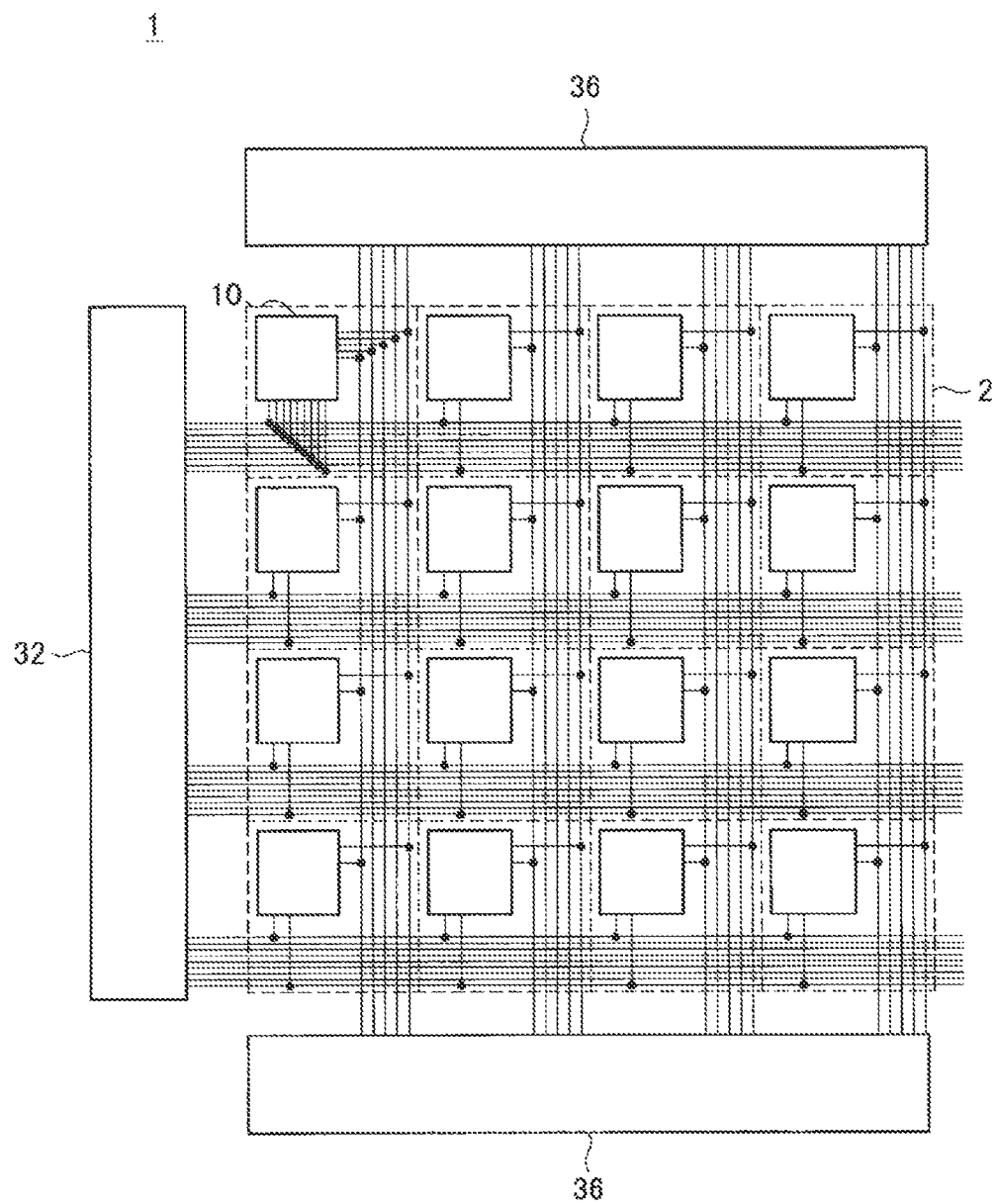
FIG. 2 is a schematic plan view of a solid-state imaging device 1 according to the first embodiment of the present disclosure.

Next, a schematic configuration of the solid-state imaging device 1 including the plurality of solid-state image sensors 10 described above will be described with reference to FIG. 2. FIG. 2 is a schematic plan view of the solid-state imaging device 1 according to the present embodiment As illustrated in FIG. 2, the solid-state imaging device 1 according to the present embodiment includes, on a semiconductor substrate 500 formed of silicon (not illustrated), for example, a pixel array unit 2 having a plurality of solid-state image sensors 10 arranged in a matrix, and a peripheral circuit unit provided so as to surround the pixel array unit 2. Further, the peripheral circuit unit includes a vertical drive circuit unit 32, column signal processing circuit units 36, and the like. Note that, in FIG. 2, as for the solid-state image sensors 10 other than the solid-state image sensor 10 on the upper left, the connection to the wiring line is not illustrated for clarity. The details of each block of the solid-state imaging device 1 according to the present embodiment will be described below.

(Pixel Array Unit 2)

The pixel array unit 2 includes a plurality of solid-state image sensors 10 which are two-dimensionally arranged in a matrix on a semiconductor substrate 500 (not illustrated). Each of the solid-state image sensors 10 includes the PDs 100, 200, 300, and a plurality of pixel transistors (e.g., metal-oxide-semiconductor (MOS) transistors) (not illustrated). More specifically, the pixel transistor includes, for example, a transfer transistor, a selection transistor, a reset transistor, and an amplification transistor. The details of the equivalent circuit (connection configuration) in each of the solid-state image sensors 10 will be described later.

(Vertical Drive Circuit Unit 32)

The vertical drive circuit unit 32 is configured by a shift register, for example, selects a pixel drive wiring line, supplies a pulse for driving the solid-state image sensor 10 to the selected pixel drive wiring line, and drives the solid-state image sensors 10 in units of rows. That is, the vertical drive circuit unit 32 selectively scans each of the solid-state image sensors 10 of the pixel array unit 2 in the vertical direction (up-down direction in FIG. 2) sequentially in units of rows, and supplies a pixel signal based on the charge generated in accordance with the amount of light received by the PDs 100, 200, and 300 of each of the solid-state image sensors 10 to the column signal processing circuit unit 36, which will be described below, through a vertical signal line.

(Column Signal Processing Circuit Unit 36)

The column signal processing circuit unit 36 is arranged for each of columns of the solid-state image sensors 10, and performs signal processing such as noise removal for each of columns on the pixel signals output from the PDs 100, 200, and 300 of the solid-state image sensors 10 for one row. For example, the column signal processing circuit unit 36 performs signal processing such as correlated double sampling (CDS) and analog-digital (AD) conversion in order to remove fixed pattern noise specific to the solid-state image sensor 10.

Note that the planar configuration example of the solid-state imaging device 1 according to the present embodiment is not limited to the example illustrated in FIG. 2, and may include, for example, other circuit units, and is not particularly limited.

<2.3 Equivalent Circuit of Solid-State Image Sensor 10>

Figure 3:
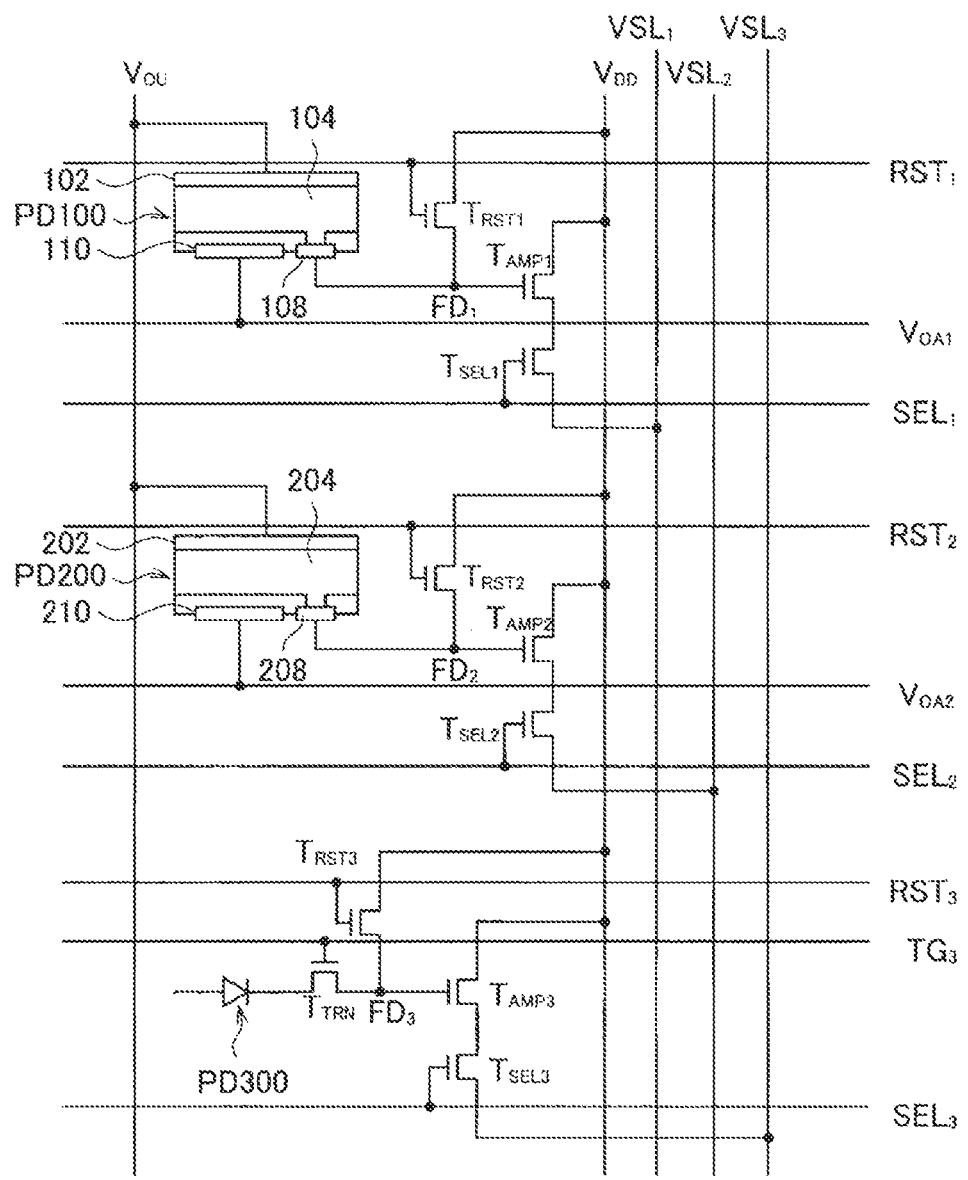
FIG. 3 is an equivalent circuit diagram of the solid-state image sensor 10 according to the first embodiment of the present disclosure.

Next, an equivalent circuit of the solid-state image sensor 10 according to the present embodiment will be described with reference to FIG. 3. FIG. 3 is an equivalent circuit diagram of the solid-state image sensor 10 according to the present embodiment. That is, the inside of the solid-state image sensor 10 illustrated by a rectangle in FIG. 2 is configured by the equivalent circuit illustrated in FIG. 3.

As described above, the PD 100 and the PD 200 have the common electrode 102 and the common electrode 202, the readout electrode 108 and the readout electrode 208, and the photoelectric conversion film 104 sandwiched between the common electrode 102 and the readout electrode 108, and the photoelectric conversion film 204 sandwiched between the common electrode 202 and the readout electrode 208. Further, the PD 100 and the PD 200 have the storage electrode 110 and the storage electrode 210 that are in contact with the photoelectric conversion film 104 and the photoelectric conversion film 204 through the insulating film 342 and the insulating film 344 (not illustrated). In the following description, the equivalent circuit of the PD 100 included in the solid-state image sensor 10 will be described, but the equivalent circuit of the PD 200 is also the same as the equivalent circuit of the PD 100, so detailed description will be omitted here.

As illustrated in FIG. 3, the readout electrode 108 is electrically connected to a source/drain of one side of a reset transistor $T_{RST1}$ for resetting accumulated charges through a wiring line or the like. A gate of the reset transistor $T_{RST1}$ is electrically connected to a reset signal line $RST_1$ and further electrically connected to the vertical drive circuit unit 32 described above. A source/drain of another side of the reset transistor $T_{RST1}$ (the side not connected to the readout electrode 108) is electrically connected to a power supply circuit $V_{DD}$.

Further, the readout electrode 108 is electrically connected to a gate of an amplification transistor $T_{AMP1}$ that converts charges into a voltage and outputs the voltage as a pixel signal, via a wiring line. A node $FD_1$ that connects the readout electrode 108, the gate of the amplification transistor $T_{AMP1}$, and a source/drain of one side of the reset transistor $T_{RST1}$ is configured to include a part of the reset transistor $T_{RST1}$. The charge from the readout electrode 108 changes the potential of the node $FD_1$ and is converted into a voltage by the amplification transistor $T_{AMP1}$. A source/drain of one side of the amplification transistor $T_{AMP1}$ is electrically connected to a source/drain of one side of a selection transistor $T_{SEL1}$ that outputs the pixel signal obtained by the conversion to a signal line $VSL_1$ via a wiring line in accordance with the selection signal. Further, a source/drain of another side of the amplification transistor $T_{AMP1}$ (the side not connected to the selection transistor $T_{SEL1}$) is electrically connected to the power supply circuit $V_{DD}$.

Further, a source/drain of another side of the selection transistor $T_{SEL1}$ (the side not connected to the amplification transistor $T_{AMP1}$) is electrically connected to the signal line $VSL_1$ for transmitting the converted voltage as a pixel signal, and further is electrically connected to the column signal processing circuit unit 36 described above. Further, a gate of the selection transistor $T_{SEL1}$ is electrically connected to a selection line $SEL_1$ that selects a row for outputting a pixel signal, and is further electrically connected to the vertical drive circuit unit 32 described above.

Further, the storage electrode 110 is electrically connected to the vertical drive circuit unit 32 described above via a wiring line $V_{OA1}$. As described above, the storage electrode 110 can attract the charge generated in the photoelectric conversion film 104 in accordance with the applied potential and store the charge in the photoelectric conversion film 104, or can transfer the charge to the readout electrode 108. Further, the common electrode 102 is electrically connected to a selection line $V_{OU}$ that selects a column for outputting a pixel signal.

Note that, although not illustrated in FIG. 3, the PD 100 and the PD 200 may be electrically connected to a transfer transistor, similarly to the PD 300 to be described later.

Next, for reference, an equivalent circuit of the PD 300 will also be described with reference to FIG. 3. As illustrated in FIG. 3, the PD 300 provided in the semiconductor substrate 500 is connected, via wiring lines, to pixel transistors (an amplification transistor $T_{AMP3}$, a transfer transistor $T_{TRN}$, a reset transistor $T_{RST3}$, and a selection transistor $T_{SEL3}$) provided in the semiconductor substrate 500. Specifically, one side of the PD 300 is electrically connected to a source/drain of one side of the transfer transistor $T_{TRN}$ that transfers charges via a wiring line. Further, a source/drain of another side of the transfer transistor $T_{TRN}$ (the side not connected to the PD 300) is electrically connected to a source/drain of one side of the reset transistor $T_{RST3}$ via a wiring line. Also, a gate of the transfer transistor $T_{TRN}$ is electrically connected to a transfer gate line $TG_3$ and further connected to the vertical drive circuit unit 32 described above. A source/drain of another side of the reset transistor $T_{RST3}$ (the side not connected to the transfer transistor $T_{TRN}$) is electrically connected to the power supply circuit $V_{DD}$. Further, a gate of the reset transistor $T_{RST3}$ is electrically connected to a reset line $RST_3$ and further connected to the vertical drive circuit unit 32 described above.

Further, a source/drain of another side of the transfer transistor $T_{TRN}$ (the side not connected to the PD 300) is electrically connected to a gate of the amplification transistor $T_{AMP3}$ that amplifies (converts) the charge and outputs the charge as a pixel signal through a wiring line. A source/drain of one side of the amplification transistor $T_{AMP3}$ is electrically connected to a source/drain of one side of the selection transistor $T_{SEL3}$ that outputs the pixel signal to a signal line $VSL_3$ via a wiring line in accordance with the selection signal. A source/drain of another side of the amplification transistor $T_{AMP3}$ (the side not connected to the selection transistor $T_{SEL3}$) is electrically connected to the power supply circuit $V_{DD}$. A source/drain of another side of the selection transistor $T_{SEL3}$ (the side not connected to the amplification transistor $T_{AMP3}$) is electrically connected to the signal line $VSL_3$, and further electrically connected to the column signal processing circuit unit 36 described above. A gate of the selection transistor $T_{SEL3}$ is electrically connected to a selection line $SEL_3$, and further electrically connected to the vertical drive circuit unit 32 described above.

Note that, although the layout of the solid-state image sensor 10 will be described below, respective layers and the pixel transistors of the PDs 100, 200, and 300 are also electrically connected according to the equivalent circuit diagram of FIG. 3.

<2.4 Layout Configuration of Solid-State Image Sensor 10>

Figure 4:
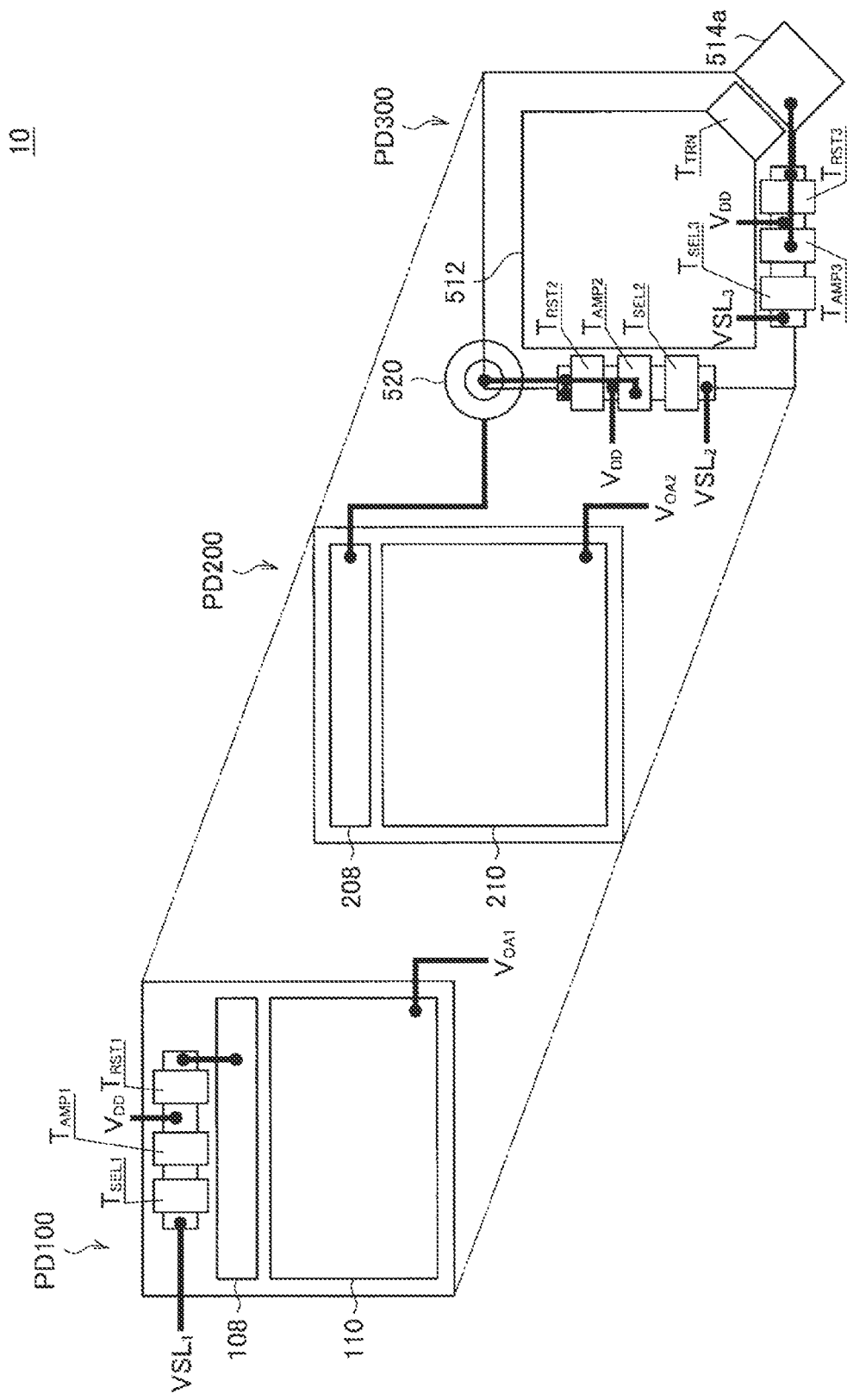
FIG. 4 is a layout diagram of the solid-state image sensor 10 according to the first embodiment of the present disclosure.

Next, the layout configuration of the solid-state image sensor 10 according to the present embodiment will be described with reference to FIG. 4. FIG. 4 is a layout diagram of the solid-state image sensor 10 according to the present embodiment, and specifically, is a diagram when each layer in the stacked structure of the solid-state image sensor 10 is viewed from above the light incident surface. That is, the layout of the PD 100 located at the top of the stacked structure of the solid-state image sensor 10 is illustrated on the left side of FIG. 4, and the layout of the PD 200 located in the middle of the stacked structure is illustrated in the center of FIG. 4, and the layout of the PD 300 located at the bottom of the stacked structure is illustrated on the right side of FIG. 4.

Specifically, in the PD 100, a rectangular storage electrode 110 is provided in the central portion, and a rectangular readout electrode 108 having an area smaller than the storage electrode 110 is provided so as to be adjacent to the storage electrode 110. Further, in the PD 100, pixel transistors (the reset transistor $T_{RST1}$, the amplification transistor $T_{AMP1}$, and the selection transistor $T_{SEL1}$) to be electrically connected to the PD 100 as well as various wiring lines (the power supply circuit $V_{DD}$, the signal line $VSL_1$, and the wiring line $V_{OA1}$) to be electrically connected to these pixel transistors are provided in the peripheral portion so as not to overlap with the readout electrode 108 and the storage electrode 110.

In the PD 200, similarly to the PD 100, a rectangular storage electrode 210 is provided in the central portion, and a rectangular readout electrode 208 having an area smaller than the storage electrode 210 is provided so as to be adjacent to the storage electrode 210. Note that, it is preferable that the pixel transistor or the like electrically connected to the PD 200 is provided in the lowermost layer of the PD 300 described later so that the storage electrode 210 can have a wider area. Therefore, the readout electrode 208 is electrically connected to the pixel transistor provided in the lowermost layer of the PD 300 by the through electrode 520 penetrating the semiconductor substrate 500.

In the PD 300, a rectangular semiconductor region 512 is provided in the central portion. Further, in the PD300, pixel transistors (reset transistors $T_{RST2}$ and $T_{RST3}$, amplification transistors $T_{AMP2}$ and $T_{AMP3}$, and selection transistors $T_{SEL2}$ and $T_{SEL3}$, and the transfer transistor $T_{TRN}$) to be connected to the PD 200 and PD 300, various wiring lines (the power supply circuit $V_{DD}$ and signal lines $VSL_2$ and $VSL_3$) to be electrically connected to these pixel transistors, and the floating diffusion portion 514a are provided in the peripheral portion.

In the present embodiment, the layout of each layer of the solid-state image sensor 10 is not limited to the example illustrated in FIG. 4 and may be another layout.

3. Second Embodiment

Figure 5:
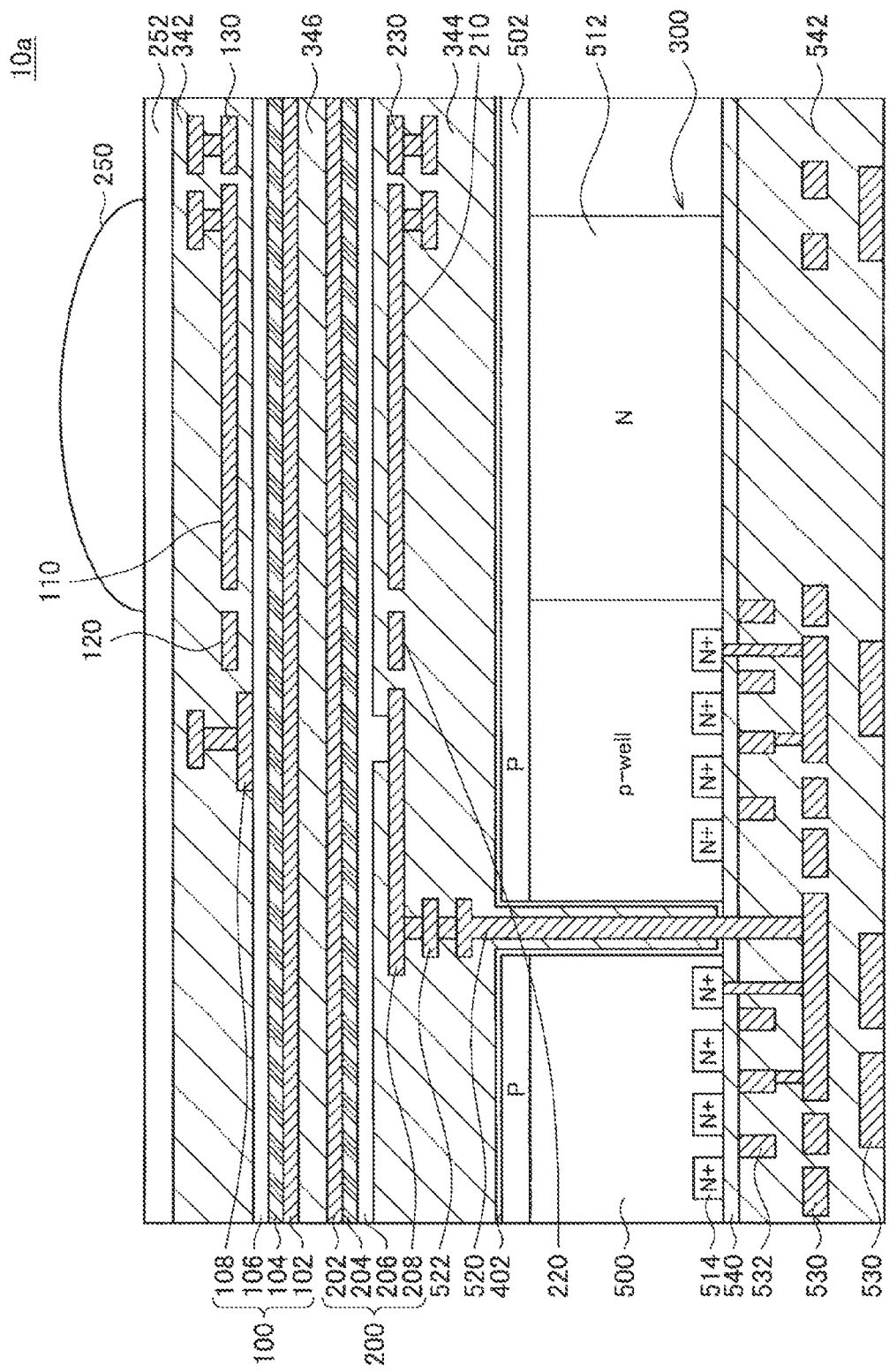
FIG. 5 is a sectional view of a solid-state image sensor 10a according to a second embodiment of the present disclosure.

Next, a stacked structure of the solid-state image sensor 10a according to the second embodiment of the present disclosure, which is a modification of the first embodiment, will be described with reference to FIG. 5. FIG. 5 is a sectional view of the solid-state image sensor 10a according to the present embodiment. Note that in the following description, description of the points common to the first embodiment as described above will be omitted, and points different from the first embodiment will be described.

In the solid-state image sensor 10a according to the present embodiment, as illustrated in FIG. 5, unlike the first embodiment, the PD 100 includes a transfer electrode 120 facing the surface opposite to the common electrode 102 of the photoelectric conversion film 104 through the insulating film 342, and the PD 200 includes the transfer electrode 220 facing the surface opposite to the common electrode 202 of the photoelectric conversion film 204 through the insulating film 344. The transfer electrode 120 is provided between the readout electrode 108 and the storage electrode 110, and transfer electrode 220 is provided between readout electrode 208 and the storage electrode 210, and they control transfer of charges. Specifically, the transfer electrodes 120 and 220 are applied with a predetermined potential during the accumulation period in which the charges are accumulated in the photoelectric conversion films 104 and 204, and are able to block the charges accumulated on the storage electrodes 110 and 210. Further, the transfer electrodes 120 and 220 can be in an open state to transfer the accumulated charges to the readout electrodes 108 and 208 during the transfer period for transferring the charges.

Further, in the present embodiment, as illustrated in FIG. 5, the PD 100 has a shield electrode 130 facing the side opposite to the common electrode 102 of the photoelectric conversion film 104 through the insulating film 342, and the PD 200 has a shield electrode 230 facing the side opposite to the common electrode 202 of the photoelectric conversion film 204 through the insulating film 344. The shield electrodes 130 and 230 are provided outside the storage electrodes 110 and 210 so that it is possible to prevent the stored electrodes from seeping out. Specifically, the shield electrodes 130 and 230 can prevent the blooming in which the charges accumulated by the storage electrodes 110 and 210 seep into the adjacent solid-state image sensor 10 during the accumulation period in which charges are accumulated in the photoelectric conversion films 104 and 204. The shield electrodes 130 and 230 may be electrically connected to a wiring line (not illustrated) that applies a predetermined voltage.

The transfer electrodes 120 and 220 and the shield electrodes 130 and 230 according to the present embodiment can be formed of the same material as those of the readout electrodes 108 and 208 and the storage electrodes 110 and 210. Further, the transfer electrodes 120 and 220 and the shield electrodes 130 and 230 described above can be formed simultaneously with the readout electrodes 108 and 208 and the storage electrodes 110 and 210.

4. Third Embodiment

Figure 6:
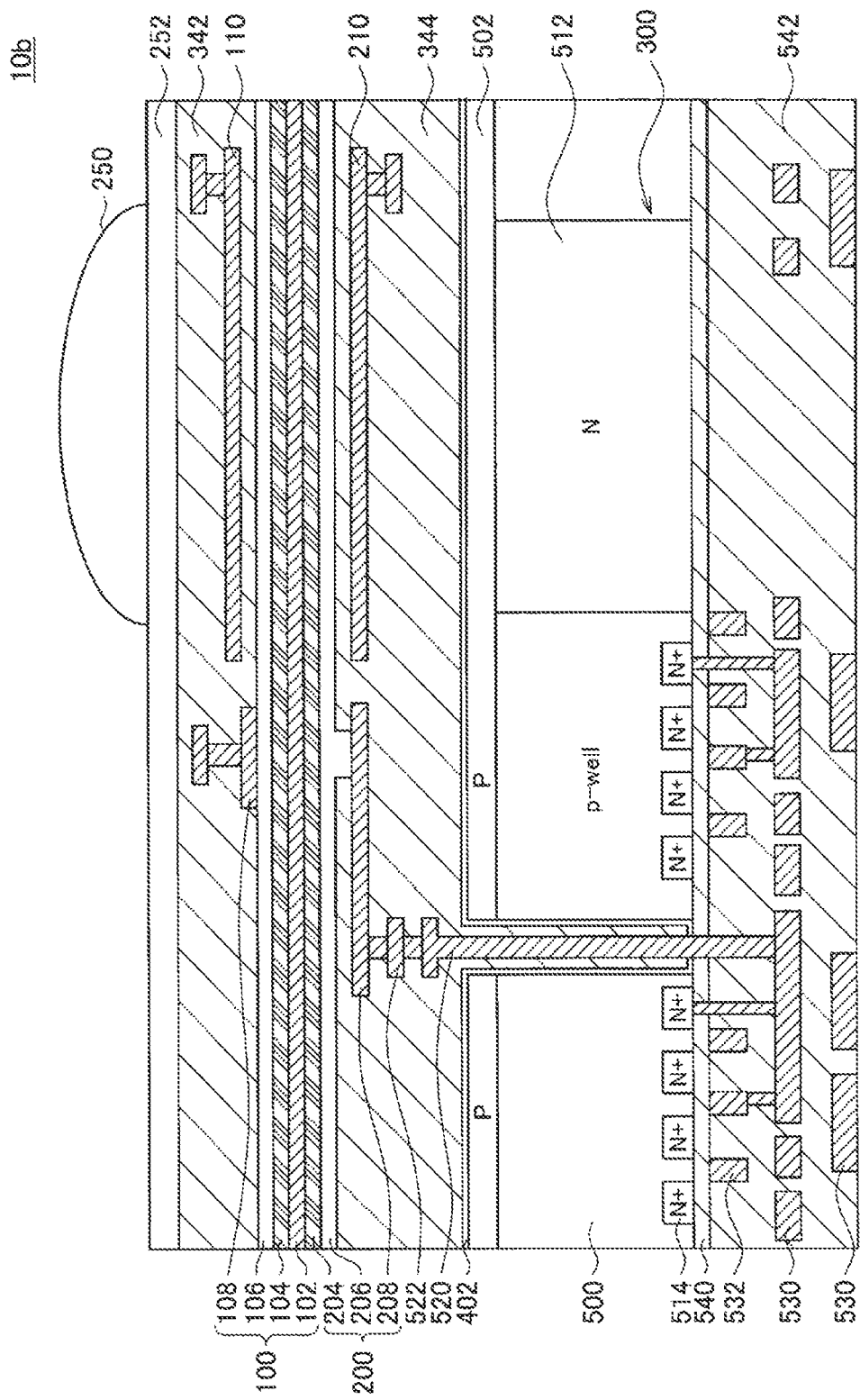
FIG. 6 is a sectional view of a solid-state image sensor 10b according to a third embodiment of the present disclosure.

Next, a stacked structure of the solid-state image sensor 10b according to the sixth embodiment of the present disclosure, which is a modification of the first embodiment, will be described with reference to FIG. 6. FIG. 6 is a sectional view of the solid-state image sensor 10b according to the present embodiment. Note that in the following description, description of the points common to the first embodiment as described above will be omitted, and points different from the first embodiment will be described.

In the present embodiment, as illustrated in FIG. 6, the PD 100 and the PD 200 share one common electrode 102. That is, in the stacked structure of the solid-state image sensor 10b according to the present embodiment, as the PD 200, the readout electrode 208, the semiconductor layer 206, the photoelectric conversion film 204, and the common electrode 102 are sequentially stacked. Further, in the above stacked structure, as the PD 100, the photoelectric conversion film 104, the semiconductor layer 106, and the readout electrode 108 are sequentially stacked on the common electrode 102. Therefore, in the present embodiment, the common electrode 202 and the insulating film 346 according to the first embodiment are not provided.

As described below, in the present embodiment, PD 100 and PD 200 share one common electrode 102, in other words, the common electrode 102 of the PD 100 and the common electrode 202 of the PD 200 are provided as an integrated electrode. According to the present embodiment, such a structure is used, so that it is possible to reduce the number of layers in the stacked structure of the solid-state image sensor 10. Therefore, according to the present embodiment, it is possible to further shorten the distance between the PD 100 located above and the PD 300 located below, and it becomes easy to suitably focus light on the stacked PDs 100, 200, and 300. Accordingly, it is possible to improve the shading characteristics, sensitivity characteristics, and reliability of the solid-state image sensor 10b. In addition, according to the present embodiment, since the number of layers in the stacked structure of the solid-state image sensor 10 can be reduced, the number of interfaces is reduced, and the return due to the reflection of incident light incident on the solid-state image sensor 10 can be prevented. Further, according to the present embodiment, it is possible to reduce the cost and time required for manufacturing the solid-state image sensor 10.

5. Fourth Embodiment

Figure 7:
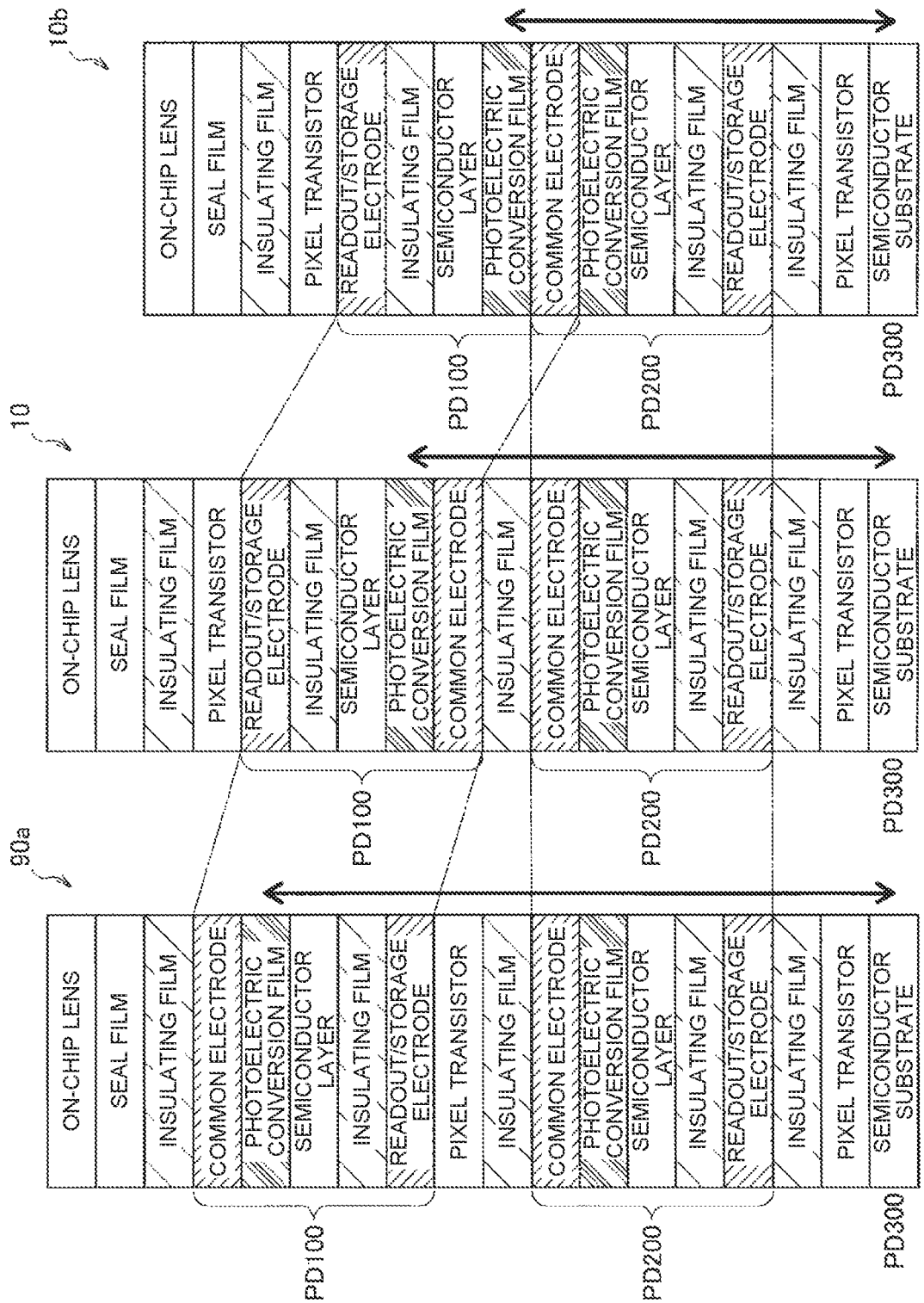
FIG. 7 is a schematic diagram of stacked structures of solid-state image sensors 10 and 10b according to a fourth embodiment of the present disclosure.
Figure 8A:
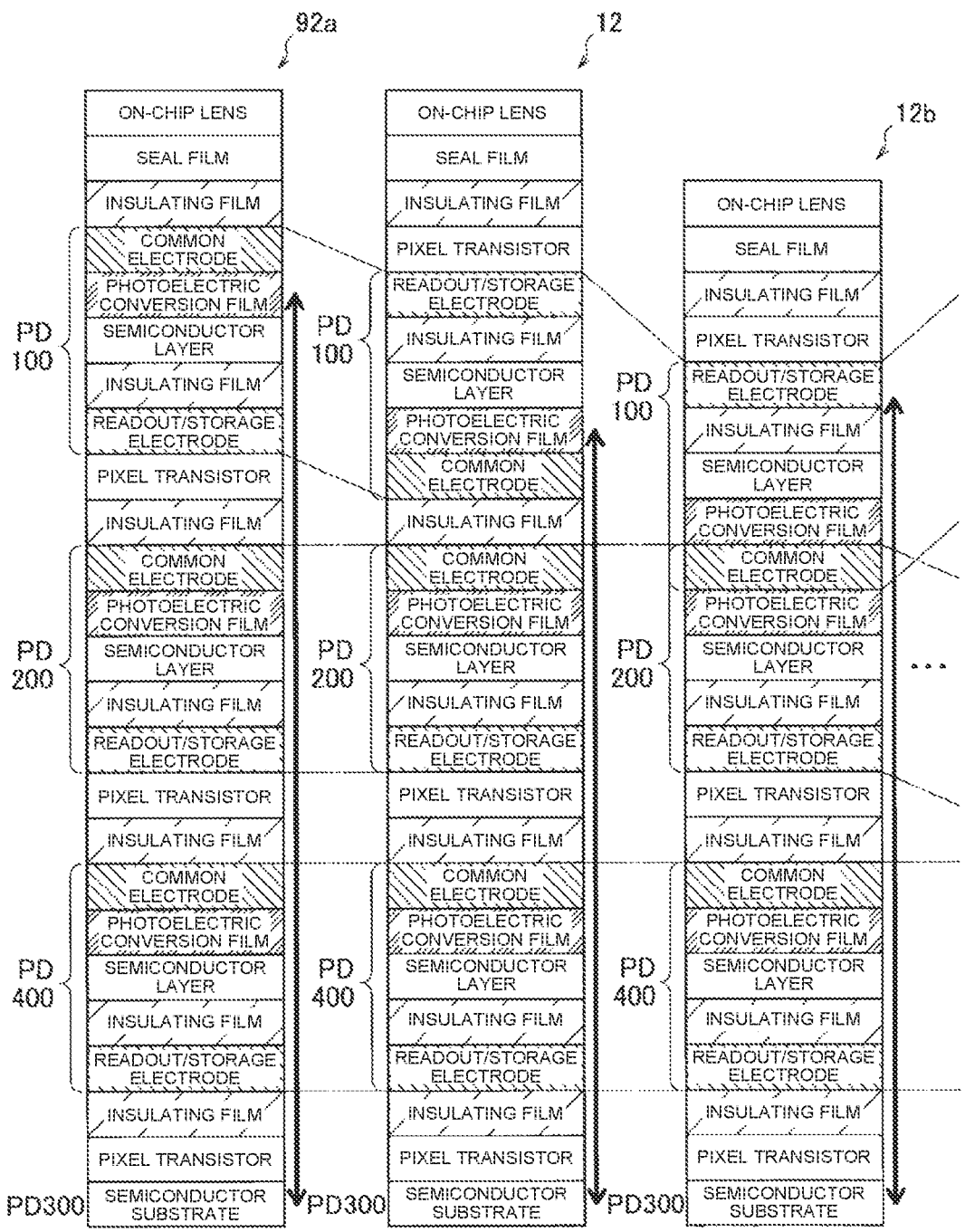
FIG. 8A is a schematic diagram of stacked structures of solid-state image sensors 12 and 12b according to the fourth embodiment of the present disclosure.
Figure 8B:
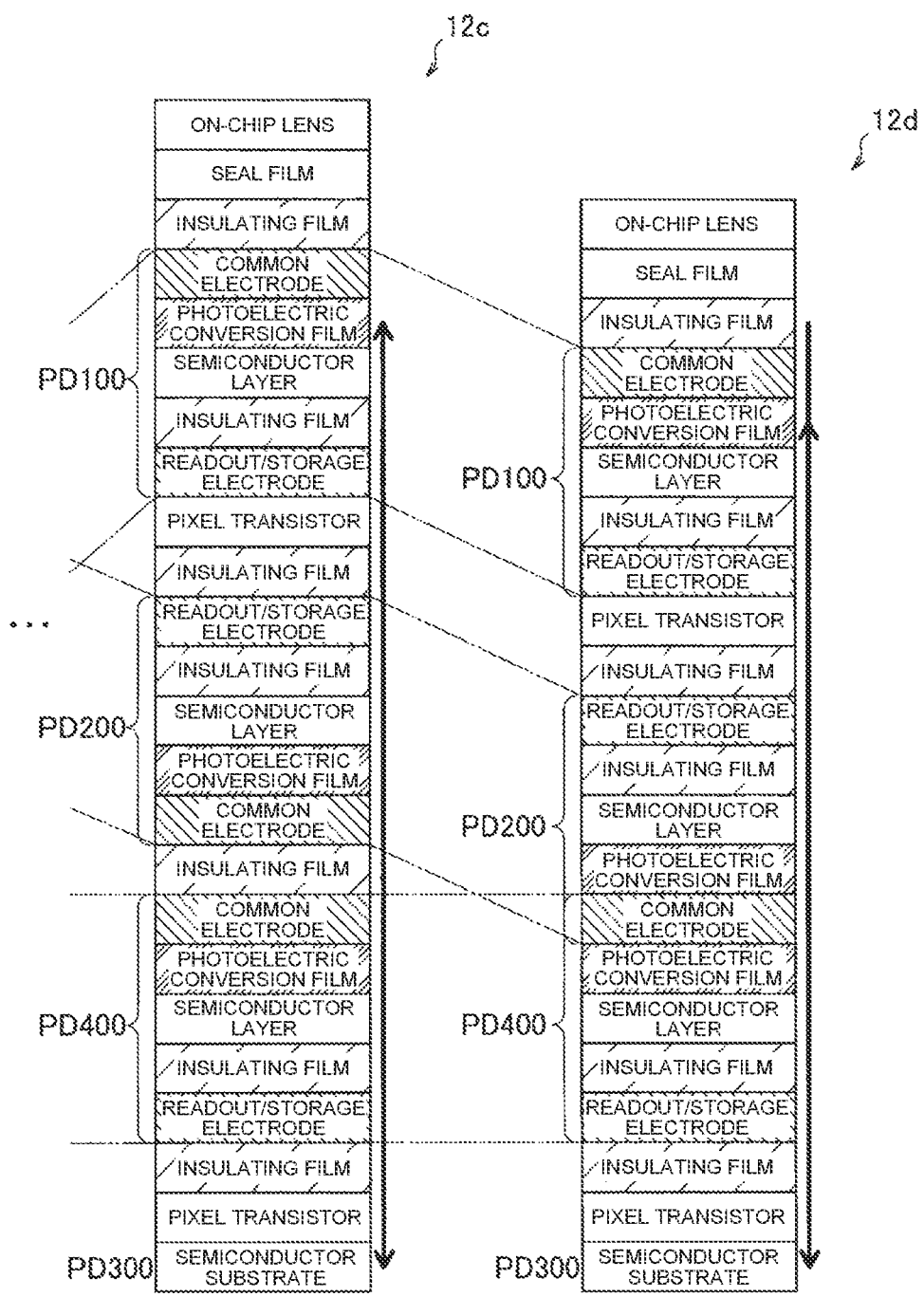
FIG. 8B is a schematic diagram of stacked structures of solid-state image sensors 12c and 12d according to the fourth embodiment of the present disclosure.

Here, as the fourth embodiment of the present disclosure, the stacked structure of the solid-state image sensor 10 will be examined based on the above-described first and third embodiments. In the following description, referring to FIG. 7, FIG. 8A, and FIG. 8B, the stacked structures of various solid-state image sensors 10 will be examined. FIG. 7 is a schematic diagram of a stacked structure of the solid-state image sensors 10 and 10b according to the present embodiment. Specifically, a schematic diagram of a stacked structure of the solid-state image sensors 10 and 10b having three PDs 100, 200, and 300 is illustrated in comparison with the solid-state image sensor 90a according to the comparative example. Further, FIGS. 8A and 8B are schematic diagrams of stacked structures of the solid-state image sensors 12, 12b, 12c, and 12d according to the present embodiment. Specifically, the stacked structures of the solid-state image sensors 12, 12b, 12c, and 12d having four PDs 100, 200, 300, and 400 are illustrated in comparison with a solid-state image sensor 92a according to the comparative example.

Specifically, the stacked structure of the solid-state image sensor 90a according to the comparative example of FIG. 40 is schematically illustrated on the left side of FIG. 7. As described above, in the solid-state image sensor 90a, the PD 100 and the PD 200 have a photoelectric conversion stacked structure in which the respective layers are stacked in the same order. Further, a layer including a pixel transistor and a wiring line electrically connected to the PD 100 is provided between the PD 100 and the PD 200, and a layer including a pixel transistor and a wiring line electrically connected to the PD 200 and the PD 300 and the semiconductor substrate 500 including the PD 300 are provided below the PD 200.

Then, in the center of FIG. 7, a stacked structure of the solid-state image sensor 10 according to the first embodiment of FIG. 1 is schematically illustrated. As described above, in the solid-state image sensor 10, the PD 100 and the PD 200 have a photoelectric conversion stacked structure in which each layer is stacked, so that the PD 100 and the PD 200 are in a line-symmetrical relationship with each other with a vertical plane perpendicular to the stacking direction of the stacked structure of the solid-state image sensor 10 as the axis of symmetry. Further, in the solid-state image sensor 10, unlike the solid-state image sensor 90a, a layer (first controller) including a pixel transistor and a wiring line electrically connected to the PD 100 is provided above the PD 100. In the case of being stacked in this manner, according to the solid-state image sensor 10, the distance between the PD 100 located above and the PD 300 located below can be further shortened as compared to the solid-state image sensor 90a according to the comparative example.

Further, a stacked structure of the solid-state image sensor 10b according to the third embodiment of FIG. 6 is schematically illustrated on the right side of FIG. 7. As described above, in the solid-state image sensor 10b, the common electrode 102 shared by the PD 100 and the PD 200 is provided. In the case of being stacked in this manner, according to the solid-state image sensor 10b, the distance between the PD 100 located above and the PD 300 located below can be further shortened as compared to the solid-state image sensor 10.

Next, a case in which a PD 400 (third photoelectric converter) having the same configuration as the PDs 100 and 200 is provided below the PD 200, and further the PD 300 (fourth photoelectric converter) is provided in the semiconductor substrate 500 will be examined with reference to FIGS. 8A and 8B. Here, the PD 400 has the same stacked structure and material as the PDs 100 and 200, that is, a stacked structure including a common electrode (third common electrode), a photoelectric conversion film (third photoelectric conversion film), a semiconductor layer, a readout electrode (third readout electrode), and a storage electrode. However, in the photoelectric conversion stacked structure of the PD 400, the order of stacking respective layers is not particularly limited. Further, the PD 300 provided in the semiconductor substrate 500 is, for example, a photoelectric conversion element capable of detecting infrared light.

Specifically, a stacked structure of the solid-state image sensor 92a having the PDs 100, 200, and 400 having a photoelectric conversion stacked structure in which the respective layers are stacked in the same order is schematically illustrated on the left side of FIG. 8A, similarly to the stacked structure of the solid-state image sensor 90a according to the comparative example. Further, a stacked structure of the solid-state image sensor 12 in which the PD 100 and the PD 200 have the same stacked structure as the stacked structure of the solid-state image sensor 10 according to the first embodiment is schematically illustrated in the center of FIG. 8A. Further, a stacked structure of the solid-state image sensor 12b in which the PD 100 and the PD 200 have the same stacked structure as the stacked structure of the solid-state image sensor 10b according to the third embodiment is schematically illustrated on the right side of FIG. 8A. Note that, in solid-state image sensor 92a, layers including pixel transistors connected to the PDs 100, 200, and 400 are provided below the PDs 100, 200, and 400, respectively. On the other hand, in the solid-state image sensors 12 and 12b, unlike the solid-state image sensor 92a, a layer including a pixel transistor electrically connected to the PD 100 is provided above the PD 100.

As can be seen from FIG. 8A, according to the solid-state image sensors 12 and 12b according to the present embodiment, the distance between the PD 100 located above and the PD 300 located below can be further shortened as compared to the solid-state image sensor 92a according to the comparative example.

Further, a stacked structure of the solid-state image sensor 12c in which the PD 200 and the PD 400 have the same stacked structure as the stacked structure of the solid-state image sensor 10 according to the first embodiment is schematically illustrated on the left side of FIG. 8B. Further, a stacked structure of the solid-state image sensor 12d in which the PD 200 and the PD 400 have the same stacked structure as the stacked structure of the solid-state image sensor 10b according to the third embodiment is schematically illustrated on the right side of FIG. 8B. In the solid-state image sensors 12c and 12d, a layer (second controller) including a shared pixel transistor and a wiring line, which are electrically connected to the PD 100 and the PD 200, is provided between the PD 100 and the PD 200. As described above, according to the solid-state image sensors 12c and 12d, the layer including the pixel transistor and the like is shared by the PD 100 and the PD 200, whereby the area of the plane shielded by the pixel transistor and the like is reduced. Accordingly, it is possible to further improve the utilization efficiency of the incident light incident on the solid-state image sensor 10.

Note that, in the present embodiment, for example, the PD 300 in the semiconductor substrate 500 need not be provided in the stacked structures illustrated in FIGS. 7, 8A, and 8B. Further, in the present embodiment, another PD having the same configuration as the PDs 100 and 200 may be further provided below the PD 400.

6. Fifth Embodiment

Next, as a fifth embodiment of the present disclosure, a method of manufacturing the solid-state image sensor 10 according to the first embodiment as described above will be described with reference to FIGS. 9 to 18. FIGS. 9 to 18 are each an explanatory diagram for explaining the method of manufacturing the solid-state image sensor 10 according to the present embodiment.

Figure 9:
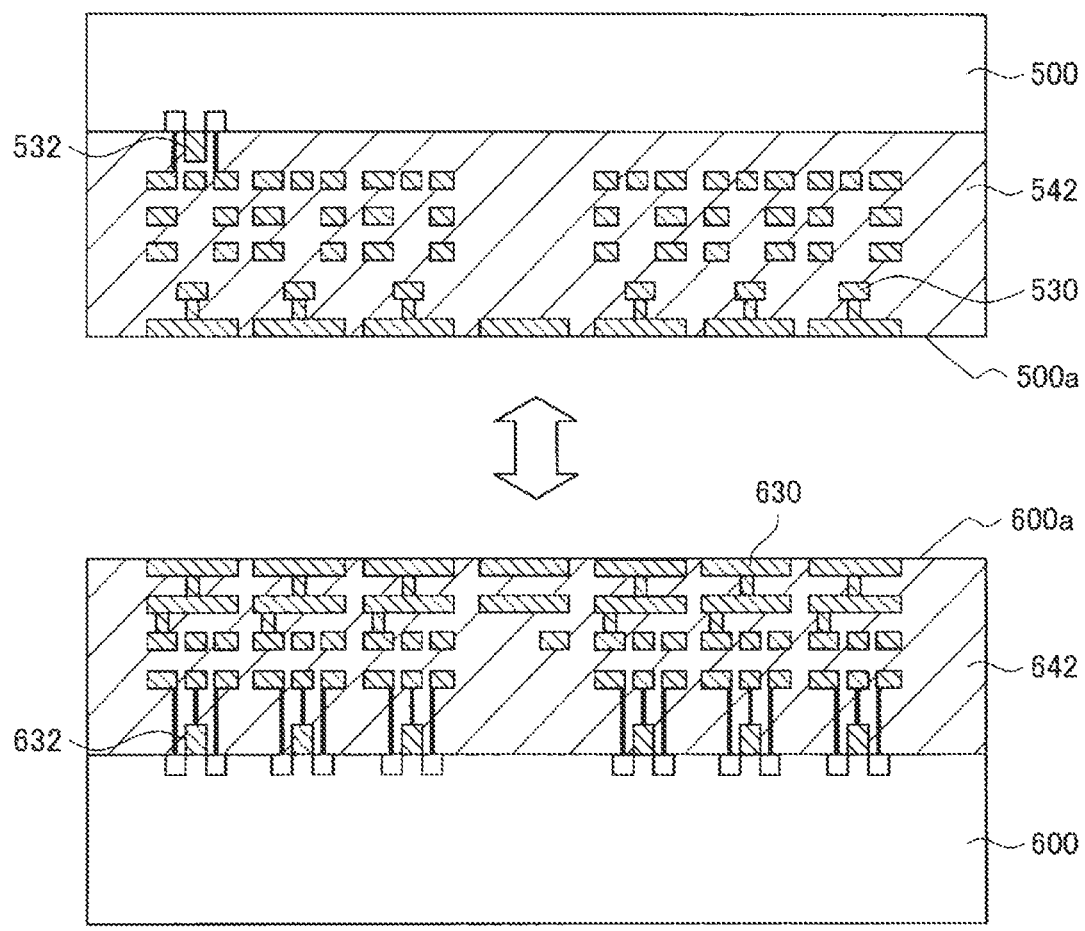
FIG. 9 is an explanatory diagram (No. 1) for explaining a method of manufacturing the solid-state image sensor 10 according to a fifth embodiment of the present disclosure.

First, a silicon layer (not illustrated) is formed on the surface of the semiconductor substrate 500 using an epitaxial growth method, and a semiconductor region 512 (not illustrated) to serve as the PD 300 or the like is formed in the silicon layer by using impurity ion implantation. Further, gate oxidation (formation of the insulating film 540), formation of the gate electrode 532, formation of sidewalls, and ion implantation are performed on the silicon layer to form a pixel transistor or the like (not illustrated) of the PD 300. Further, the wiring line 530, an insulating film 542, and the like are formed on the silicon layer. Further, similarly to the above, for example, various transistors, a wiring line 630, an electrode 632, and an insulating film 642 are formed on the surface of another semiconductor substrate 600. In this manner, two semiconductor substrates 500 and 600 as illustrated in FIG. 9 can be obtained. Note that, although not mentioned in the above description, the semiconductor region 502 may be formed by using impurity ion implantation, and the anti-reflection film 402 may be further formed.

Figure 10:
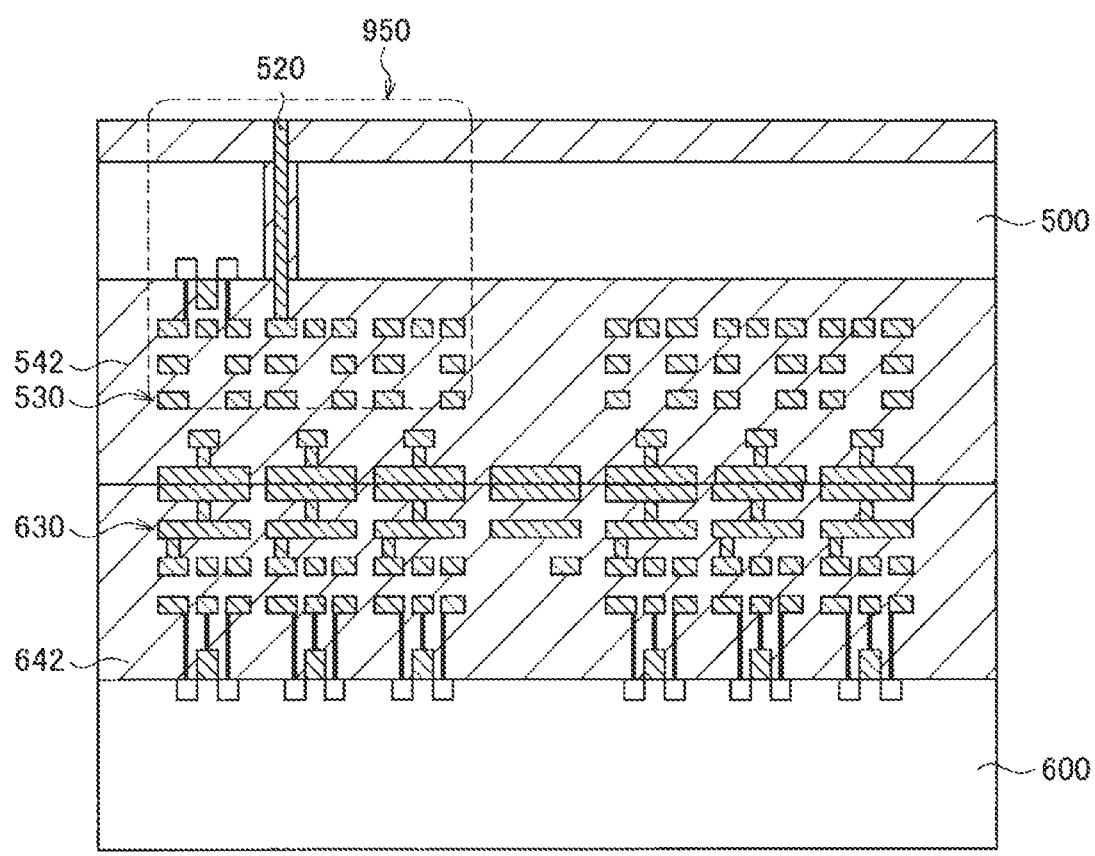
FIG. 10 is an explanatory diagram (No. 2) for explaining the method of manufacturing the solid-state image sensor 10 according to the fifth embodiment of the present disclosure.

Then, bonding surfaces 500a and 600a of the semiconductor substrates 500 and 600 are opposed to each other, and the semiconductor substrates 500 and 600 are bonded to each other. At that time, it is preferable to perform bonding so that the wiring lines 530 and 630 are aligned with each other. After the bonding, the semiconductor substrate 500 is ground or the like to form the insulating film 344 and the through electrode 520. In this manner, the structure as illustrated in FIG. 10 can be obtained. Note that, in the following description, a location of a region 950 illustrated in FIG. 10 will be described. Therefore, the drawings after FIG. 11 are enlarged sectional views of the region 950 and correspond to the sectional view of the solid-state image sensor 10 in FIG. 1.

Figure 11:
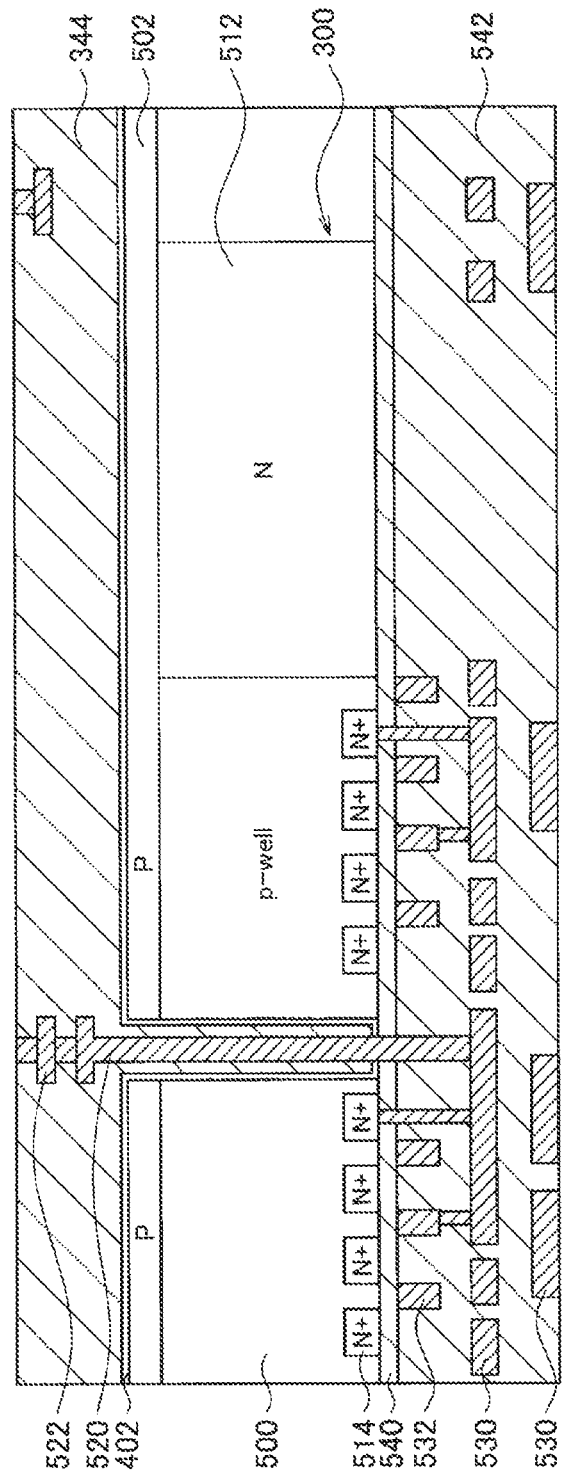
FIG. 11 is an explanatory diagram (No. 3) for explaining the method of manufacturing the solid-state image sensor 10 according to the fifth embodiment of the present disclosure.

Next, as illustrated in FIG. 11, the wiring line 522 which also serves as a light shielding film is formed on the through electrode 520. The wiring line 522 is formed by processing so as to leave a portion where light shielding is desired. Since the wiring line 522 is electrically connected to the through electrode 520 and is also used as a light shielding film, the wiring line 522 is preferably formed of a stacked film of W and barrier metals: Ti and TiN.

Figure 12:
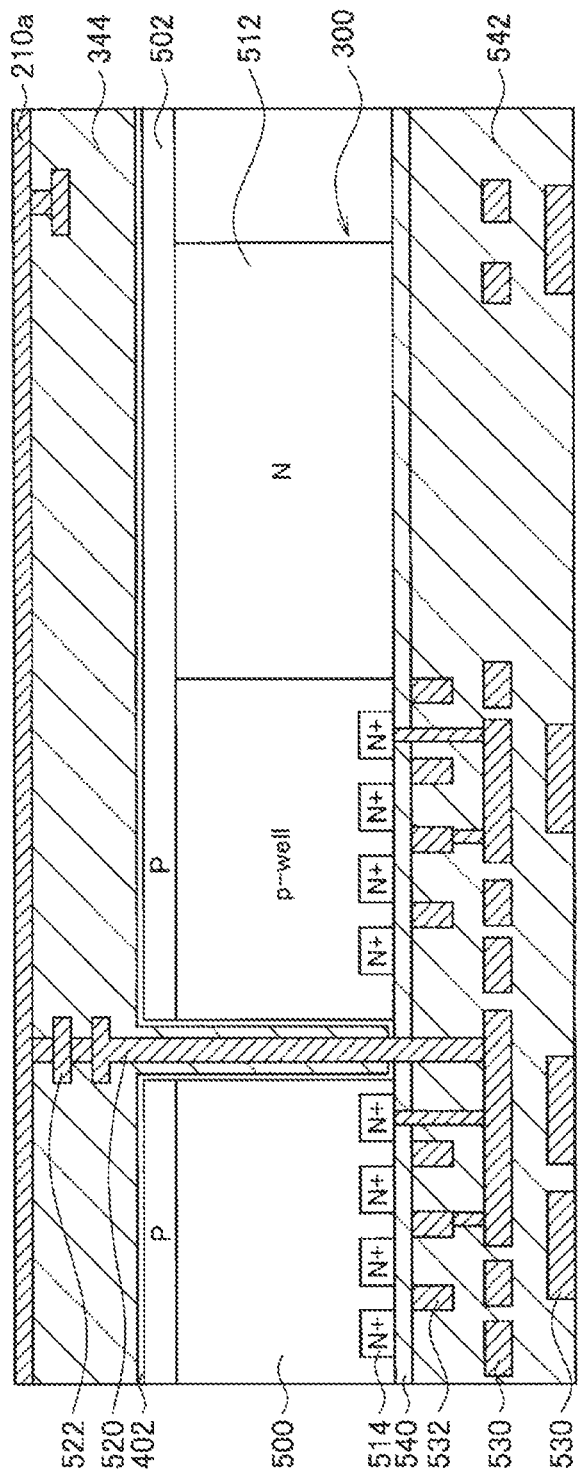
FIG. 12 is an explanatory diagram (No. 4) for explaining the method of manufacturing the solid-state image sensor 10 according to the fifth embodiment of the present disclosure.
Figure 13:
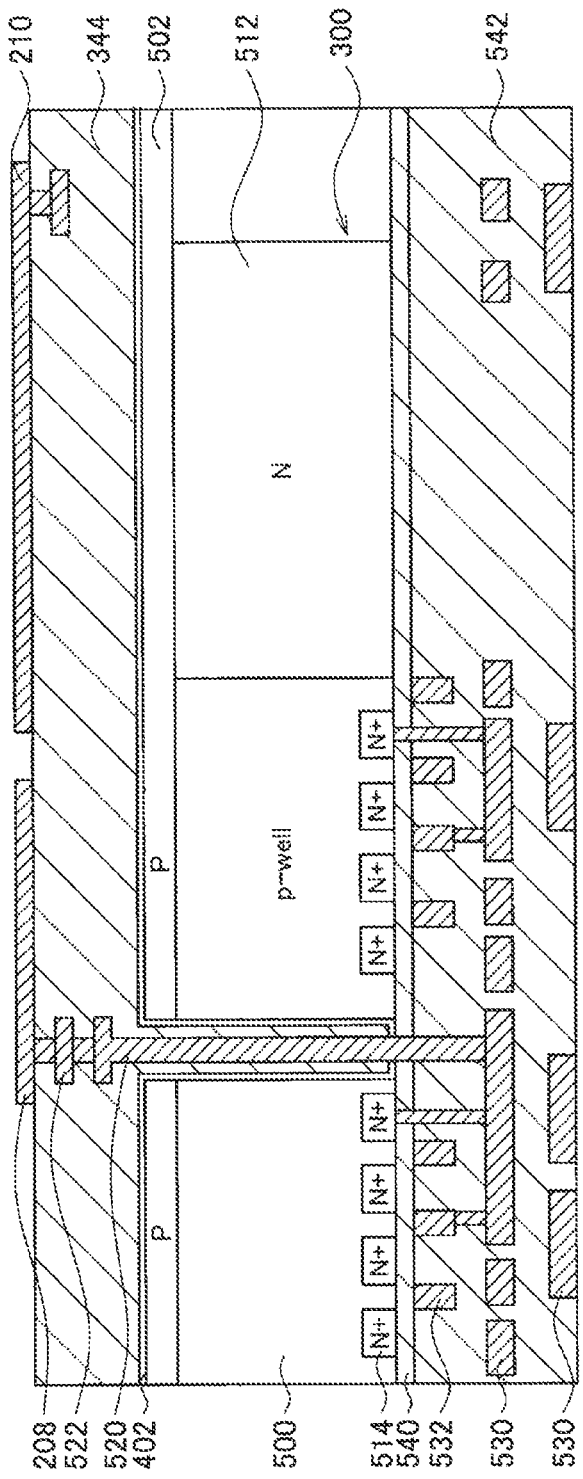
FIG. 13 is an explanatory diagram (No. 5) for explaining the method of manufacturing the solid-state image sensor 10 according to the fifth embodiment of the present disclosure.

Then, as illustrated in FIGS. 12 and 13, the readout electrode 208 and the storage electrode 210 having a desired shape are formed on the insulating film 344 by using lithography, etching, or the like. Specifically, the readout electrode 208 and the storage electrode 210 having a desired shape can be formed by stacking a transparent conductive film 210a such as ITO using a sputtering method, patterning the resultant film using a photolithography technique, and processing the resultant film using dry etching or wet etching. The insulating film 344 formed by plasma CVD or the like is embedded between the readout electrode 208 and the storage electrode 210. The upper surfaces of the readout electrode 208 and the storage electrode 210 and the upper surface of the insulating film 344 therebetween are preferably flattened by chemical mechanical polishing (CMP).

Figure 14:
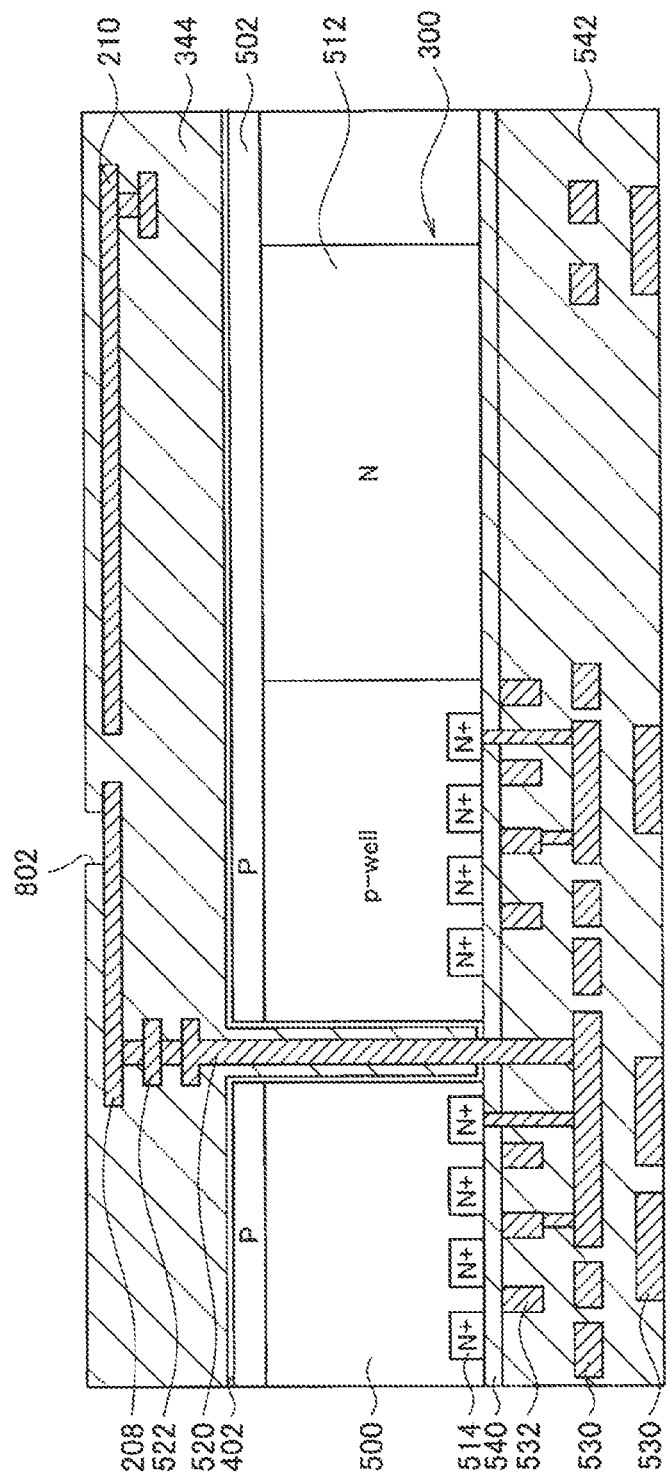
FIG. 14 is an explanatory diagram (No. 6) for explaining the method of manufacturing the solid-state image sensor 10 according to the fifth embodiment of the present disclosure.
Figure 15:
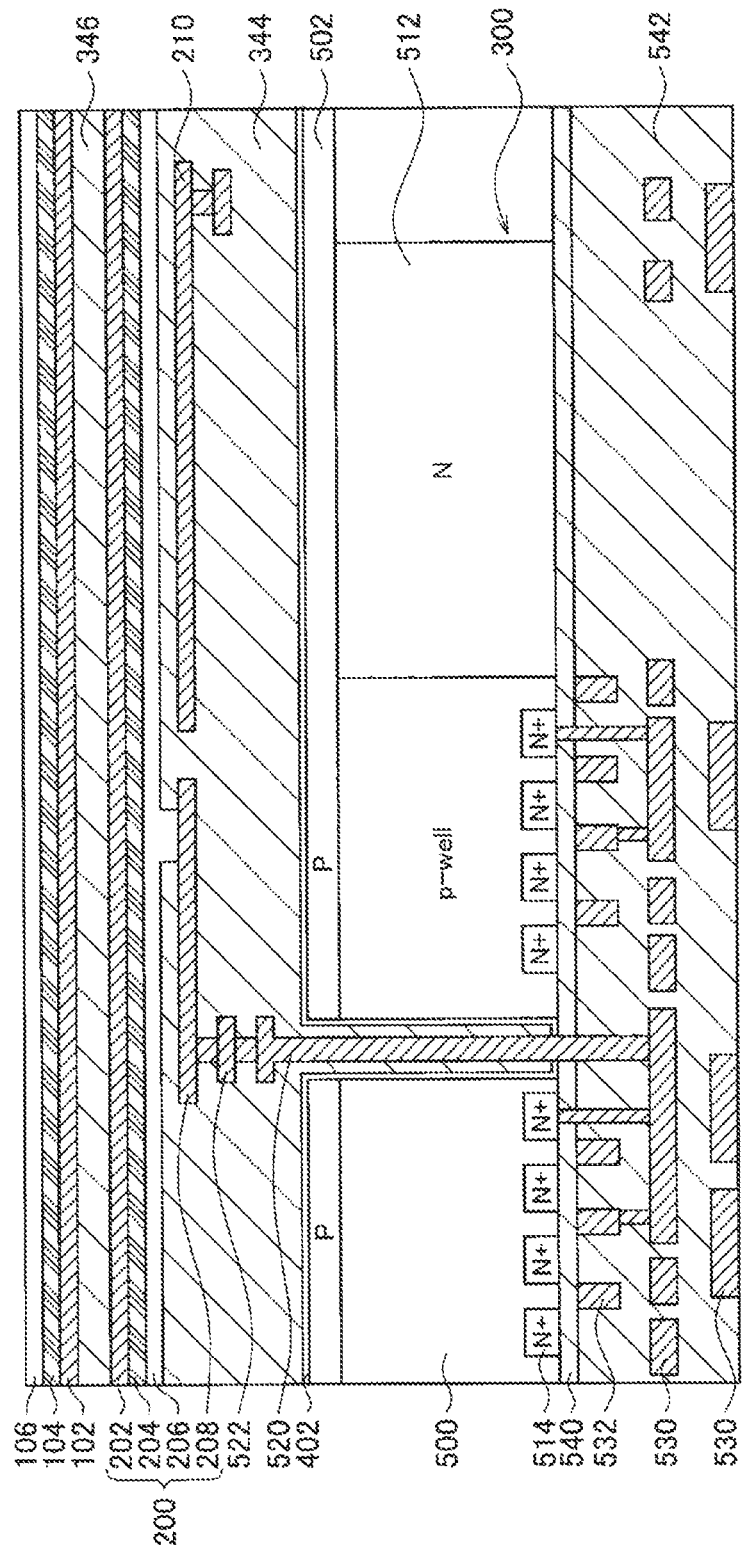
FIG. 15 is an explanatory diagram (No. 7) for explaining the method of manufacturing the solid-state image sensor 10 according to the fifth embodiment of the present disclosure.

Next, as illustrated in FIG. 14, the insulating film 344 is formed on the readout electrode 208 and the storage electrode 210, and an aperture 802 is formed in the insulating film 344 using lithography or the like so that a part of the readout electrode 208 is exposed. Further, the semiconductor layer 206 is formed on the aperture 802 and the insulating film 344. Note that the upper surface of the insulating film 344 may be flattened by CMP or the like before the semiconductor layer 206 is formed.

Further, the photoelectric conversion film 204, the common electrode 202, and the insulating film 346 are sequentially stacked on the semiconductor layer 206. The photoelectric conversion film 204 can be formed by spin coating, vacuum deposition, or the like. Further, before and after the formation of the insulating film 346, a post-treatment such as ashing or organic cleaning may be performed to remove deposits and residues. Then, the common electrode 102, the photoelectric conversion film 104, the semiconductor layer 106, and the insulating film 342 are sequentially stacked on the insulating film 346. In this manner, the structure illustrated in FIG. 15 can be obtained.

Figure 16:
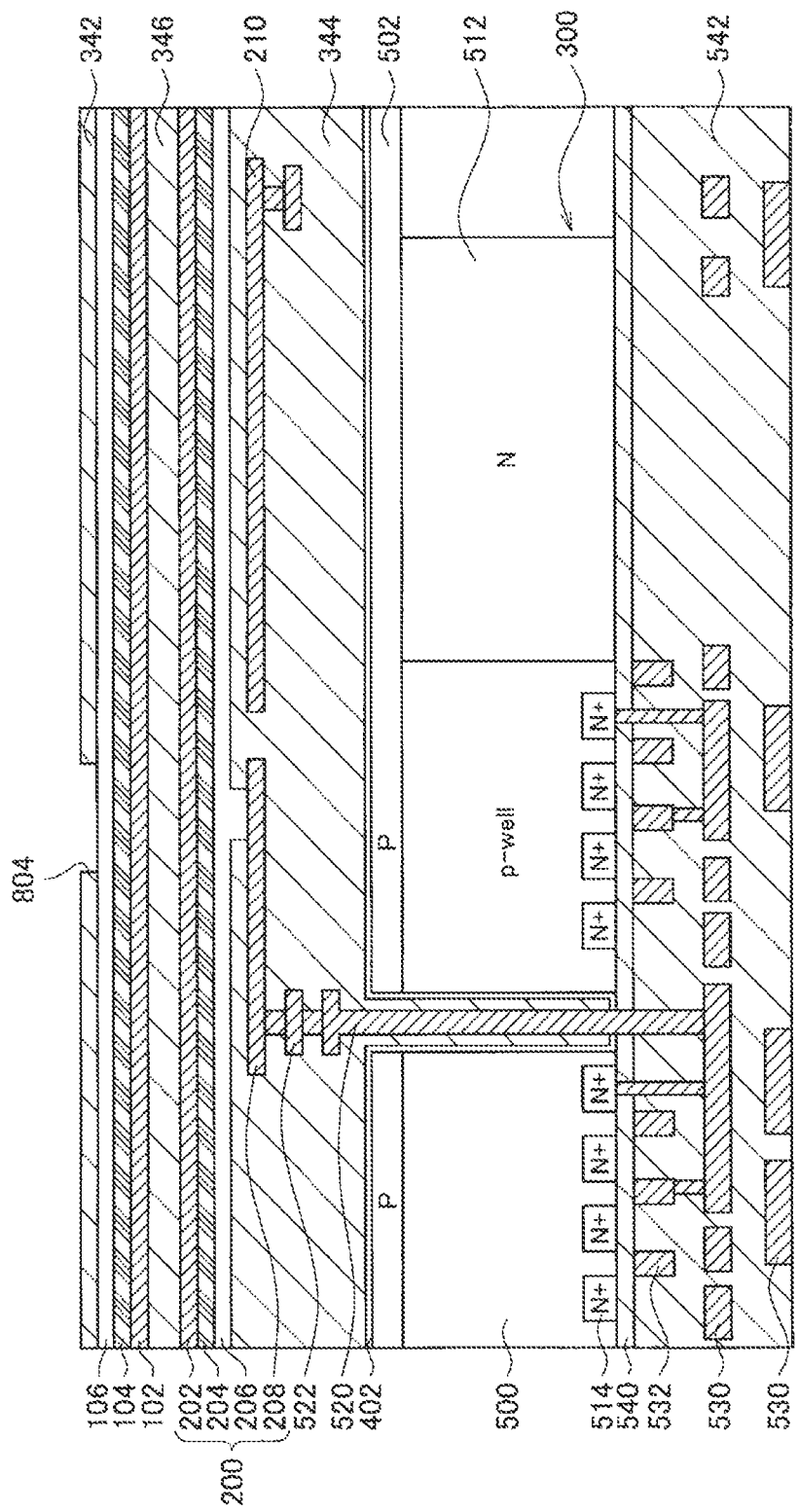
FIG. 16 is an explanatory diagram (No. 8) for explaining the method of manufacturing the solid-state image sensor 10 according to the fifth embodiment of the present disclosure.

Then, as illustrated in FIG. 16, an aperture 804 is formed in the insulating film 342 by lithography or the like so that a part of the semiconductor layer 106 is exposed.

Figure 17:
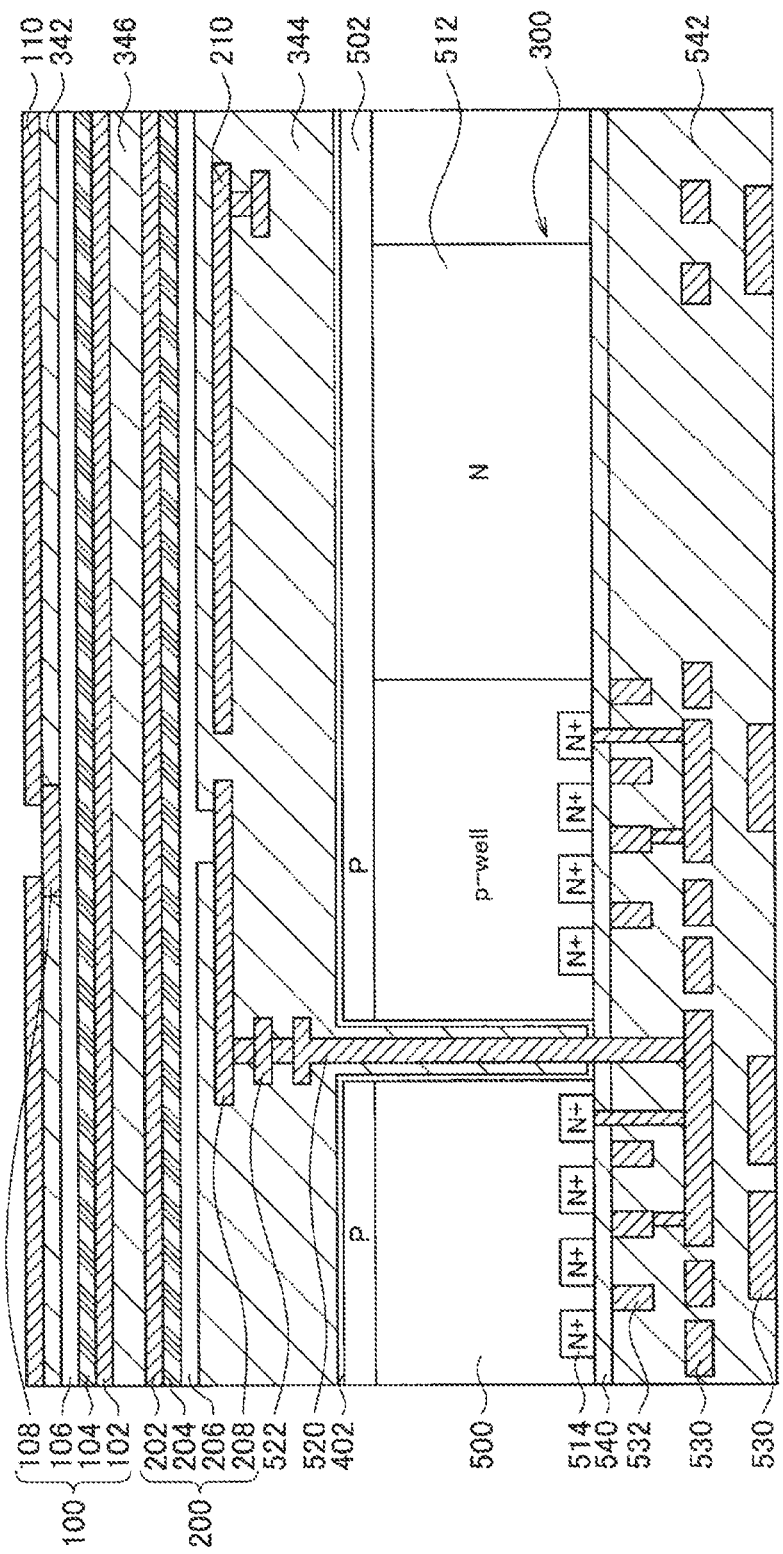
FIG. 17 is an explanatory diagram (No. 9) for explaining the method of manufacturing the solid-state image sensor 10 according to the fifth embodiment of the present disclosure.

Next, as illustrated in FIG. 17, a transparent conductive film is embedded in the aperture 804, and a transparent conductive film is further stacked thereon.

Figure 18:
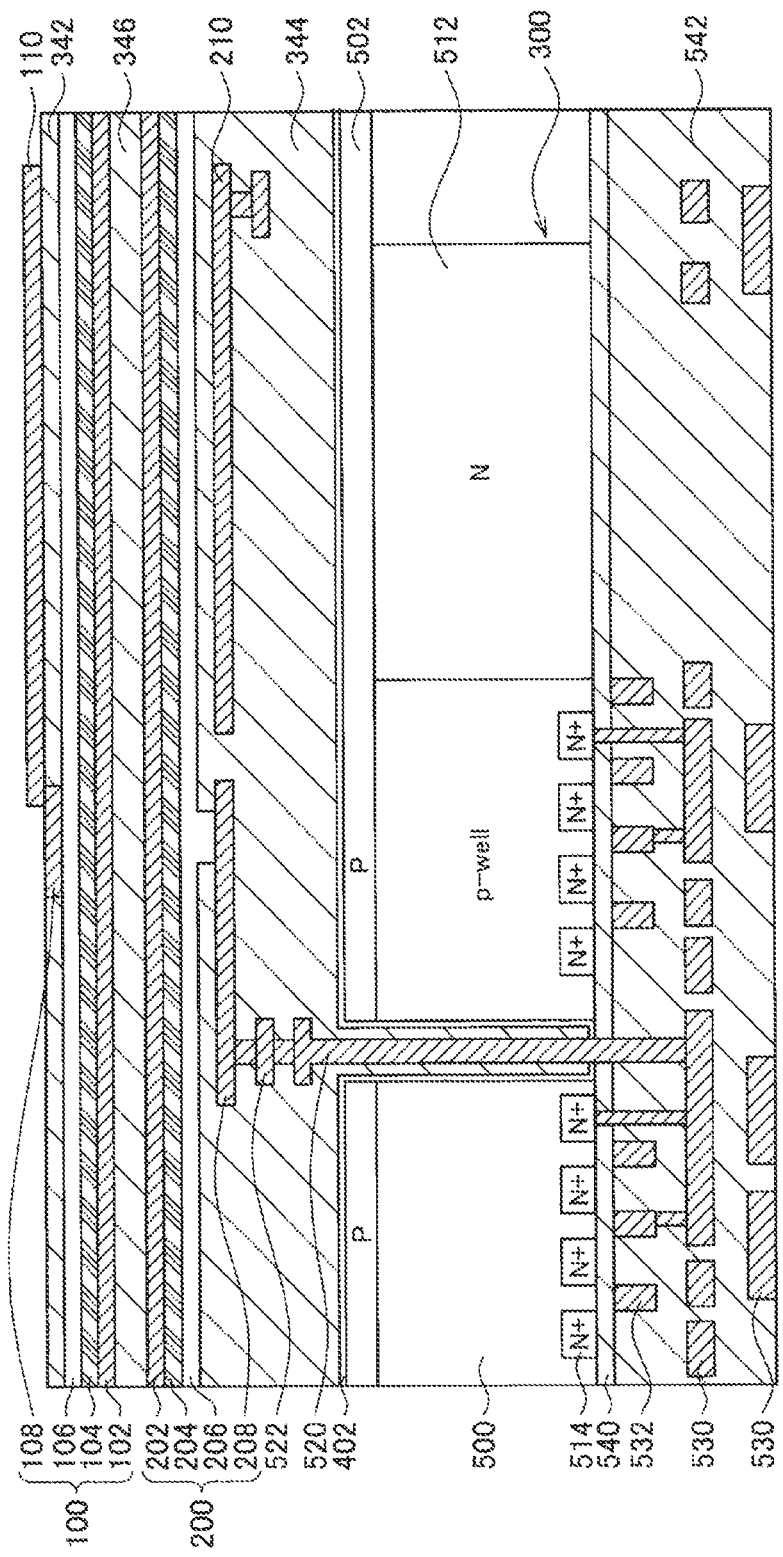
FIG. 18 is an explanatory diagram (No. 10) for explaining the method of manufacturing the solid-state image sensor 10 according to the fifth embodiment of the present disclosure.

Further, as illustrated in FIG. 18, the stacked transparent conductive films are processed to form the readout electrode 108 and the storage electrode 110.

After that, the insulating film 342, the high refractive index layer 252, the on-chip lens 250, and the like are sequentially stacked and formed, so that the solid-state image sensor 10 as illustrated in FIG. 1 can be obtained.

Examples of the method of forming each of the above layers include a PVD method, and a CVD method. Examples of the PVD method include a vacuum deposition method using resistance heating or high frequency heating, an electron beam (EB) deposition method, various sputtering methods (magnetron sputtering method, RF-DC coupled bias sputtering method, electron cyclotron resonance (ECR) sputtering method, facing-target sputtering method, and high frequency sputtering method), an ion plating method, a laser ablation method, a molecular beam epitaxy (MBE) method, and a laser transfer method. Examples of the CVD method include a plasma CVD method, a thermal CVD method, a metal organic (MO) CVD method, and a photo CVD method. Further, examples of other methods include an electrolytic plating method and an electroless plating method, a spin coating method; a dipping method; a casting method; a micro contact printing method; a drop casting method; various printing methods such as a screen printing method, an inkjet printing method, an offset printing method, a gravure printing method, a flexographic printing method; a stamping method; a spray method; various coating methods such as an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, and a calendar coater method. Examples of the method of patterning each layer include chemical etching such as shadow mask, laser transfer, and photolithography; and physical etching by ultraviolet light, laser, and the like. In addition, examples of the flattening technique include a CMP method, a laser flattening method, and a reflow method.

7. Sixth Embodiment

Next, as a sixth embodiment of the present disclosure, a method of manufacturing the solid-state image sensor 10, which is different from the manufacturing method according to the fifth embodiment as described above, will be described.

By the way, when forming the solid-state image sensor 10 having the stacked structure in which the PDs 100 and 200 are stacked as described above, the heat applied when forming the PD 100 located above may damage each layer included in the PD 200 located below, particularly the photoelectric conversion film 204. In order to avoid such damage, it is considered to use a method of bonding a semiconductor substrate 750 in which the PD 100 has been already provided to the semiconductor substrate 500 in which the PD 200 has been already provided, as described below. Further, when such a method is selected, the semiconductor layer 106 and the semiconductor layer 206 included in the PDs 100 and 200 can be formed by a high temperature process, respectively, so that the characteristics of the PDs 100 and 200 can be further improved.

When the above-described bonding is adopted, it is required to bond the semiconductor substrate 500 to the semiconductor substrate 750 so that the PD 100 located above and the PD 200 located below have a predetermined positional relationship with each other. However, it may be difficult to accurately bond the semiconductor substrate 500 to the semiconductor substrate 750 in a mass production process. That is, when the above-described bonding is adopted, bonding deviation may occur. Therefore, in the present embodiment, even if bonding deviation occurs, the readout electrode 108 and the storage electrode 110 are formed in the PD 100 located above (films are stacked, and processed by lithography, or the like) after the bonding, as a result of which the PD 100 and the PD 200 have a predetermined positional relationship with each other. In this manner, according to the present embodiment, it is possible to accurately form the PD 100 and the PD 200 so as to have a predetermined positional relationship with each other while avoiding damage to the photoelectric conversion films 104 and 204 due to heat (misalignment can be avoided).

Figure 19:
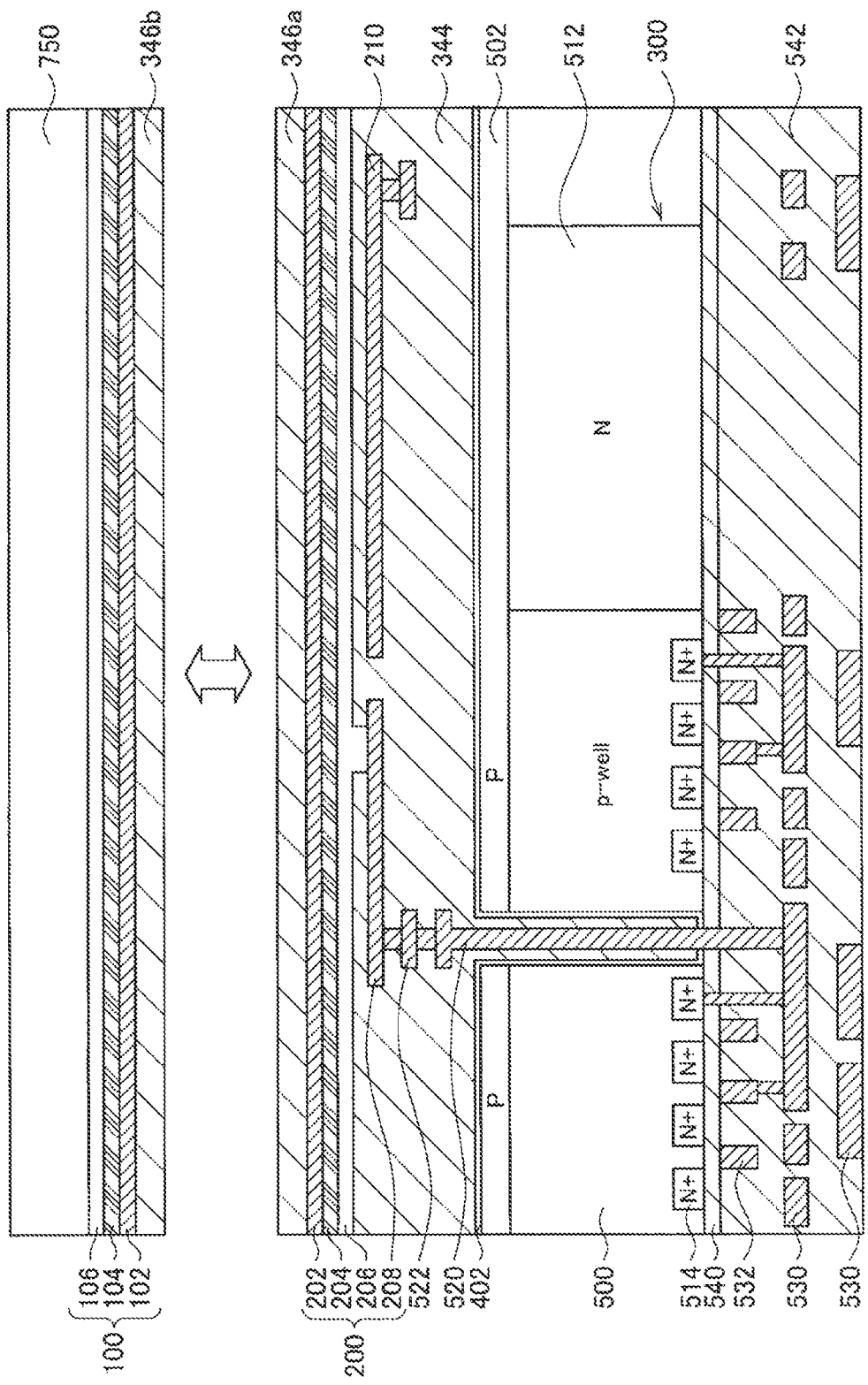
FIG. 19 is an explanatory diagram (No. 1) for explaining a method of manufacturing the solid-state image sensor 10 according to a sixth embodiment of the present disclosure.
Figure 20:
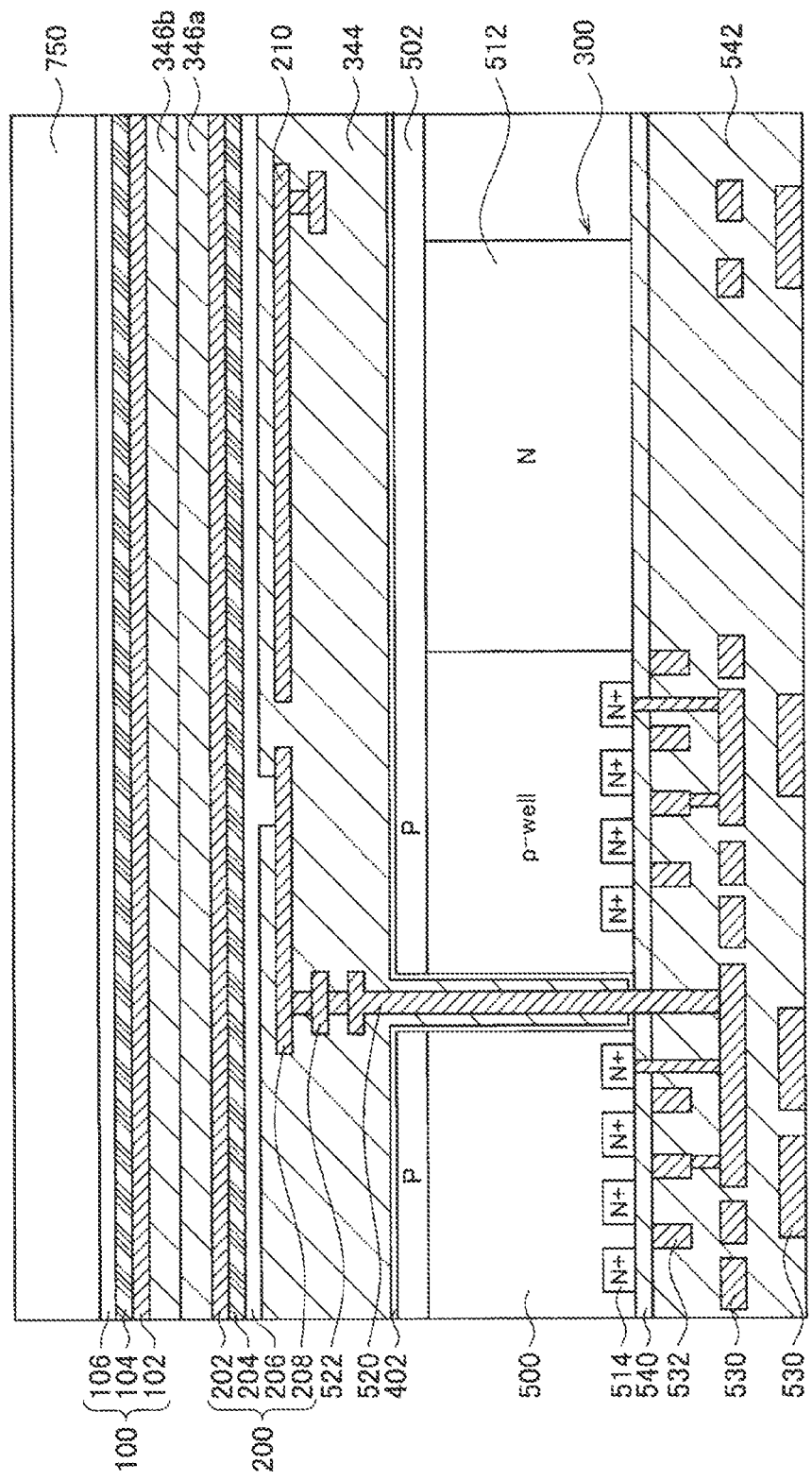
FIG. 20 is an explanatory diagram (No. 2) for explaining the method of manufacturing the solid-state image sensor 10 according to the sixth embodiment of the present disclosure.

Hereinafter, a method of manufacturing the solid-state image sensor 10 according to the sixth embodiment using the above-described bonding will be described with reference to FIGS. 19 and 20. FIGS. 19 and 20 are each an explanatory diagram for explaining the method of manufacturing the solid-state image sensor 10 according to the present embodiment, and correspond to the sectional view of the solid-state image sensor 10 in FIG. 1.

First, similarly to the fifth embodiment, the semiconductor substrate 500 (first substrate) on which the PD 200 and the PD 300 and their corresponding pixel transistors, the electrode 532, the wiring line 530, the through electrode 520, and the like are formed is prepared. Further, an insulating film 346a (e.g., $SiO_x$ film) is formed on the common electrode 202 provided on the semiconductor substrate 500. In this manner, the semiconductor substrate 500 illustrated on the lower side of FIG. 19 can be obtained.

Next, the semiconductor layer 106, the photoelectric conversion film 104, and the common electrode 102 are sequentially stacked on, for example, another semiconductor substrate 750 (e.g., a SOI (Silicon On Insulator) substrate, a transfer substrate, etc.) (second substrate). Further, an insulating film 346b (e.g., $SiO_x$ film) is stacked on the common electrode 102. In this manner, as illustrated on the upper side of FIG. 19, the substrate 750 on which the PD 100 is formed can be obtained. The details of the formation of each layer are the same as in the fifth embodiment, and thus a description thereof will be omitted here.

Further, as illustrated in FIG. 20, the semiconductor substrate 500 is bonded to the substrate 750 so that the insulating films 346a and 346b face each other. Note that, at the time of bonding, the upper surfaces of the insulating films 346a and 346b are subjected to plasma treatment or heated, whereby the films can be bonded. Further, in the present embodiment, the bonding may be performed using an adhesive or the like. In this manner, the structure illustrated in FIG. 20 can be obtained.

After that, the semiconductor substrate 750 on the semiconductor layer 106 is removed, and the readout electrode 108 and the storage electrode 110 are formed (stacked and processed by lithography or the like). Further, the insulating film 342, the high refractive index layer 252, the on-chip lens 250, and the like are stacked and formed, so that the solid-state image sensor 10 as illustrated in FIG. 1 can be obtained.

Note that, in the above description, it has been described such that the semiconductor substrate 750 such as a SOI substrate or a transfer substrate is used, but the present embodiment is not limited thereto. The bonding may be performed while adsorbing and fixing a thin film in which respective layers (the semiconductor layer 106, the photoelectric conversion film 104, the common electrode 102, etc.) are stacked using a Bernoulli chuck.

8. Seventh Embodiment

By the way, in the PD 100 and the PD 200, there is a case in which, for example, the common electrode 102, the common electrode 202, and the like are connected to the same wiring line (see FIG. 3). For example, the wiring line 430 (see FIG. 21) electrically connected to the common electrode 202 of the PD 200 may be provided in such a manner to extend upward from the common electrode 202 in order to be electrically connected to the common electrode 102 of the PD 100. In such a case, the formation of the wiring line 430 may damage the photoelectric conversion film 104 or the semiconductor layer 106 of the PD 100 located above. Therefore, in order to avoid such damage, as will be described below, it is contemplated that an end of the PD 100 is formed in a stepwise shape so as to avoid the wiring line 430 from having a shape that penetrates the photoelectric conversion film 104 and the semiconductor layer 106 of the PD 100.

Figure 21:
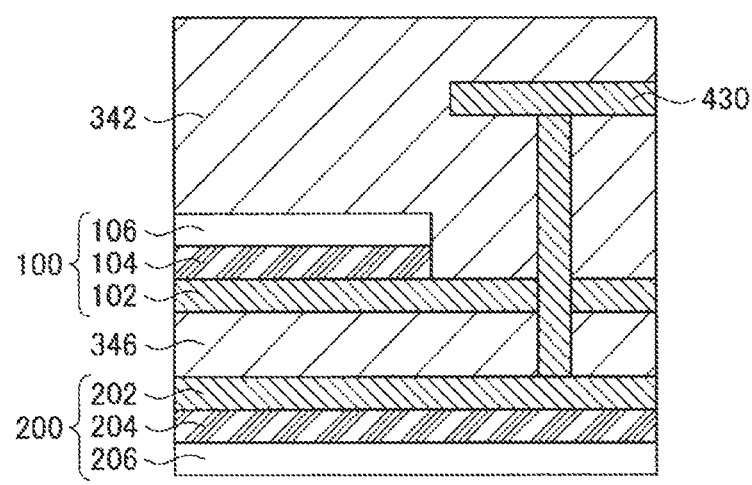
FIG. 21 is an explanatory diagram (No. 1) for explaining a wiring line 430 according to a seventh embodiment of the present disclosure.
Figure 22:
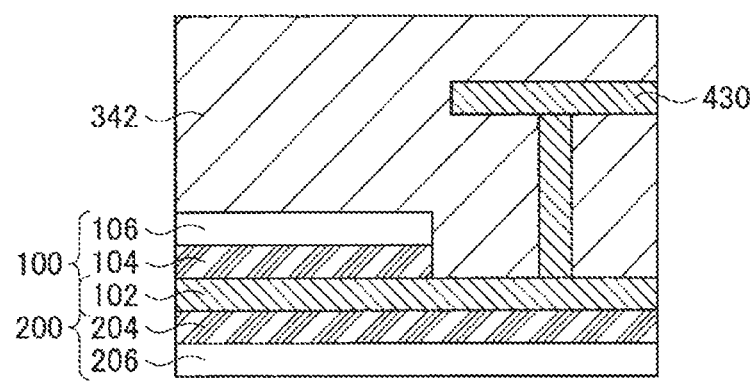
FIG. 22 is an explanatory diagram (No. 2) for explaining the wiring line 430 according to the seventh embodiment of the present disclosure.
Figure 23:
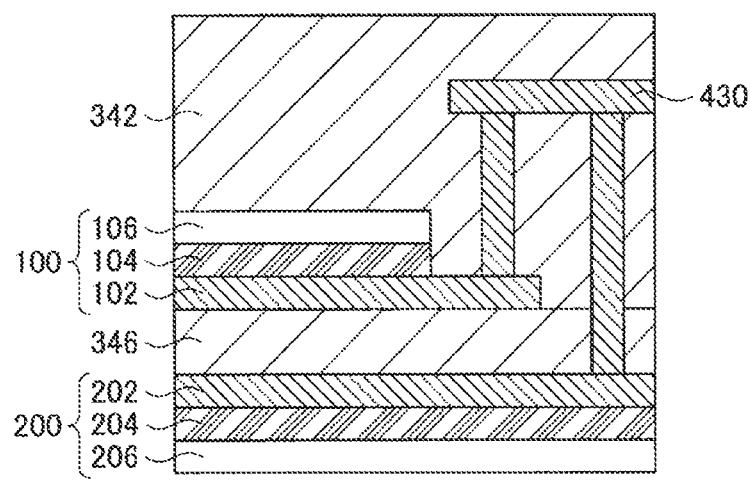
FIG. 23 is an explanatory diagram (No. 3) for explaining the wiring line 430 according to the seventh embodiment of the present disclosure.

As the seventh embodiment of the present disclosure, the routing of the wiring line 430 will be described with reference to FIGS. 21 to 23. FIGS. 21 to 23 are each an explanatory diagram for explaining the wiring line 430 according to the present embodiment.

For example, the solid-state image sensor 10 according to the present embodiment has the wiring line 430 electrically connected to the common electrode 202 of the PD 200. As illustrated in FIG. 21, in the end of the PD 100, a part of the photoelectric conversion film 104 and a part of the semiconductor layer 106 are removed, and the common electrode 102 extends along the plane direction of the stacked structure of the solid-state image sensor 10 (direction in which the vertical plane extends) as compared to the photoelectric conversion film 104 and the semiconductor layer 106. The semiconductor layer 106, the photoelectric conversion film 104, and the common electrode 102, which are stacked on one another, are formed in a stepwise shape. The wiring line 430 is provided so as to be electrically connected to the region of the common electrode 202 exposed from the semiconductor layer 106 and the photoelectric conversion film 104 when viewed from above the light incident surface. In this manner, according to the present embodiment, it is possible to avoid the wiring line 430 from penetrating the photoelectric conversion film 104 or the semiconductor layer 106 of the PD 100, and it is possible to avoid damaging the photoelectric conversion film 104 or the semiconductor layer 106 when forming the wiring line 430.

Further, when the present embodiment is applied to the solid-state image sensor 10b according to the third embodiment described above, the wiring line 430 can be provided as illustrated in FIG. 22. Specifically, the wiring line 430 is provided so as to be electrically connected to the region of the common electrode 102 exposed from the semiconductor layer 106 and the photoelectric conversion film 104 when viewed from above the light incident surface.

Further, when the solid-state image sensor 10 has the wiring line 430 electrically connected to the common electrode 102 of the PD 100 and the common electrode 202 of the PD 200, the wiring line 430 may be provided as illustrated in FIG. 23. Specifically, as illustrated in FIG. 23, in the end of the PD 100, a part of the photoelectric conversion film 104 and a part of the semiconductor layer 106 are removed, and the common electrode 102 extends along the plane direction of the stacked structure of the solid-state image sensor 10 as compared to the photoelectric conversion film 104 and the semiconductor layer 106. The semiconductor layer 106, the photoelectric conversion film 104, and the common electrode 102, which are stacked on one another, are formed in a stepwise shape. Similarly to the wiring line 430 illustrated in FIG. 21, the wiring line 430 in FIG. 23 is provided so as to be electrically connected to the region of the common electrode 202 exposed from the semiconductor layer 106 and the photoelectric conversion film 104 when viewed from above the light incident surface.

Further, as illustrated in FIG. 23, the common electrode 102 of the PD 100 is provided so as to be shorter than the common electrode 202 of the PD 200 in the plane direction of the stacked structure of the solid-state image sensor 10. Therefore, the wiring line 430 is provided so as to be electrically connected to the region of the common electrode 202 exposed from the common electrode 102 when viewed from above the light incident surface. In this manner, according to the present embodiment, it is possible to avoid the wiring line 430 from penetrating the common electrode 102 of the PD 100, and it is possible to avoid damaging the common electrode 102 when forming the wiring line 430.

In the present embodiment, a protective film (insulating film) for protecting the semiconductor layer 106, the photoelectric conversion film 104, and the like may be provided along the stepwise shaped end of the PD 100 or the like. Further, in the above description, it has been described such that the wiring line 430 is routed above the PD 100, but the present embodiment is not limited thereto, and the wiring line may be routed below the PD 100.

9. Eighth Embodiment

Here, there will be described the arrangement of the pixel transistor electrically connected to the PD 100 located above in the solid-state image sensor 10 according to each embodiment of the present disclosure. As described above, in order to improve the characteristics of the solid-state image sensor 10, it is preferable to make the distance between the PD 100 located above and the PD 300 located below shorter. Therefore, it is preferable that the pixel transistor, the wiring line, and the like electrically connected to the PD 100 are provided above the PD 100, not between the PD 100 and the PD 200. In the present embodiment described below, the solid-state image sensors 10c and 10d in which the pixel transistor or the like electrically connected to the PD100 is provided above the PD100 will be described.

<9.1 Stacked Structures of Solid-State Image Sensors 10c and 10d>

Figure 24:
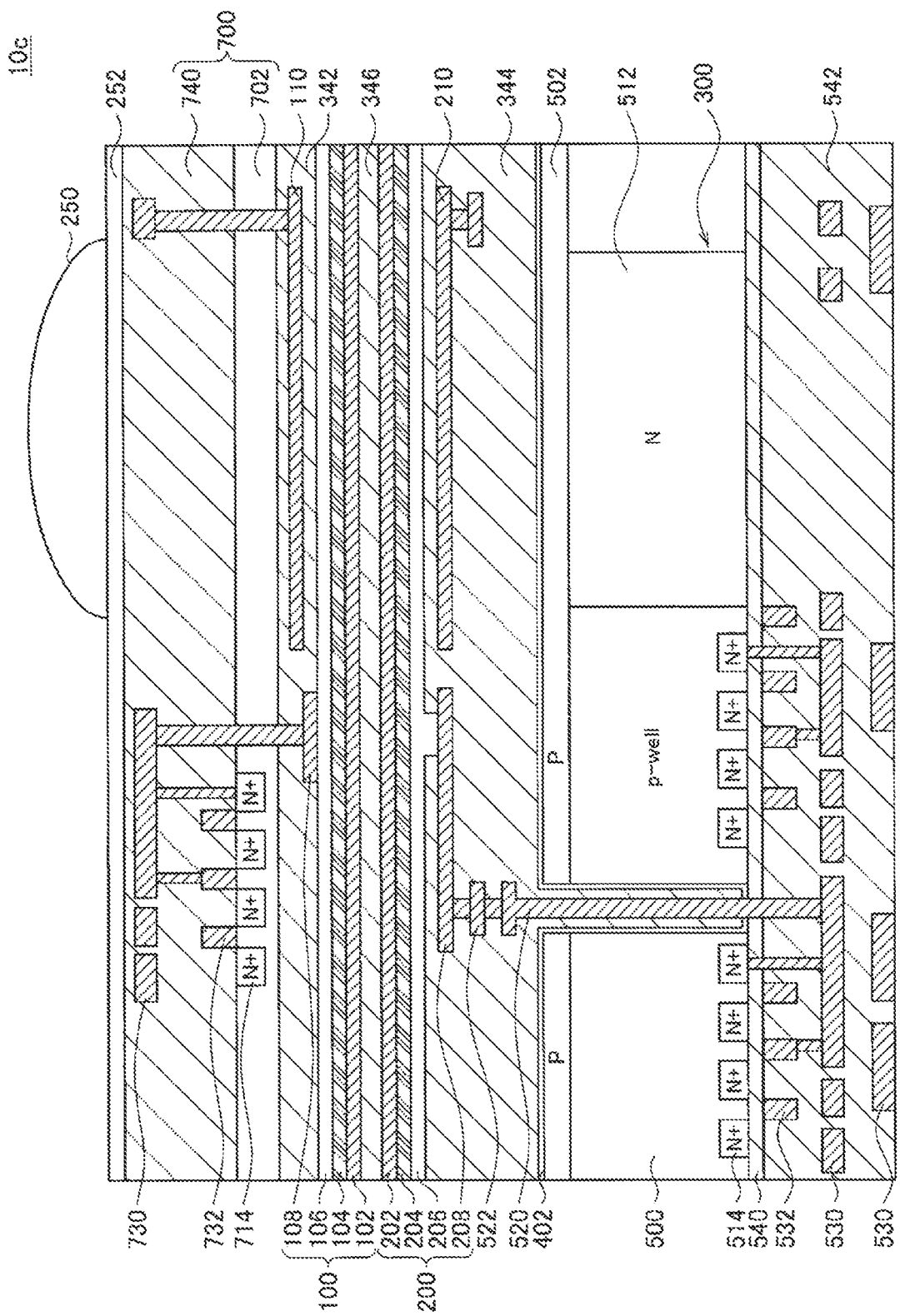
FIG. 24 is a sectional view of a solid-state image sensor 10c according to an eighth embodiment of the present disclosure.
Figure 25:
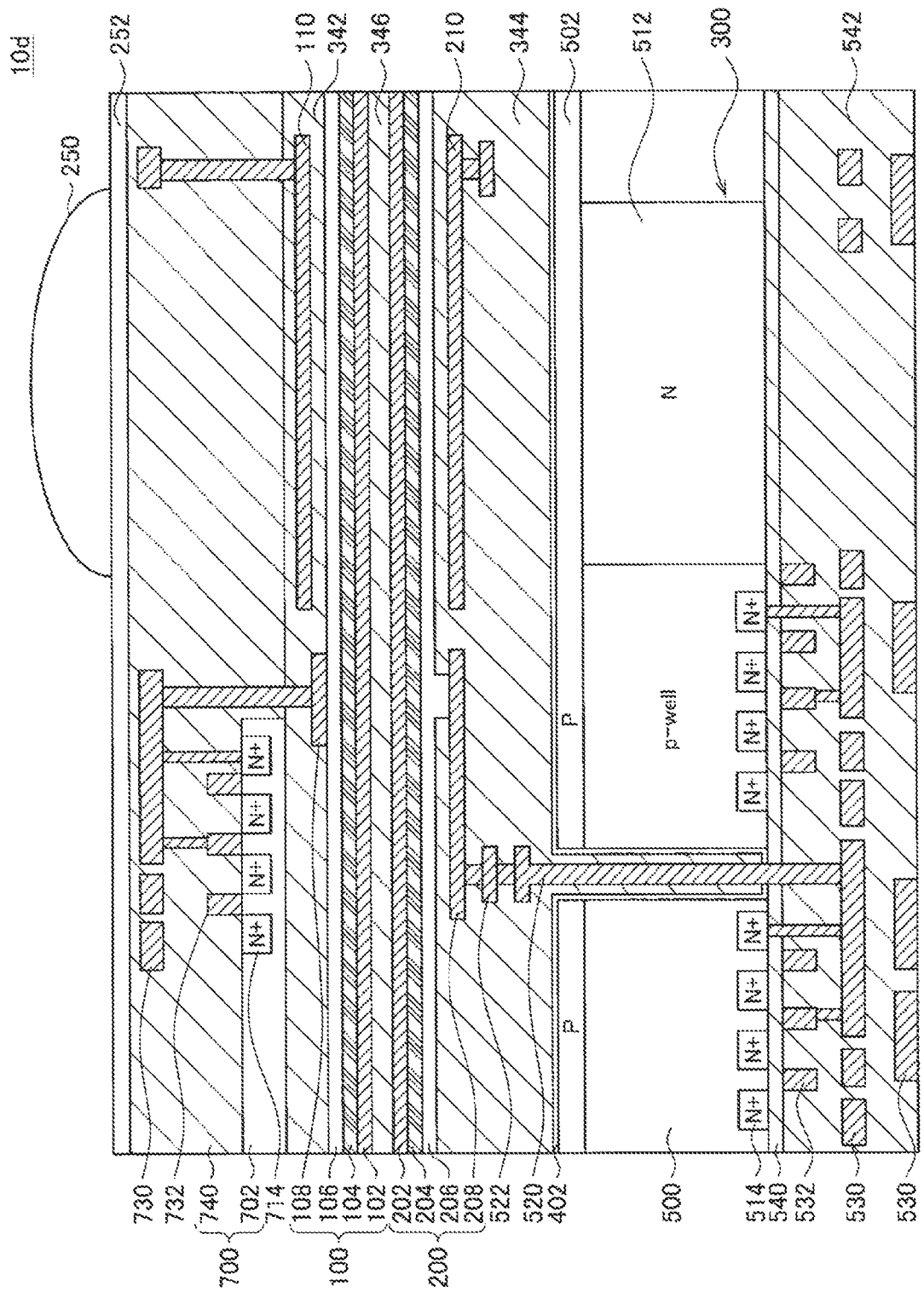
FIG. 25 is a sectional view of a solid-state image sensor 10d according to the eighth embodiment of the present disclosure.

First, stacked structures of the solid-state image sensors 10c and 10d according to the present embodiment will be described with reference to FIGS. 24 and 25. FIG. 24 is a sectional view of the solid-state image sensor 10c according to the present embodiment, and FIG. 25 is a sectional view of the solid-state image sensor 10d according to the present embodiment.

Specifically, as illustrated in the lower side of FIG. 24, the solid-state image sensor 10c includes the semiconductor substrate 500 including the PD 300, the PD 200 provided above the semiconductor substrate 500, and the PD 100 provided above the PD 200, similarly to the first embodiment described above. Further, in the solid-state image sensor 10c, as illustrated in the upper side of FIG. 24, a pixel transistor/wiring line layer (first controller) 700 including a pixel transistor and a wiring line electrically connected to the PD 100 are provided on the PD100.

More specifically, a light-transmitting semiconductor layer 702 including a semiconductor region 714 which serves as a channel region and a source/drain region of a pixel transistor electrically connected to the PD 100 is provided above the insulating film 342. The semiconductor layer 702 can function as a channel formation region or a source/drain region of a pixel transistor (e.g., the amplification transistor $T_{AMP1}$, the reset transistor $T_{RST1}$, the selection transistor $T_{SEL1}$) connected to the PD 100. That is, a channel formation region or the like of the pixel transistor connected to the PD100 is configured to include the semiconductor layer 702 capable of transmitting light, so that it is possible to cause light to reach the PD 100, the PD 200, and the PD 300 provided below the pixel transistors.

In the present embodiment, examples of the material for forming the semiconductor layer 702 include a semiconductor material capable of transmitting light. Specific examples of the semiconductor material include organic semiconductor materials such as silicon, amorphous silicon, germanium, GaAs, InP, GaN, ZnS, ZnSe, SiC, SiGe, transition metal dichalcogenide, diamond, graphene, carbon nanotube, condensed polycyclic hydrocarbon compounds, and condensed heterocyclic compounds. Further, examples of the semiconductor material include tin oxide-based materials such as $SnO_2$ (dopant added) and tin oxide to which a dopant such as zinc-tin oxide is added; and zinc oxide-based materials such as AZO, GZO, IZO, IGZO, and ITZO. Furthermore, examples of the semiconductor material include $InSbO_4$, $ZnMgO$, $CuInO_2$, $MgIn_2O_4$, CdO, GeO, and $TiO_2$.

Further, an insulating film 740 made of a material such as an $Al_xO_y$ film, a $SiO_x$ film, or a $HfO_x$ film, each of which can transmit light, is provided above the semiconductor layer 702. Further, a wiring line 730 electrically connected to the readout electrode 108 and the storage electrode 110 and a gate electrode 732 of a pixel transistor having the semiconductor layer 702 as a channel formation region are provided in the insulating film 740. The wiring line 730 and the electrode 732 are preferably formed of a transparent conductive film such as ITO. In the present embodiment, the wiring line 730 and the electrode 732 are formed of a transparent conductive film, so that it is possible to cause the light incident on the solid-state image sensor 10 to reach the PD 100, the PD 200, and the PD 300.

Note that, when the semiconductor layer 702 described above has characteristics of absorbing light, the semiconductor layer 702 blocks light entering the PDs 100, 200, and 300 of the solid-state image sensor 10. Therefore, the sensitivity characteristics of these PDs 100, 200, and 300 are degraded. In the solid-state image sensor 10d illustrated in FIG. 25, the portion of the semiconductor layer 702 of FIG. 24 that overlaps the storage electrode 110 of the PD 100 is removed. That is, in the solid-state image sensor 10d, the storage electrode 110 is provided so as to be exposed from the semiconductor layer 702 when viewed from above the light incident surface. In this manner, according to the solid-state image sensor 10d, it is possible to avoid the light incident on the PDs 100, 200, and 300 from being blocked by the semiconductor layer 702, so that it is possible to avoid the sensitivity characteristics of the PDs 100, 200, and 300 from being degraded.

<9.2 Layout Configurations of Solid-State Image Sensors 10c and 10d>

Figure 26:
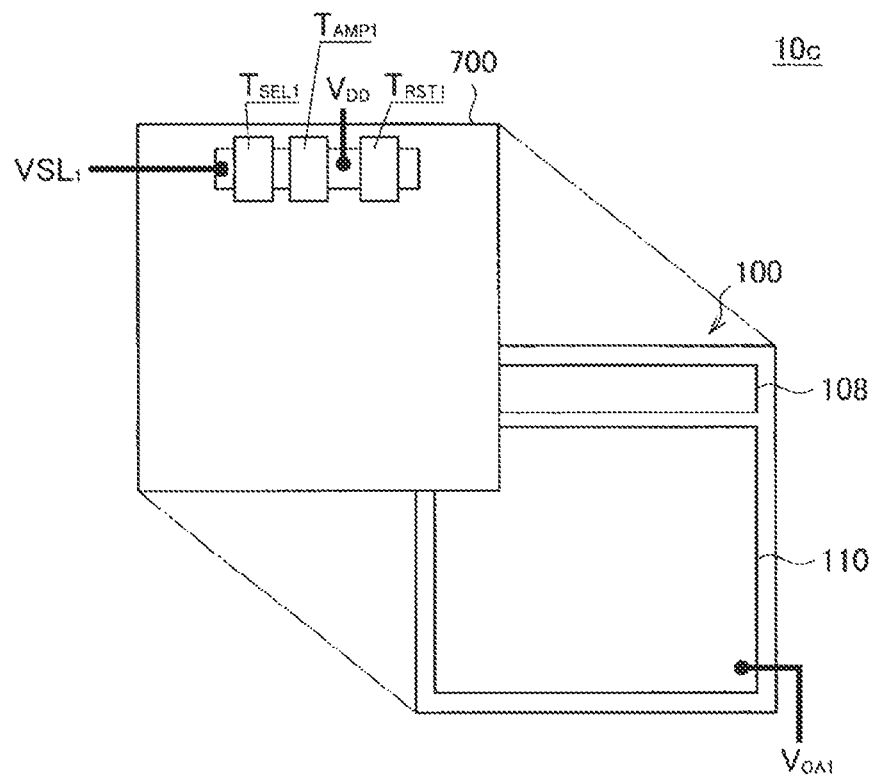
FIG. 26 is a layout diagram of the solid-state image sensor 10c according to the eighth embodiment of the present disclosure.
Figure 27:
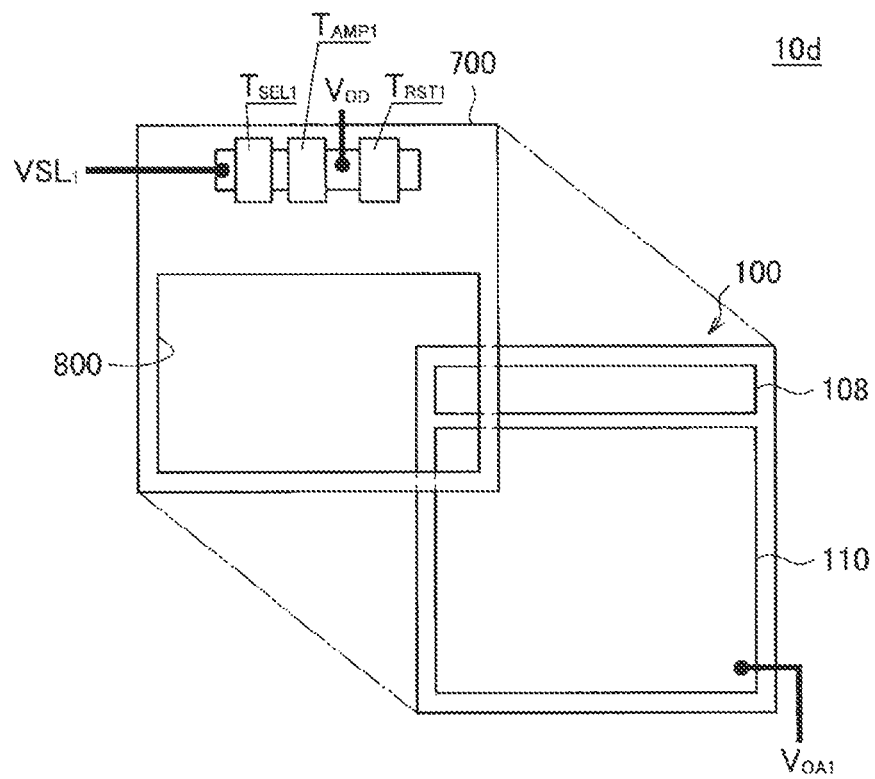
FIG. 27 is a layout diagram of the solid-state image sensor 10d according to the eighth embodiment of the present disclosure.

Next, the layout configuration of the solid-state image sensors 10c and 10d according to the present embodiment will be described with reference to FIGS. 26 and 27. FIG. 26 is a layout diagram of the solid-state image sensor 10c according to the present embodiment, and FIG. 27 is a layout diagram of the solid-state image sensor 10d according to the present embodiment.

Specifically, the layout of the pixel transistor/wiring line layer 700 located at the top of the stacked structure of the solid-state image sensor 10c is illustrated on the left side of FIG. 26, and the layout of the PD 100 located below the pixel transistor/wiring line layer 700 is illustrated on the right side of FIG. 26. Specifically, in the pixel transistor/wiring line layer 700, pixel transistors (the reset transistor $T_{RST1}$, the amplification transistor $T_{AMP1}$, and the selection transistor $T_{SEL1}$) electrically connected to the PD 100 and various wiring lines (the power supply circuit $V_{DD}$ and the signal line $VSL_1$) electrically connected to these pixel transistors are provided in the peripheral portion so as not to overlap with the storage electrode 110 located below.

Further, in the PD 100, similarly to the first embodiment, a rectangular storage electrode 110 is provided in the central portion, and a rectangular readout electrode 108 having an area smaller than the storage electrode 110 is provided so as to be adjacent to the storage electrode 110. According to the present embodiment, the pixel transistor or the like is provided so as not to overlap the storage electrode 110, as a result of which it is possible to avoid the light incident on the PDs 100, 200, and 300 from being blocked by the pixel transistor or the like, and thus it is possible to avoid the sensitivity characteristics of the PDs 100, 200, and 300 from being degraded.

Further, specifically, the layout of the pixel transistor/wiring line layer 700 located at the top of the stacked structure of the solid-state image sensor 10d is illustrated on the left side of FIG. 27, and the layout of the PD 100 located below the pixel transistor/wiring line layer 700 is illustrated on the right side of FIG. 27. Specifically, in the pixel transistor/wiring line layer 700, similarly to the solid-state image sensor 10c, pixel transistors electrically connected to the PD 100 and various wiring lines electrically connected to these pixel transistors are provided in the peripheral portion so as not to overlap with the storage electrode 110 located below. Further, in the solid-state image sensor 10d, an aperture 800 of the semiconductor layer 702 is provided in a region overlapping with the storage electrode 110. The aperture 800 can expose a part of the PD 100 when viewed from above the light incident surface. Specifically, in the present embodiment, the aperture 800 is provided at a position overlapping with the storage electrode 110. According to the present embodiment, such an aperture 800 is provided, so that it is possible to avoid the light incident on the PDs 100, 200, and 300 from being blocked by the semiconductor layer 702, so that it is possible to avoid the sensitivity characteristics of the PDs 100, 200, and 300 from being degraded.

10. Ninth Embodiment

Figure 28:
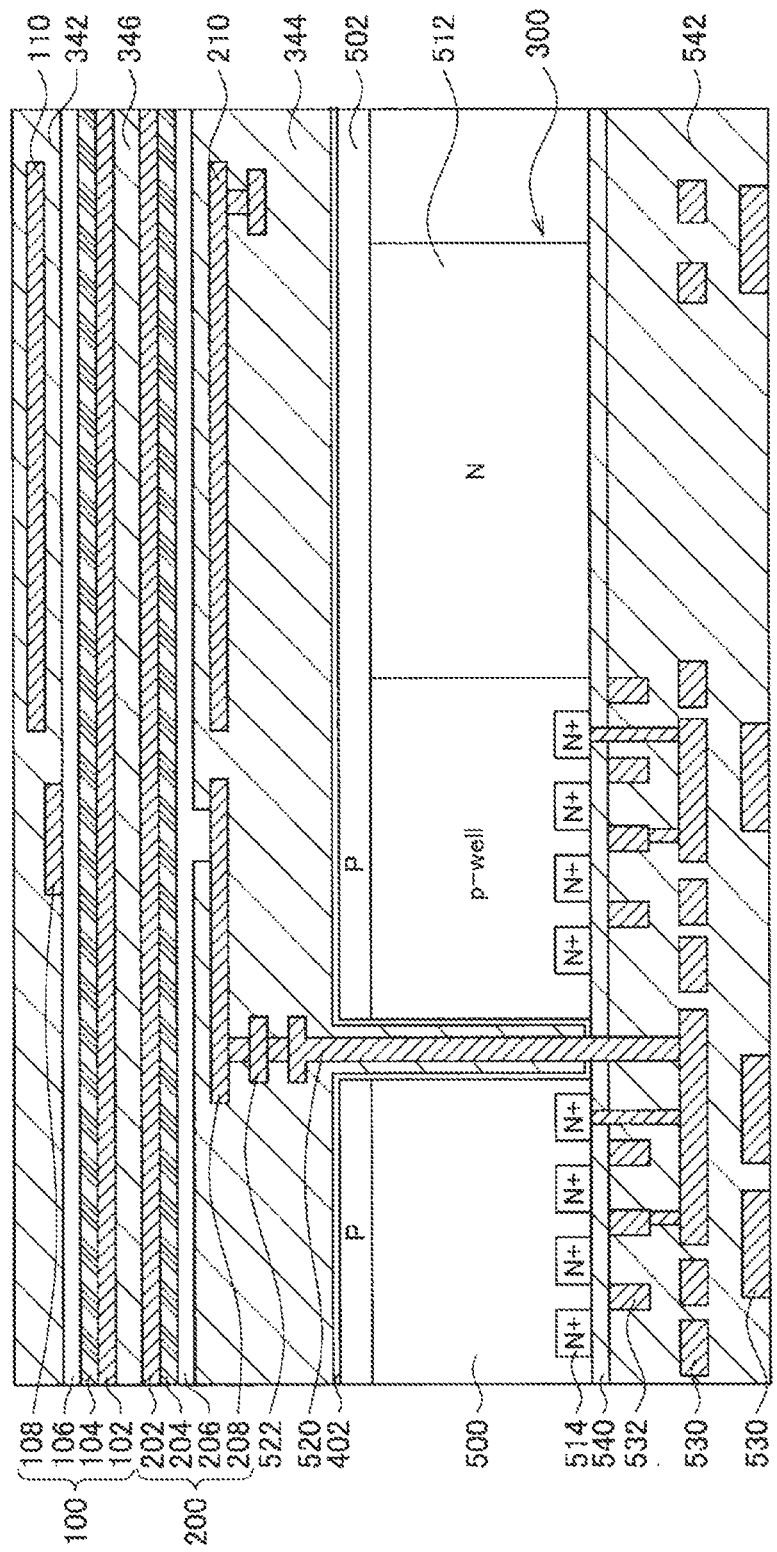
FIG. 28 is an explanatory diagram (No. 1) for explaining a method of manufacturing the solid-state image sensor 10c according to a ninth embodiment of the present disclosure.
Figure 29:
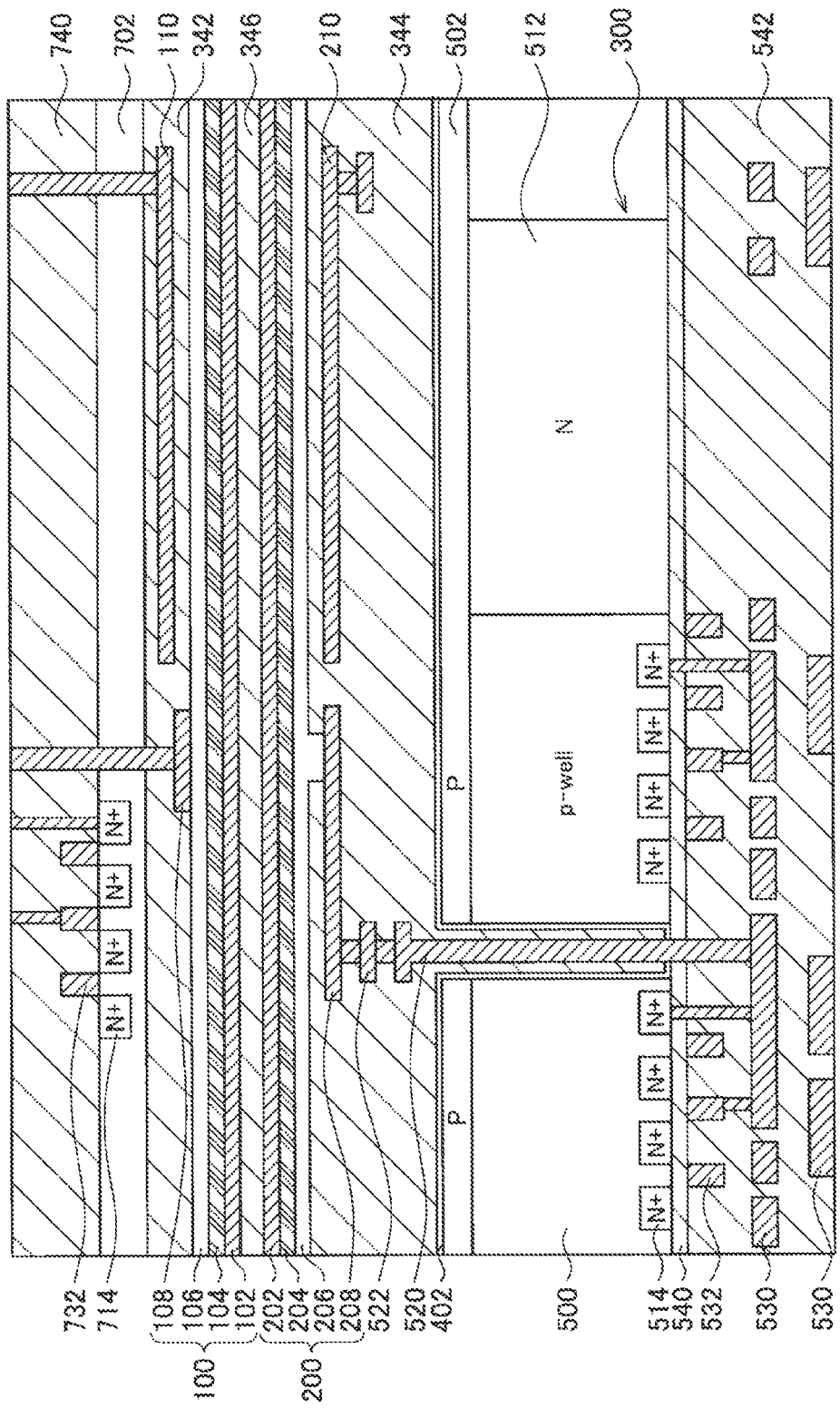
FIG. 29 is an explanatory diagram (No. 2) for explaining the method of manufacturing the solid-state image sensor 10c according to the ninth embodiment of the present disclosure.
Figure 30:
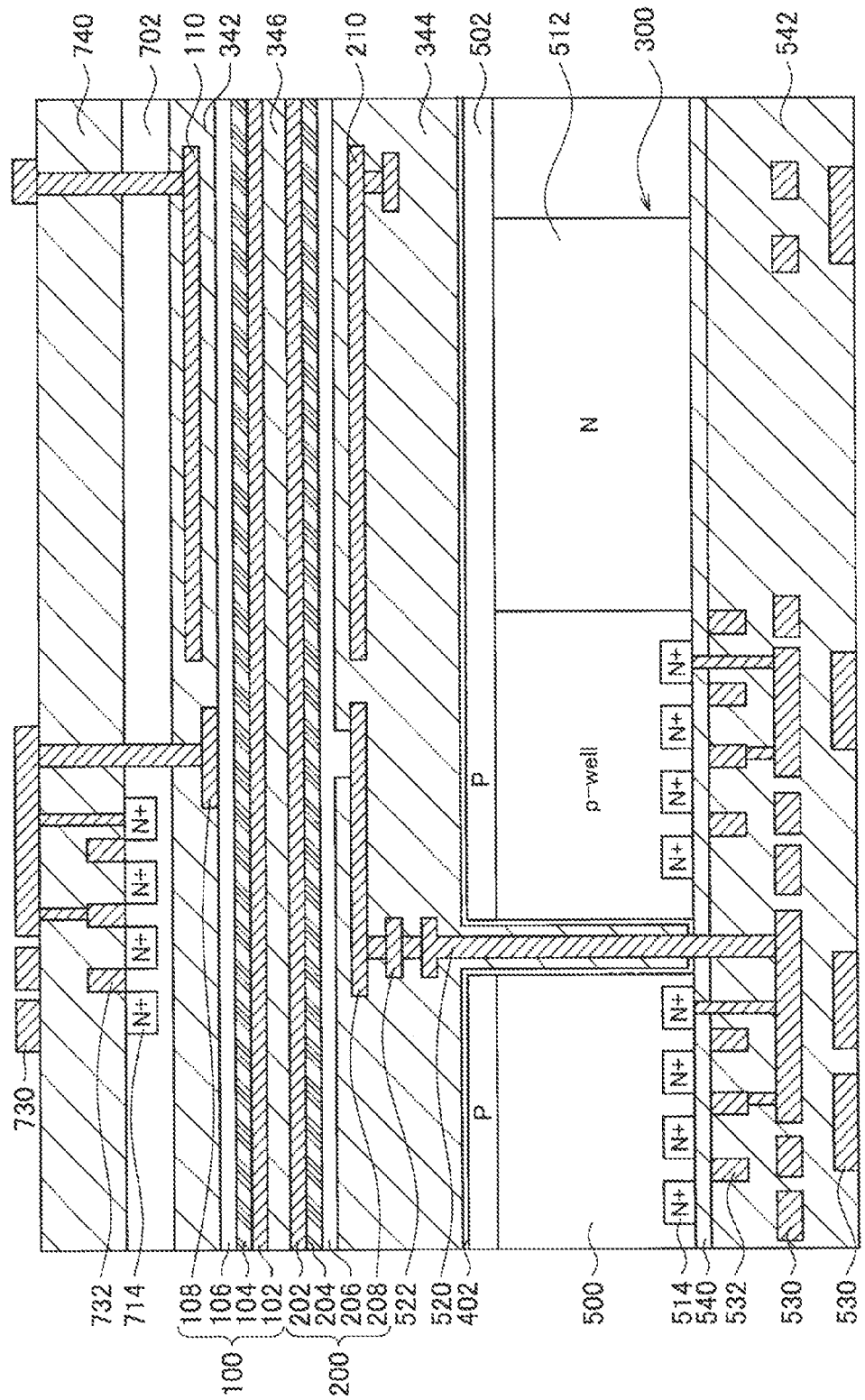
FIG. 30 is an explanatory diagram (No. 3) for explaining the method of manufacturing the solid-state image sensor 10c according to the ninth embodiment of the present disclosure.

Next, as a ninth embodiment of the present disclosure, a method of manufacturing the solid-state image sensor 10c according to the eighth embodiment as described above will be described with reference to FIGS. 28 to 30. FIGS. 28 to 30 are each an explanatory diagram for explaining the method of manufacturing the solid-state image sensor 10c according to the present embodiment.

Specifically, as illustrated in FIG. 28, the PD 200 provided above the semiconductor substrate 500 and the PD 100 provided above the PD 200 are formed on the semiconductor substrate 500 including the PD 300. The details of the formation of each layer are the same as in the fifth embodiment, and thus a description thereof will be omitted here.

Next, as illustrated in FIG. 29, the semiconductor layer 702 and the insulating film 740 are sequentially stacked on the PD 100, and then the wiring line 730 and the electrode 732 are formed in the insulating film 740.

Further, as illustrated in FIG. 30, the wiring line 730 is then formed on the insulating film 740. Furthermore, the insulating film 740, the high refractive index layer 252, the on-chip lens 250, and the like are stacked and formed, so that the solid-state image sensor 10c as illustrated in FIG. 24 can be obtained.

Note that, examples of the method of forming each layer as described above include a PVD method, a CVD method, and the like, similarly to the fifth embodiment described above. Further, examples of the method of patterning each layer include chemical etching, physical etching, and the like, similarly to the fifth embodiment described above. In addition, examples of the flattening technique include a CMP method, and the like.

11. Tenth Embodiment

By the way, since the photoelectric conversion films 104 and 204 are weak to heat as described above, when the pixel transistor/wiring line layer 700 is formed above the PD 100 as described above, the heat applied when forming the pixel transistor/wiring line layer 700 may damage the photoelectric conversion films 104 and 204. In the present embodiment, there is proposed a method in which the pixel transistor/wiring line layer 700 including a plurality of pixel transistors 710 (see FIG. 31) formed on another semiconductor substrate 760 (see FIG. 31) is bonded to the semiconductor substrate 500 in which the PD 100 or the like is stacked. Such a method is adopted, so that, in the present embodiment, the pixel transistors 710 included in the pixel transistor/wiring line layer 700 can be formed in advance in a step different from that of the semiconductor substrate 500. Accordingly, it is possible to use a high temperature process. As a result, according to the present embodiment, the quality of the pixel transistors 710 can be improved.

When the above-described bonding is adopted, it is required to bond the semiconductor substrate 500 to the semiconductor substrate 760 so that the pixel transistors 710 located above and the PD 100 located below have a predetermined positional relationship with each other. However, it may be difficult to accurately bonding the semiconductor substrate 500 to the semiconductor substrate 760 in a mass production process. That is, when the above-described bonding is adopted, bonding deviation may occur. In the present embodiment, a plurality of pixel transistors 710 is formed in a matrix in advance, and after bonding, the pixel transistors 710 other than the pixel transistors 710 having a predetermined positional relationship with the PD 100 are removed. In this manner, according to the present embodiment, it is possible to accurately form the pixel transistors 710 and the PD 100 so that the pixel transistors 710 located above and the PD 100 located below have a predetermined positional relationship with each other while avoiding damage to the photoelectric conversion films 104 and 204 due to heat (misalignment can be avoided).

Figure 31:
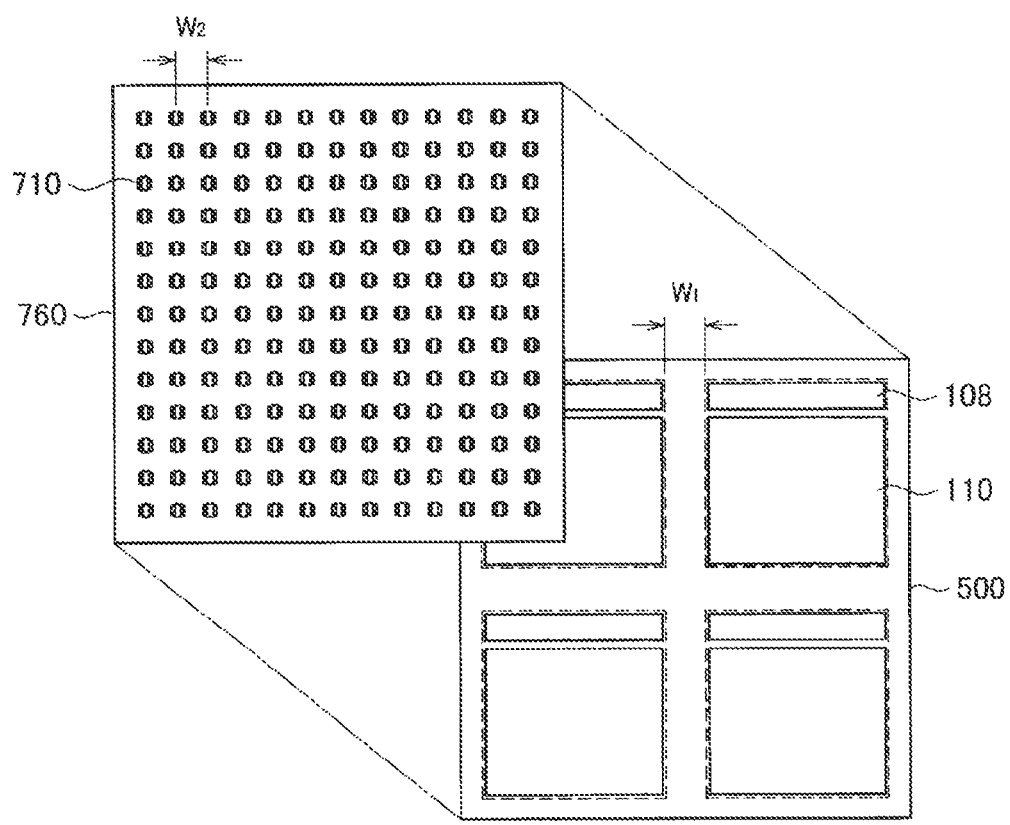
FIG. 31 is an explanatory diagram (No. 1) for explaining a concept of a method of manufacturing the solid-state image sensor 10d according to a tenth embodiment of the present disclosure.
Figure 32:
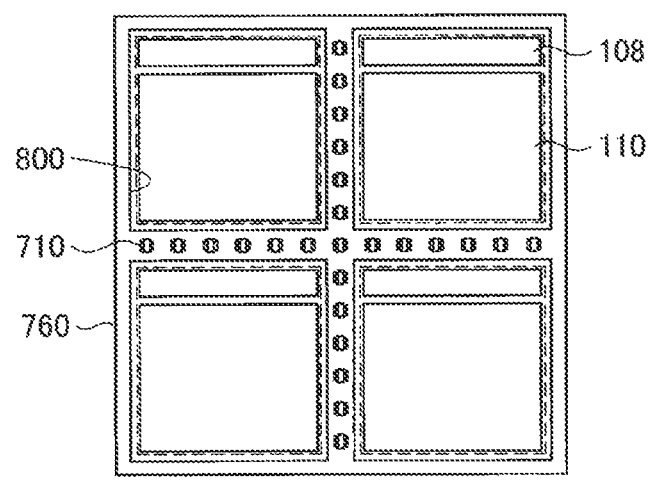
FIG. 32 is an explanatory diagram (No. 2) for explaining the concept of the method of manufacturing the solid-state image sensor 10d according to the tenth embodiment of the present disclosure.
Figure 33:
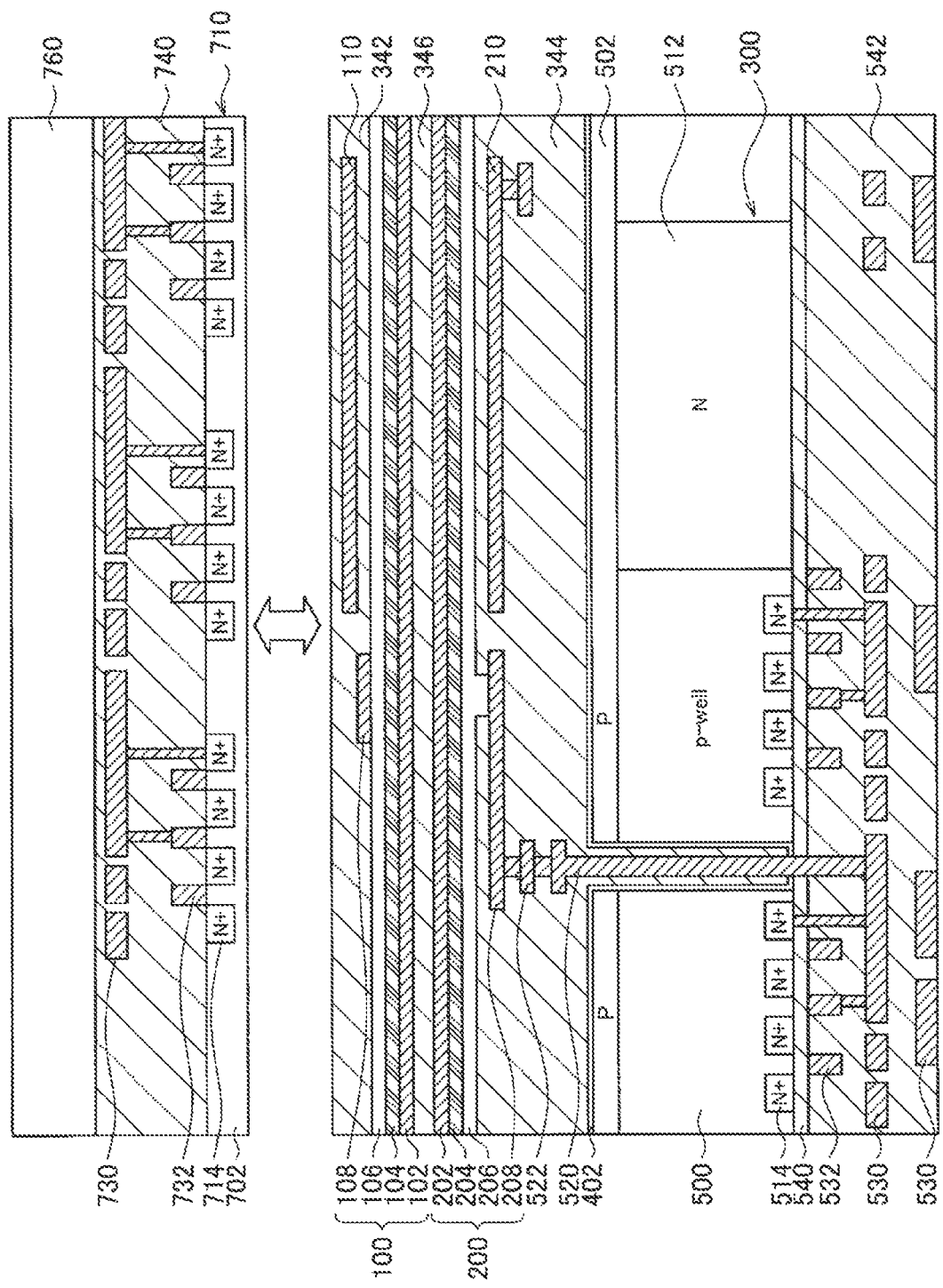
FIG. 33 is an explanatory diagram (No. 1) for explaining the method of manufacturing the solid-state image sensor 10d according to the tenth embodiment of the present disclosure.

The manufacturing method according to the tenth embodiment of the present disclosure will be described below with reference to FIGS. 31 to 37. FIGS. 31 and 32 are each an explanatory diagram for explaining the concept of the method of manufacturing the solid-state image sensor 10*d* according to the present embodiment. Further, FIGS. 33 and 37 are each an explanatory diagram for explaining the method of manufacturing the solid-state image sensor 10*d* according to the present embodiment.

First, the concept of the manufacturing method according to the present embodiment will be described with reference to FIGS. 31 and 32. As illustrated on the left side of FIG. 31, a plurality of pixel transistors 710 is formed in a matrix on a semiconductor substrate (fourth substrate) 760. In this instance, a plurality of pixel transistors 710 is formed so that an interval W$_2$ (second interval) between the pixel transistors 710 on the plane of the semiconductor substrate 760 is narrower than an interval between the solid-state image sensors 10*d* provided on the plane of the semiconductor substrate 500 illustrated on the right side of FIG. 31, i.e., an interval W$_1$ (first interval) between the storage electrodes 110. More preferably, the plurality of pixel transistors 710 is formed so that the interval W$_2$ is half the interval W$_1$.

Further, as illustrated in FIG. 32, the substrate 760 is bonded to the semiconductor substrate 500 (third substrate) in which the PDs 100, 200, and 300 are stacked, and the aperture 800 is formed in the substrate 760 so as to remove the pixel transistor 710 in a portion overlapping with the PD 100, i.e., a region overlapping with the readout electrode 108 and the storage electrode 110.

In this manner, according to the present embodiment, it is possible to accurately form the pixel transistors 710 and the PD 100 so that the pixel transistors 710 located above and the PD 100 located below have a predetermined positional relationship with each other while avoiding damage to the photoelectric conversion films 104 and 204 due to heat. In addition, in the present embodiment, since the storage electrode 110 is provided so as to be exposed from the substrate 760 when viewed from above the light incident surface, it is possible to avoid the light incident on the PDs 100, 200, and 300 from being blocked by the pixel transistors 710. As a result, according to the present embodiment, it is possible to avoid the sensitivity characteristics of the PDs 100, 200, and 300 from being degraded.

Subsequently, the manufacturing method according to the present embodiment will be described with reference to FIGS. 33 to 37.

Figure 34:
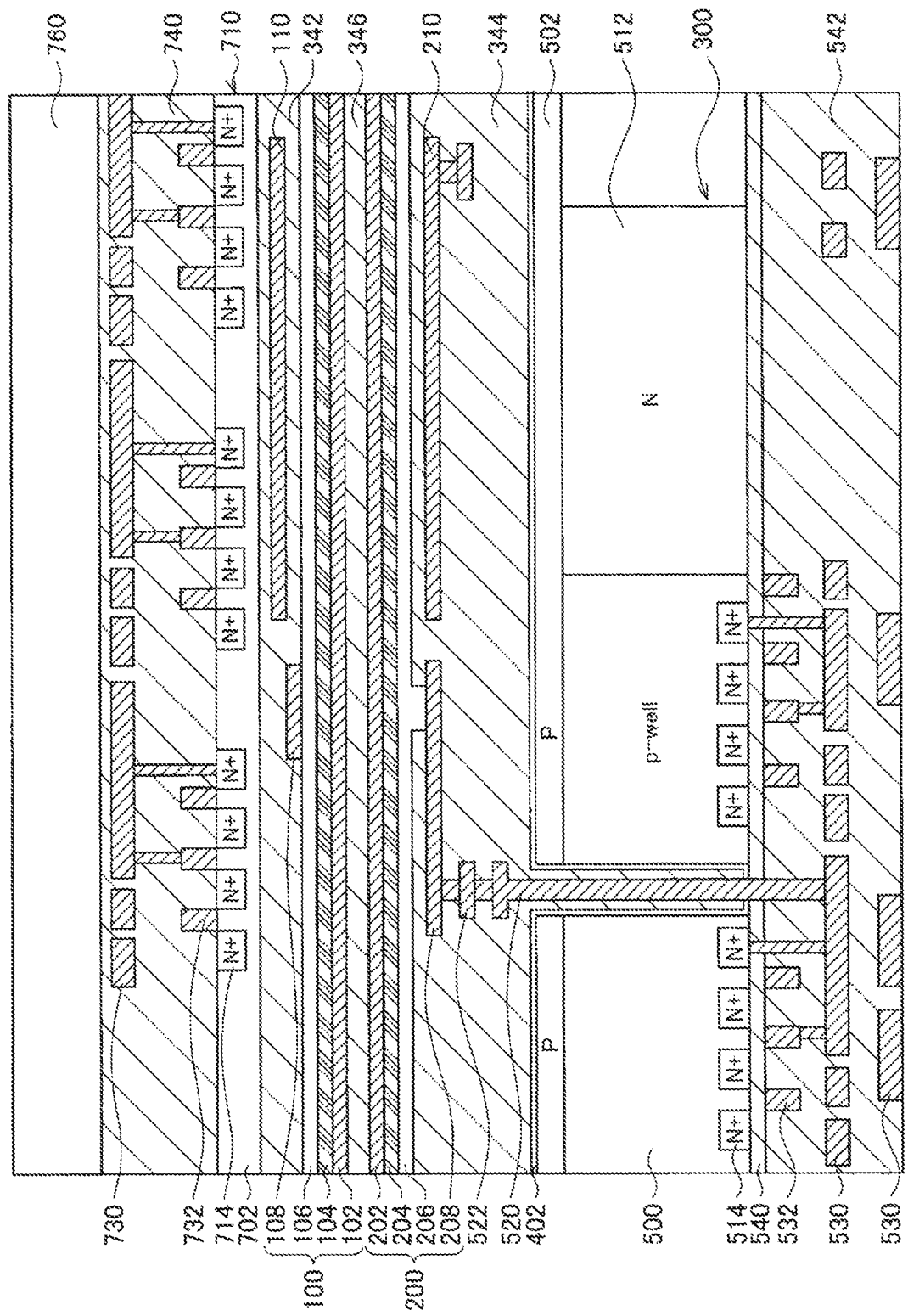
FIG. 34 is an explanatory diagram (No. 2) for explaining the method of manufacturing the solid-state image sensor 10d according to the tenth embodiment of the present disclosure.
Figure 35:
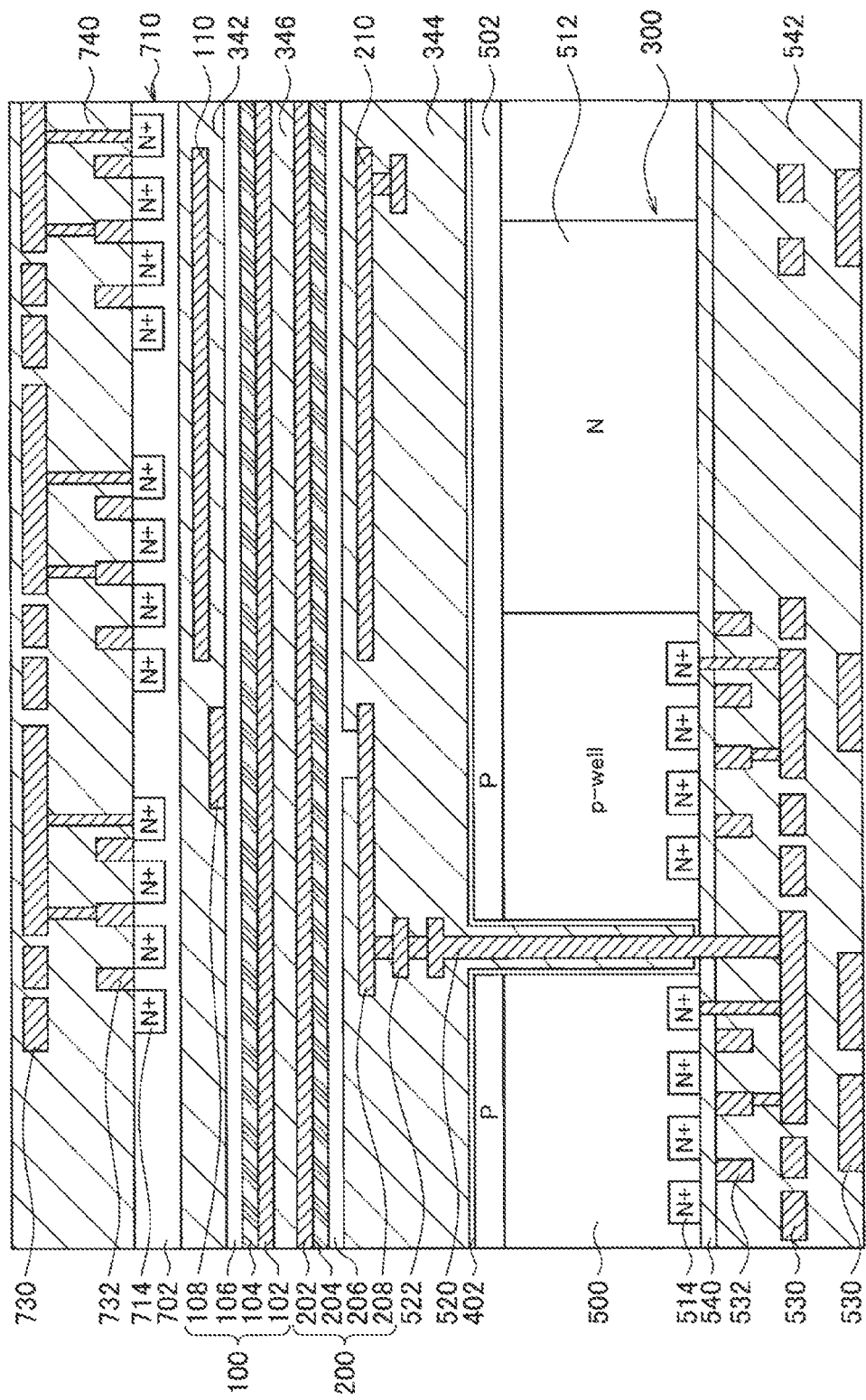
FIG. 35 is an explanatory diagram (No. 3) for explaining the method of manufacturing the solid-state image sensor 10d according to the tenth embodiment of the present disclosure.

As illustrated in FIG. 33, a plurality of pixel transistors 710 is formed in a matrix on the substrate 760. Then, as illustrated in FIG. 34, the semiconductor substrate 760 is bonded to the semiconductor substrate 500 in which the PDs 100, 200 and 300 are stacked. Further, as illustrated in FIG. 35, the semiconductor substrate 760 is removed.

Figure 36:
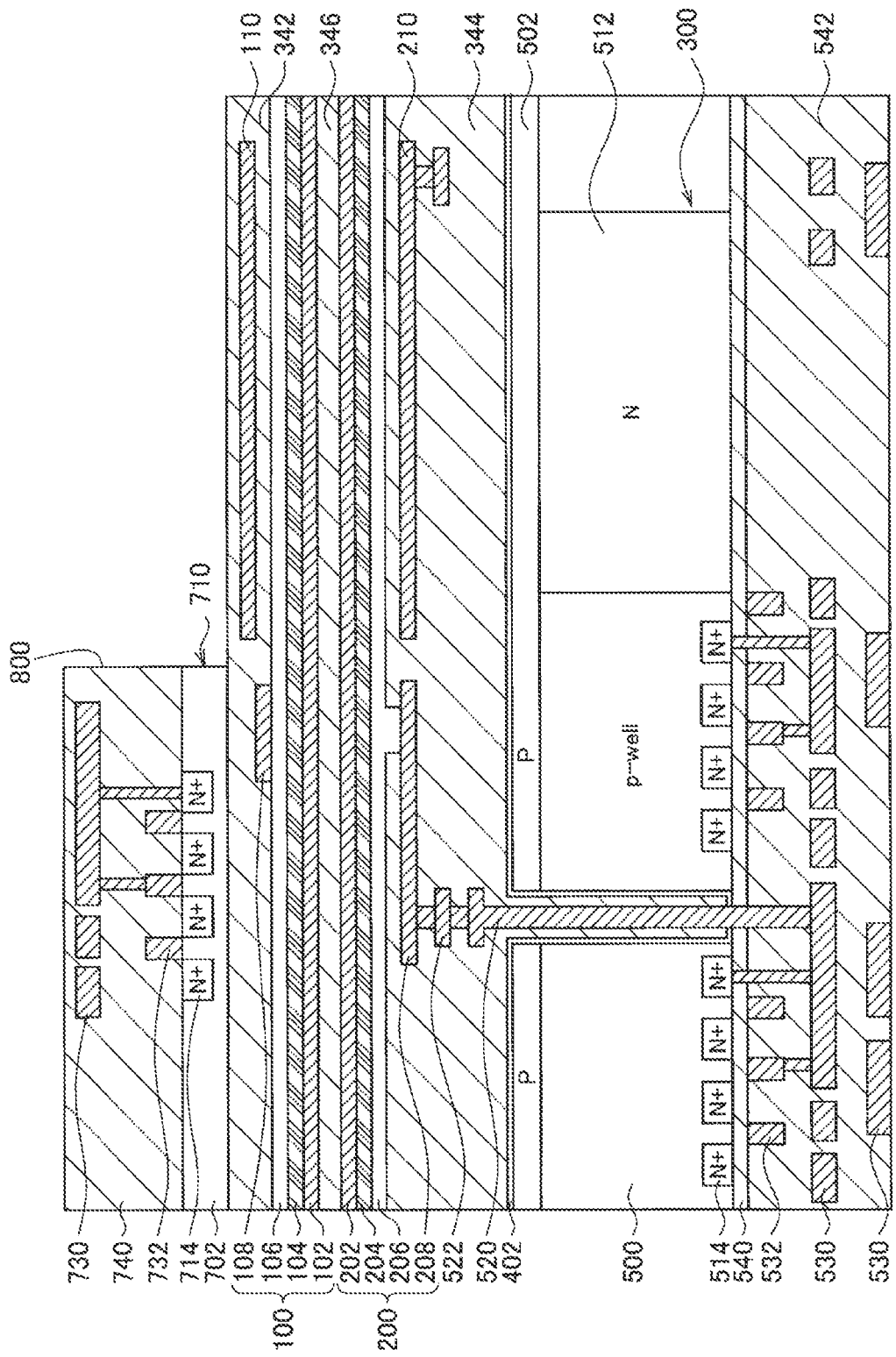
FIG. 36 is an explanatory diagram (No. 4) for explaining the method of manufacturing the solid-state image sensor 10d according to the tenth embodiment of the present disclosure.
Figure 37:
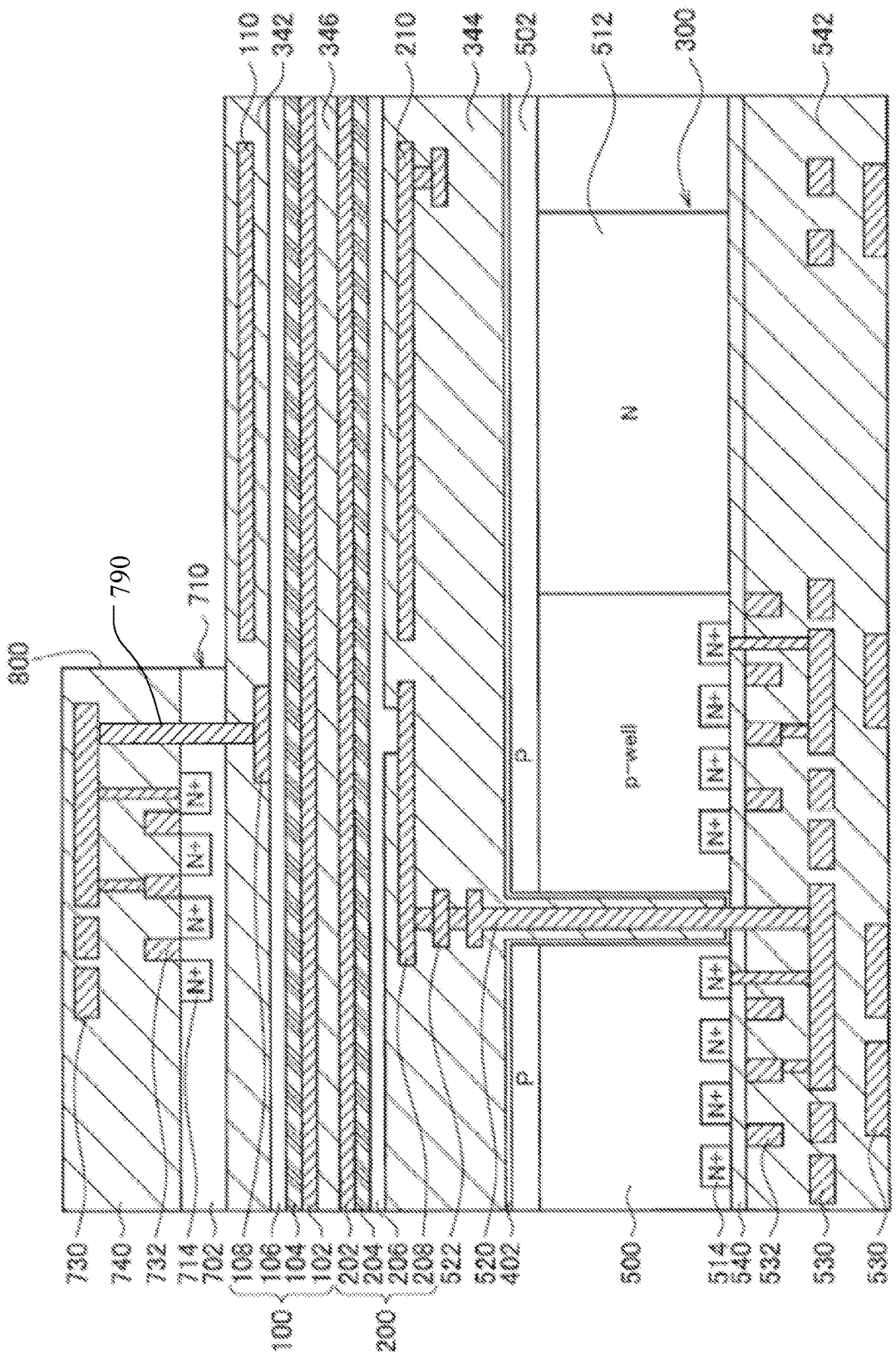
FIG. 37 is an explanatory diagram (No. 5) for explaining the method of manufacturing the solid-state image sensor 10d according to the tenth embodiment of the present disclosure.

Next, as illustrated in FIG. 36, the aperture 800 overlapping with the storage electrode 110 is formed in a desired region by dry etching or the like, whereby the plurality of pixel transistors 710 formed in the region is removed.

Then, a wiring line 790 or the like for electrically connecting the remaining pixel transistors 710 to the PD 100 is formed and the insulating film 740 is stacked, so that a stacked structure as illustrated in FIG. 37 can be obtained. Then, although not illustrated, the high refractive index layer 252, the on-chip lens 250, and the like are stacked, so that the solid-state image sensor 10*d* as illustrated in FIG. 25 can be obtained.

Note that, the present embodiment is not limited to the above-described bonding of the semiconductor substrate 760 in which the plurality of pixel transistors 710 is formed to the semiconductor substrate 500 in which the PDs 100, 200, and 300 are stacked. In the present embodiment, for example, a substrate (not illustrated) in which the plurality of pixel transistors 710 and the PD 100 are stacked may be bonded to a substrate (not illustrated) in which the PDs 200 and 300 are stacked. In this case, in the step of forming the substrate in which the plurality of pixel transistors 710 and the PD 100 are stacked, the PD 100 is formed on the semiconductor layer 702 including the channel region of the pixel transistor 710. Alternatively, in the forming step, the channel region of the pixel transistor 710 may be formed in the semiconductor layer 106 included in the PD 100, which is not particularly limited.

Further, the manufacturing method according to the present embodiment may be combined with the manufacturing method according to the sixth embodiment described above. In this case, for example, a substrate (not illustrated) on which the plurality of pixel transistors 710, a substrate (not illustrated) on which the PD 100 is formed, and a substrate (not illustrated) on which the PDs 200 and 300 are stacked may be bonded to one another.

Note that, in the above description, it has been described such that the semiconductor substrate 760 is used, but the present embodiment is not limited thereto. The bonding may be performed while adsorbing and fixing a thin film in which respective layers are stacked using a Bernoulli chuck.

12. Eleventh Embodiment

Figure 38:
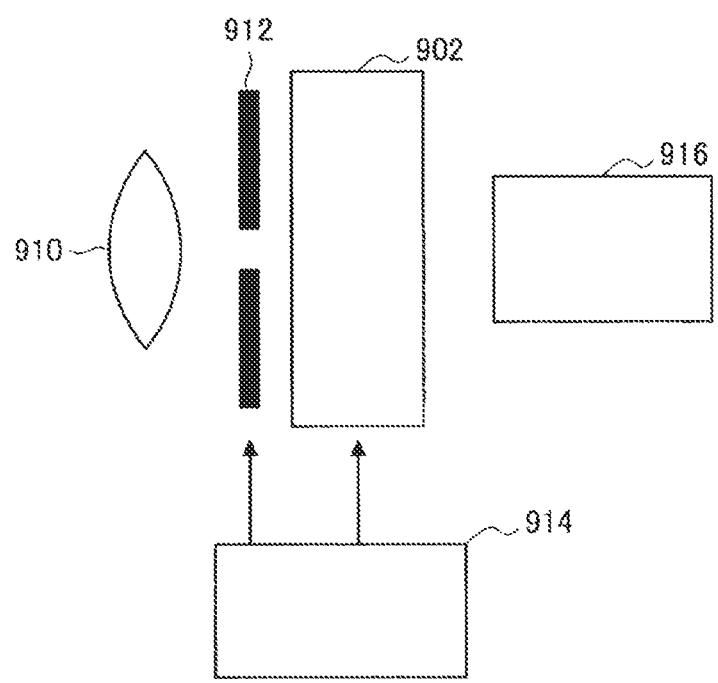
FIG. 38 is an explanatory diagram for explaining an example of an electronic apparatus 900 according to an eleventh embodiment of the present disclosure.

The solid-state imaging device 1 according to the above-described embodiment of the present disclosure is generally applicable to electronic apparatuses using an imaging device as an image capturing part, such as an imaging device including a digital still camera and a video camera, a mobile terminal device having an imaging function, a copying machine using a solid-state image sensor for an image reading part. Furthermore, the embodiment of the present disclosure is applicable to a robot, a drone, an automobile, a medical device (endoscope), or the like including the above-described solid-state imaging device 1. Note that the solid-state imaging device 1 according to the present embodiment may be formed as a single chip, and can be implemented in the form of a module having an imaging function in which an imaging unit and a signal processing unit or an optical system are packaged together. Hereinafter, an example of an electronic apparatus 900 equipped with an imaging device 902 including the above-described solid-state imaging device 1 will be described as an eleventh embodiment of the present disclosure with reference to FIG. 38. FIG. 38 is an explanatory diagram illustrating an example of the electronic apparatus 900 according to the present embodiment.

As illustrated in FIG. 38, the electronic apparatus 900 includes an imaging device 902, an optical lens 910, a shutter mechanism 912, a drive circuit unit 914, and a signal processing circuit unit 916. The optical lens 910 focuses image light (incident light) from the subject onto an imaging surface of the imaging device 902. This allows signal charges to be stored in the solid-state image sensor 10 of the imaging device 902 for a certain period. The shutter mechanism 912 performs opening/closing operation to control the light emission period and the light shielding period to the imaging device 902. The drive circuit unit 914 supplies drive signals for controlling signal transfer operation of the imaging device 902, shutter operation of the shutter mechanism 912, or the like. That is, the imaging device 902 performs signal transfer on the basis of the drive signal (timing signal) supplied from the drive circuit unit 914. The signal processing circuit unit 916 performs various types of signal processing. For example, the signal processing circuit unit 916 outputs a video signal subjected to signal processing to a storage medium (not illustrated) such as a memory device, or outputs the signal to a display unit (not illustrated).

13. Conclusion

As described above, according to the embodiment of the present disclosure, it is possible to provide a solid-state image sensor, a solid-state imaging device, an electronic apparatus, and a method of manufacturing a solid-state image sensor, in which characteristics can be improved.

While the embodiment of the present disclosure described above is an exemplary case of the solid-state image sensor 10 in which the first conductivity type is the P-type, the second conductivity type is the N-type, and electrons are used as the signal charges, the embodiment of the present disclosure is not limited to such an example. For example, the present embodiment is applicable to the solid-state image sensor 10 in which the first conductivity type is N-type, the second conductivity type is P-type, and holes are used as signal charges.

In the embodiment of the present disclosure described above, various types of semiconductor substrates need not be a silicon substrate, and may be another substrate (for example, a silicon on insulator (SOI) substrate or a SiGe substrate). Furthermore, the semiconductor substrate may include a semiconductor structure or the like formed on such various substrates.

Furthermore, the solid-state image sensor 10 according to the embodiment of the present disclosure is not limited to the solid-state image sensor that detects the distribution of the incident light amount of visible light and forms an image. For example, the present embodiment is applicable to a solid-state image sensor that forms an image from an incident amount distribution such as infrared rays, X-rays, or particles, or other type of solid-state image sensor (physical quantity distribution detection apparatus) that detects distribution of other physical quantity such as pressure and capacitance and forms an image, such as a fingerprint detection sensor.

Further, in the above-described embodiment of the present disclosure and the referenced drawings, various kinds of insulating films and the like may be simplified for easy understanding. However, in reality, these insulating films may be stacked films made of a plurality of different insulating materials or may be stacked films formed by a plurality of different steps.

14. Application Example to Mobile Body

A technique according to the present disclosure (present technique) can be applied to various products. For example, the technique according to the present disclosure may be applied to a device mounted on any kind of mobile body, such as an automobile, an electric vehicle, a hybrid electric vehicle, a motorcycle, a bicycle, a personal mobility, an airplane, a drone, a ship, a robot, or the like.

Figure 41:
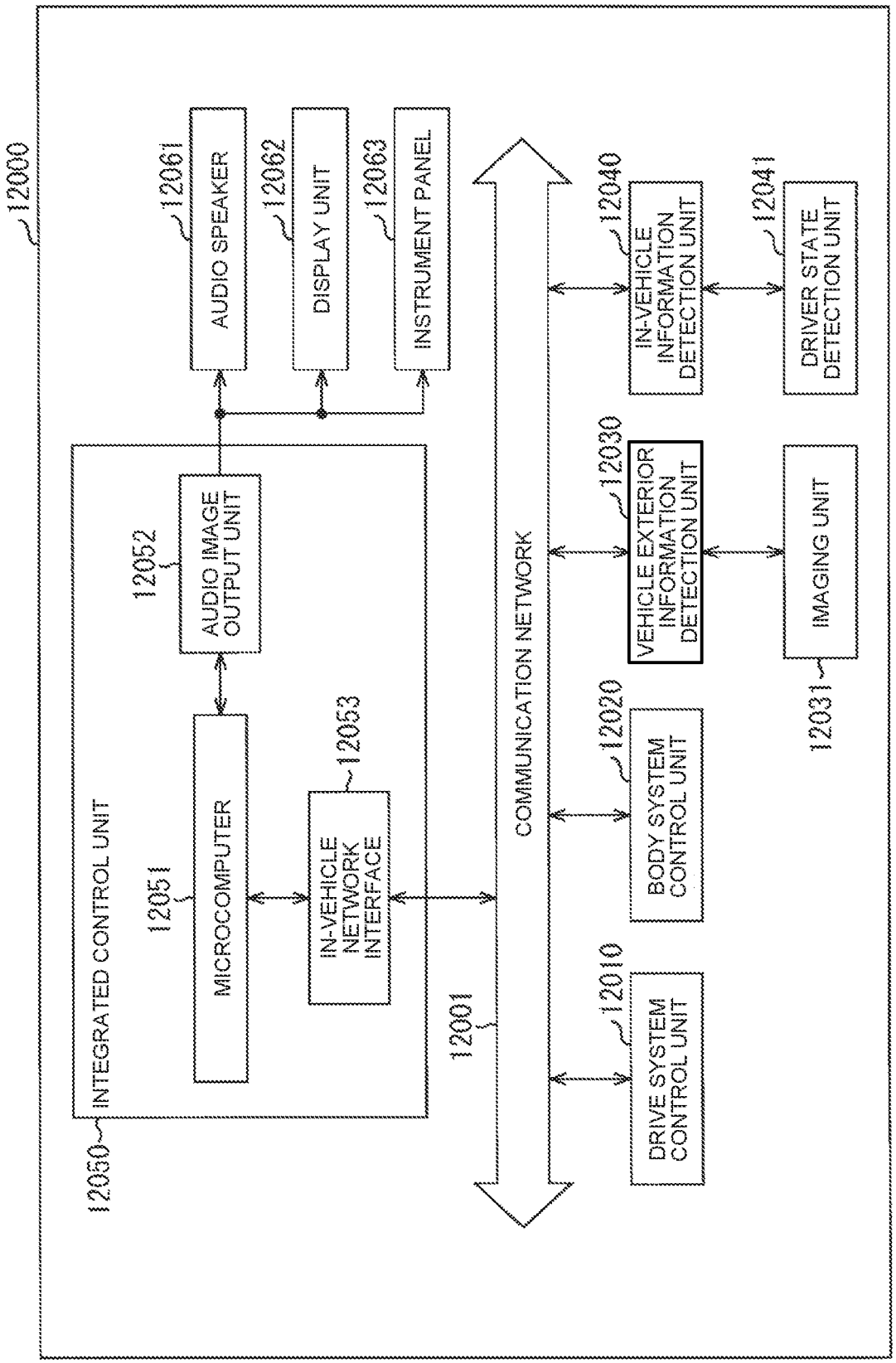
FIG. 41 is a block diagram illustrating an example of a schematic configuration of a vehicle control system.

FIG. 41 is a block diagram illustrating a schematic configuration example of a vehicle control system that is an example of a mobile control system to which the technique according to the present disclosure can be applied.

A vehicle control system 12000 includes a plurality of electronic control units connected via a communication network 12001. In the example illustrated in FIG. 41, the vehicle control system 12000 includes a drive system control unit 12010, a body system control unit 12020, a vehicle exterior information detection unit 12030, an in-vehicle information detection unit 12040, and an integrated control unit 12050. In addition, as a functional configuration of the integrated control unit 12050, a microcomputer 12051, an audio image output unit 12052, and an in-vehicle network interface (I/F) 12053 are illustrated.

The drive system control unit 12010 controls the operation of the devices related to the drive system of the vehicle according to various programs. For example, the drive system control unit 12010 functions as a driving force generation device for generating a driving force of a vehicle such as an internal combustion engine or a driving motor, a driving force transmission mechanism for transmitting the driving force to wheels, and a steering mechanism for regulating the steering angle of the vehicle, and a control device such as a braking device for generating a braking force of the vehicle.

The body system control unit 12020 controls the operation of various devices mounted on the vehicle body according to various programs. For example, the body system control unit 12020 functions as a keyless entry system, a smart key system, a power window device, or a control device for various lamps such as headlamps, rear lamps, brake lamps, blinkers, or fog lamps. In this case, the body system control unit 12020 can receive radio waves transmitted from a portable device that substitutes for a key, or signals from various switches. The body system control unit 12020 receives input of these radio waves or signals, and controls a door lock device, a power window device, lamps, and the like of the vehicle.

The vehicle exterior information detection unit 12030 detects information outside the vehicle on which the vehicle control system 12000 is mounted. For example, an imaging unit 12031 is connected to the vehicle exterior information detection unit 12030. The vehicle exterior information detection unit 12030 causes the imaging unit 12031 to capture an image outside the vehicle and receives the captured image. The vehicle exterior information detection unit 12030 may perform object detection processing of a person, a car, an obstacle, a sign, or characters on a road surface, or distance detection processing, in accordance with the received image.

The imaging unit 12031 is an optical sensor that receives light and outputs an electrical signal corresponding to the amount of received light. The imaging unit 12031 can output an electrical signal as an image or as distance measurement information. In addition, the light received by the imaging unit 12031 may be visible light or invisible light such as infrared rays.

The in-vehicle information detection unit 12040 detects vehicle interior information. For example, a driver state detection unit 12041 that detects the state of the driver is connected to the in-vehicle information detection unit 12040. The driver state detection unit 12041 includes, for example, a camera that images the driver, and the in-vehicle information detection unit 12040 may calculate, in accordance with the detected information input from the driver state detection unit 12041, the degree of tiredness or concentration of the driver or determine whether the driver is asleep.

The microcomputer 12051 is able to calculate a control target value of the driving force generation device, the steering mechanism, or the braking device, on the basis of the information inside and outside the vehicle acquired by the vehicle exterior information detection unit 12030 or the in-vehicle information detection unit 12040, to output a control command to the drive system control unit 12010. For example, the microcomputer 12051 can perform cooperative control for the purpose of implementing advanced driver assistance system (ADAS) functions including vehicle collision avoidance or impact mitigation, tracking based on inter-vehicle distance, vehicle speed maintenance, vehicle collision warning, or vehicle lane departure warning.

In addition, the microcomputer 12051 can also perform cooperative control for the purpose of automatic driving to travel the vehicle autonomously without relying on the operation control of the driver by controlling the driving force generation device, the steering mechanism, the braking device, and so on in accordance with the information around the vehicle acquired by the vehicle exterior information detection unit 12030 or the in-vehicle information detection unit 12040.

The microcomputer 12051 can output a control command to the body system control unit 12020 on the basis of the information outside the vehicle acquired by the vehicle exterior information detection unit 12030. For example, the microcomputer 12051 controls the headlamps according to the position of the preceding vehicle or oncoming vehicle detected by the vehicle exterior information detection unit 12030, and performs cooperative control for the purpose of anti-glare, such as switching a high beam to a low beam.

The audio image output unit 12052 transmits an output signal of at least one of audio and image to an output device capable of visually or audibly notifying information to a vehicle occupant or the outside of the vehicle. In the example of FIG. 41, an audio speaker 12061, a display unit 12062, and an instrument panel 12063 are illustrated as output devices. The display unit 12062 may include at least one of an on-board display and a head-up display, for example.

Figure 42:
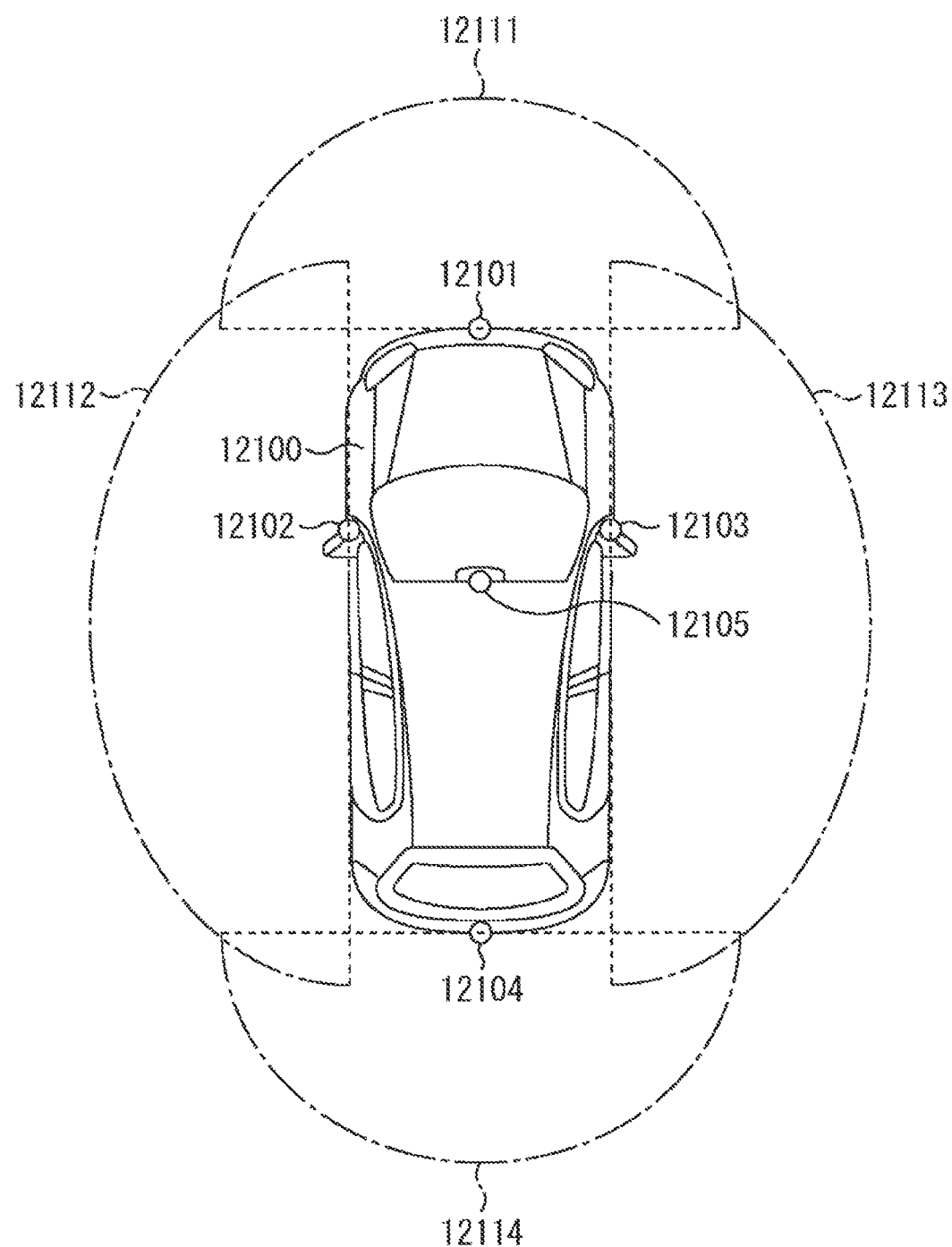
FIG. 42 is an explanatory diagram illustrating an example of installation positions of a vehicle exterior information detection unit and an imaging unit.

FIG. 42 is a diagram illustrating an example of an installation position of the imaging unit 12031.

In FIG. 42, a vehicle 12100 includes imaging units 12101, 12102, 12103, 12104, and 12105 as the imaging unit 12031.

The imaging units 12101, 12102, 12103, 12104, and 12105 are provided, for example, at positions including a front nose, a side mirror, a rear bumper, a rear door, and an upper portion of a windshield in the vehicle interior of the vehicle 12100. The imaging unit 12101 provided at the front nose and the imaging unit 12105 provided at the upper part of the windshield in the vehicle interior mainly acquire an image in front of the vehicle 12100. The imaging units 12102 and 12103 provided at the side mirrors mainly acquire images of the side of the vehicle 12100. The imaging unit 12104 provided at the rear bumper or the rear door mainly acquires an image behind the vehicle 12100. The front images acquired by the imaging units 12101 and 12105 are mainly used for detecting a preceding vehicle or a pedestrian, an obstacle, a traffic light, a traffic sign, a lane, or the like.

Note that FIG. 42 illustrates an example of the imaging range of the imaging units 12101 to 12104. An imaging range 12111 indicates the imaging range of the imaging unit 12101 provided at the front nose, imaging ranges 12112 and 12113 indicate the imaging ranges of the imaging units 12102 and 12103 provided at the side mirrors, and an imaging range 12114 indicates the imaging range of the imaging unit 12104 provided at the rear bumper or the rear door. For example, by superimposing the image data captured by the imaging units 12101 to 12104, an overhead image when the vehicle 12100 is viewed from above is obtained.

At least one of the imaging units 12101 to 12104 may have a function of acquiring distance information. For example, at least one of the imaging units 12101 to 12104 may be a stereo camera including a plurality of image sensors, or may be an image sensor having pixels for phase difference detection.

For example, the microcomputer 12051 uses the distance information obtained from the imaging units 12101 to 12104 to determine the distance to a three-dimensional object in the imaging ranges 12111 to 12114 and the temporal change of the distance (relative speed with respect to the vehicle 12100), whereby it is possible to extract, particularly as a preceding vehicle, the closest three-dimensional object on the traveling path of the vehicle 12100 and the three-dimensional object that travels at a predetermined speed (e.g., 0 km/h or more) in the same direction as the vehicle 12100. Further, the microcomputer 12051 can set an inter-vehicle distance to be secured in advance before the preceding vehicle, and can perform automatic brake control (including follow-up stop control), automatic acceleration control (including follow-up start control), and the like. Thus, it is possible to perform the cooperative control for the purpose of automatic driving or the like to travel autonomously without relying on the operation of the driver.

For example, the microcomputer 12051 can classify three-dimensional object data related to the three-dimensional object, on the basis of the distance information obtained from the imaging units 12101 to 12104, extracts the three-dimensional objects such as two-wheeled vehicles, ordinary vehicles, large vehicles, pedestrians, power poles, or the like, and uses the extracted data for automatic avoidance of obstacles. For example, the microcomputer 12051 distinguishes obstacles around the vehicle 12100 between obstacles visible to the driver of the vehicle 12100 and obstacles difficult to recognize visually. The microcomputer 12051 determines the collision risk indicating the risk of collision with each obstacle and, if the collision risk is equal to or exceeds a setting value and indicates the possibility of collision, the microcomputer 12051 can assist driving to avoid collision by outputting an alarm to the driver via the audio speaker 12061 or the display unit 12062, or executing forced deceleration or avoidance steering via the drive system control unit 12010.

At least one of the imaging units 12101 to 12104 may be an infrared camera that detects infrared rays. For example, the microcomputer 12051 can recognize a pedestrian by determining whether a pedestrian is present in the captured images of the imaging units 12101 to 12104. Such pedestrian recognition is carried out, for example, by determining whether a person is a pedestrian by performing a pattern matching process on a sequence of feature points indicating a contour of the object and a procedure for extracting feature points in the captured images of the imaging units 12101 to 12104 as infrared cameras. When the microcomputer 12051 determines that a pedestrian exists in the captured images of the imaging units 12101 to 12104 and recognizes the pedestrian, the audio image output unit 12052 controls the display unit 12062 to display a rectangular contour line for emphasizing the recognized pedestrian. Further, the audio image output unit 12052 may control the display unit 12062 so as to display an icon or the like indicating a pedestrian at a desired position.

Heretofore, an example of a vehicle control system to which the technique according to the present disclosure can be applied has been described. The technique according to the present disclosure is applicable to the imaging unit 12031 and the like among the configurations described above. Specifically, the technique can be applied to the imaging units 12101 to 12105 as the imaging unit 12031.

15. Application Example to Endoscopic Surgery System

A technique according to the present disclosure (present technique) can be applied to various products. For example, the technique according to the present disclosure may be applied to an endoscopic surgery system.

Figure 43:
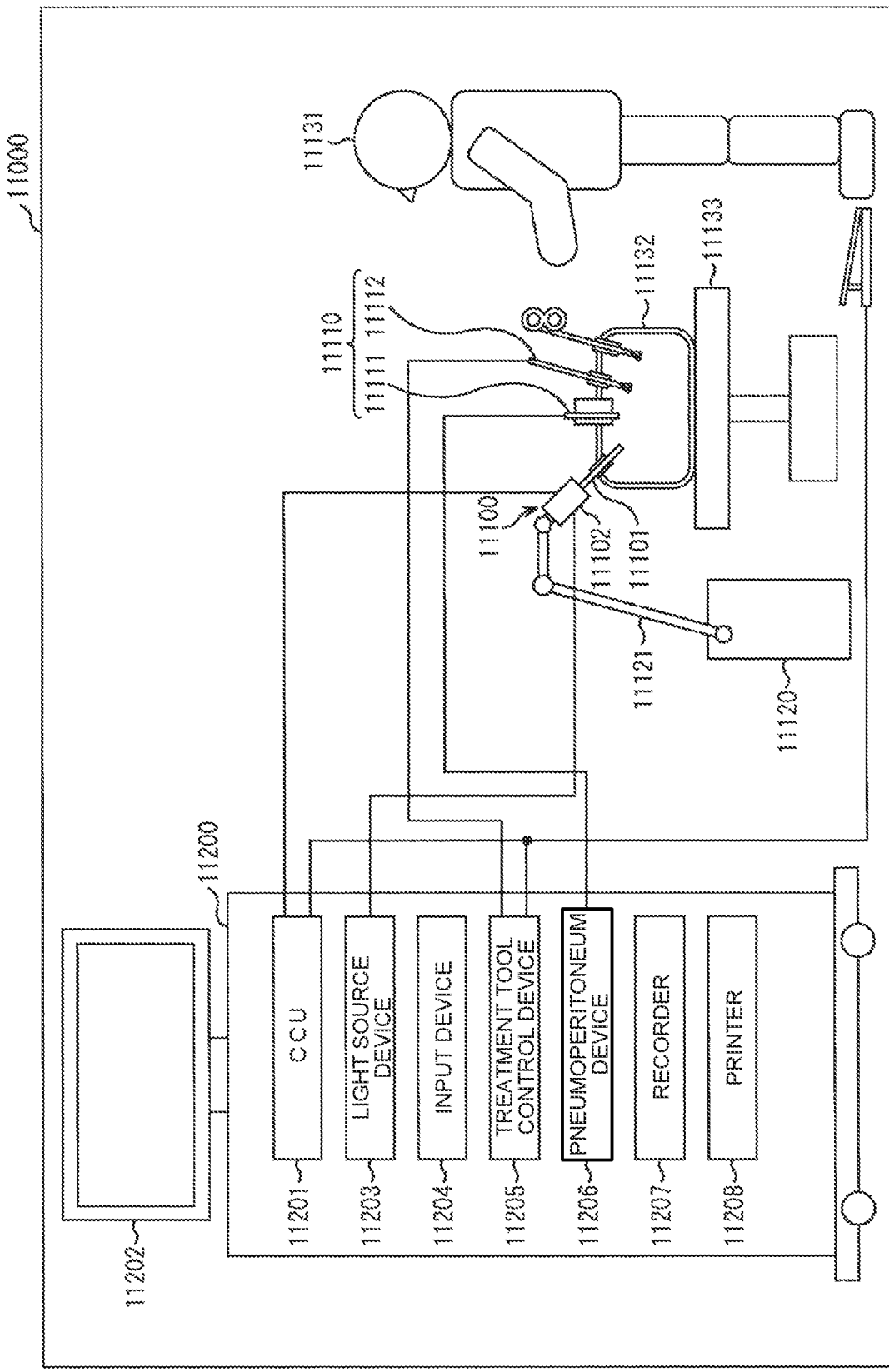
FIG. 43 is a diagram illustrating an example of a schematic configuration of an endoscopic surgery system.

FIG. 43 is a diagram illustrating an example of a schematic configuration of an endoscopic surgery system to which the technique according to the present disclosure (present technique) can be applied.

FIG. 43 illustrates a situation where an operator (doctor) 11131 performs an operation on a patient 11132 on a patient bed 11133 using an endoscopic surgery system 11000. As illustrated in the figure, the endoscopic surgery system 11000 includes an endoscope 11100, other surgical tools 11110, such as a pneumoperitoneum tube 11111 or an energy treatment tool 11112, a support arm device 11120 for supporting the endoscope 11100, and a cart 11200 equipped with various devices for endoscopic surgery.

The endoscope 11100 includes a lens barrel 11101 having a region of a predetermined length from a distal end inserted into the body cavity of the patient 11132, and a camera head 11102 connected to a proximal end of the lens barrel 11101. In the illustrated example, the endoscope 11100 configured as a so-called rigid endoscope having a hard lens barrel 11101 is illustrated. However, the endoscope 11100 may be configured as a so-called flexible endoscope having a soft lens barrel.

An aperture into which an objective lens is fit is provided at the distal end of the lens barrel 11101. A light source device 11203 is connected to the endoscope 11100, and light generated by the light source device 11203 is guided to the distal end of the lens barrel by a light guide extending inside the lens barrel 11101, and is directed toward an observation target in the body cavity of the patient 11132 through the objective lens. Note that the endoscope 11100 may correspond to a direct-view endoscope, a perspective-view endoscope, or a side-view endoscope.

An optical system and an image sensor are provided inside the camera head 11102, and the reflected light (observation light) from the observation target is focused on the image sensor by the optical system. The observation light is photoelectrically converted by the image sensor, and an electric signal corresponding to the observation light, that is, an image signal corresponding to the observation image is generated. The image signal is transmitted to a camera control unit (CCU) 11201 as RAW data.

The CCU 11201 includes a central processing unit (CPU), a graphics processing unit (GPU), etc., and controls operations of the endoscope 11100 and a display device 11202 in an integrated manner. Specifically, the CCU 11201 receives an image signal from the camera head 11102 and performs various types of image processing for displaying an image based on the image signal, such as development processing (demosaic processing), on the image signal.

The display device 11202 displays an image based on the image signal subjected to image processing by the CCU 11201 under the control of the CCU 11201.

The light source device 11203 includes, for example, a light source such as a light emitting diode (LED), and supplies the endoscope 11100 with irradiation light when imaging the surgical site.

An input device 11204 is an input interface to the endoscopic surgery system 11000. The user can input various types of information and input instructions to the endoscopic surgery system 11000 via the input device 11204. For example, the user inputs an instruction or the like to change the imaging conditions (type of irradiation light, magnification, focal length, and the like) adopted by the endoscope 11100.

A treatment tool control device 11205 controls driving of the energy treatment tool 11112 for cauterization and incision of tissue, sealing of a blood vessel, etc. A pneumoperitoneum device 11206 sends gas into the body cavity via the pneumoperitoneum tube 11111 to inflate the body cavity of the patient 11132 in order to ensure a visual field by the endoscope 11100 and ensure a working space of the operator. A recorder 11207 is a device that can record various types of information related to surgery. A printer 11208 is a device capable of printing various types of information related to surgery in various formats such as text, an image, a graph, etc.

The light source device 11203 that supplies the endoscope 11100 with irradiation light when imaging a surgical site can include a white light source including an LED, a laser light source, or a combination thereof, for example. When a white light source is configured by a combination of RGB laser light sources, the output intensity and output timing of each color (each wavelength) can be controlled with high accuracy, and thus the light source device 11203 can adjust white balance of a captured image. In addition, in this case, the observation target is irradiated with the laser light from each of the RGB laser light sources in a time-division manner, and driving of the image sensor of the camera head 11102 is controlled in synchronization with the irradiation timing. In this way, it is possible to capture an image corresponding to each of RGB in a time-division manner. According to this method, a color image can be obtained without providing a color filter in the image sensor.

In addition, driving of the light source device 11203 may be controlled to change the intensity of light to be output at predetermined time intervals. By controlling driving of the image sensor of the camera head 11102 in synchronization with the timing of the change of the light intensity to acquire an image in a time-division manner, and synthesizing the image, it is possible to generate an image in a high dynamic range without so-called underexposure and overexposure.

Further, the light source device 11203 may be configured to be able to supply light in a predetermined wavelength band corresponding to special light observation. In special light observation, for example, wavelength dependence of light absorption in body tissue is used to irradiate light in a narrower band than that of irradiation light during normal observation (that is, white light), thereby performing so-called narrow band imaging for imaging predetermined tissue such as a blood vessel on a mucosal surface at high contrast. Alternatively, in special light observation, a fluorescence observation for obtaining an image by fluorescence generated by emitting excitation light may be performed. In fluorescence observation, body tissue may be irradiated with excitation light and fluorescence from the body tissue may be observed (autofluorescence observation), or a reagent such as indocyanine green (ICG) may be locally injected into body tissue and the body tissue may be irradiated with excitation light corresponding to a fluorescence wavelength of the reagent to obtain a fluorescence image. The light source device 11203 can be configured to be able to supply narrow-band light and/or excitation light corresponding to such special light observation.

Figure 44:
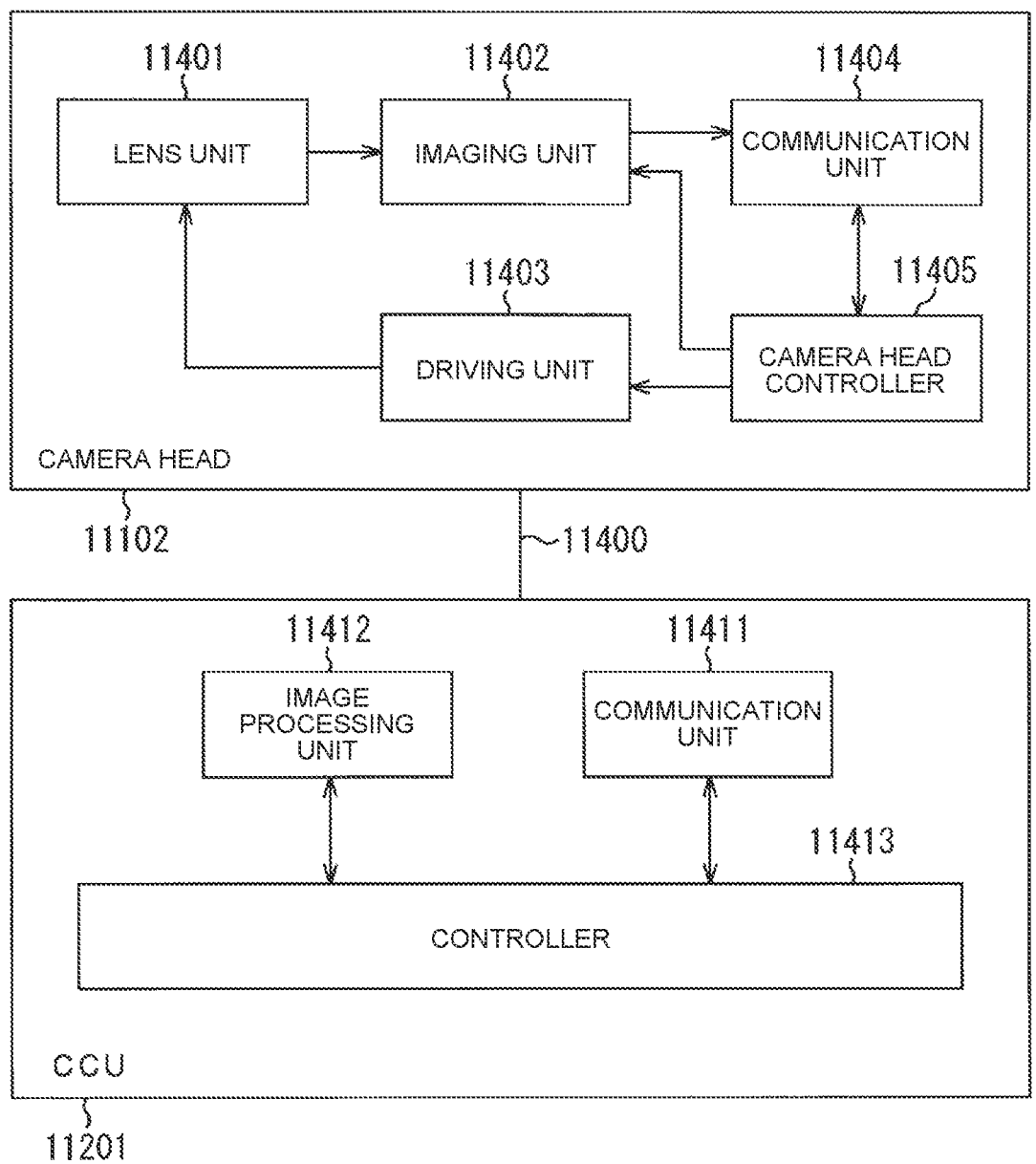
FIG. 44 is a block diagram illustrating an example of a functional configuration of a camera head and a CCU.

FIG. 44 is a block diagram illustrating an example of a functional configuration of the camera head 11102 and the CCU 11201 illustrated in FIG. 43.

The camera head 11102 includes a lens unit 11401, an imaging unit 11402, a driving unit 11403, a communication unit 11404, and a camera head controller 11405. The CCU 11201 includes a communication unit 11411, an image processing unit 11412, and a controller 11413. The camera head 11102 and the CCU 11201 are communicably connected by a transmission cable 11400.

The lens unit 11401 is an optical system provided at a portion connected to the lens barrel 11101. Observation light taken in from the distal end of the lens barrel 11101 is guided to the camera head 11102 and enters the lens unit 11401. The lens unit 11401 is configured by combining a plurality of lenses including a zoom lens and a focus lens.

The imaging unit 11402 includes an image sensor. The image sensor forming the imaging unit 11402 may be singular (so-called single-plate system) or plural (so-called multi-plate system). When the imaging unit 11402 is configured as a multi-plate system, for example, image signals corresponding to RGB are generated by respective image sensors, and a color image may be obtained by combining the image signals. Alternatively, the imaging unit 11402 may be configured to include a pair of image sensors for acquiring respective right-eye and left-eye image signals corresponding to a three-dimensional (3D) display. When 3D display is performed, the operator 11131 can more accurately comprehend a depth of living tissue at a surgical site.

When the imaging unit 11402 is configured as a multi-plate system, a plurality of lens units 11401 is provided for respective image sensors.

In addition, the imaging unit 11402 may not be provided in the camera head 11102. For example, the imaging unit 11402 may be provided inside the lens barrel 11101 immediately after the objective lens.

The driving unit 11403 includes an actuator, and moves the zoom lens and the focus lens of the lens unit 11401 by a predetermined distance along the optical axis under the control of the camera head controller 11405. In this way, the magnification and the focus of the image captured by the imaging unit 11402 can be appropriately adjusted.

The communication unit 11404 includes a communication device for transmitting and receiving various types of information to and from the CCU 11201. The communication unit 11404 transmits the image signal obtained from the imaging unit 11402 as RAW data to the CCU 11201 via the transmission cable 11400.

Further, the communication unit 11404 receives a control signal for controlling the driving of the camera head 11102 from the CCU 11201 and supplies the control signal to the camera head controller 11405. The control signal includes, for example, information related to the imaging conditions such as information for specifying a frame rate of the captured image, information for specifying an exposure value at the time of imaging, and/or information for specifying the magnification and focus of the captured image.

Note that the above-described imaging conditions such as the frame rate, the exposure value, the magnification, and the focus may be specified by a user as appropriate, or may be set automatically by the controller 11413 of the CCU 11201 based on the acquired image signal. That is, a so-called auto exposure (AE) function, an auto focus (AF) function, and an auto white balance (AWB) function are mounted on the endoscope 11100.

The camera head controller 11405 controls driving of the camera head 11102 based on a control signal from the CCU 11201 received via the communication unit 11404.

The communication unit 11411 includes a communication device for transmitting and receiving various types of information to and from the camera head 11102. The communication unit 11411 receives an image signal transmitted from the camera head 11102 via the transmission cable 11400.

In addition, the communication unit 11411 transmits a control signal for controlling driving of the camera head 11102 to the camera head 11102. The image signal and the control signal can be transmitted by telecommunications, optical communication, or the like.

The image processing unit 11412 performs various types of image processing on an image signal corresponding to RAW data transmitted from the camera head 11102.

The controller 11413 performs various controls related to the imaging of the surgical site or the like by the endoscope 11100 and display of the captured image. For example, the controller 11413 generates a control signal for controlling driving of the camera head 11102.

In addition, the controller 11413 causes the display device 11202 to display a captured image including the surgical site or the like based on an image signal subjected to image processing by the image processing unit 11412. In this instance, the controller 11413 may recognize various objects in the captured image by using various image recognition techniques. For example, the controller 11413 detects the shape, color, or the like of the edge of an object included in the captured image to be able to recognize a surgical tool such as a forceps, a specific body site, bleeding, mist at the time of using the energy treatment tool 11112, and the like. When causing the display device 11202 to display the captured image, the controller 11413 may use a result of the recognition and superimpose and display various types of operation support information on the image of the surgical site. The operation support information is superimposed and displayed to the operator 11131, and this allows the operator 11131 to have reduced burden and the operator 11131 to proceed with the surgery reliably.

The transmission cable 11400 connecting the camera head 11102 to the CCU 11201 is an electric signal cable corresponding to communication of electrical signals, an optical fiber corresponding to optical communication, or a composite cable thereof.

Here, in the illustrated example, although the communication is performed by wire using the transmission cable 11400, the communication between the camera head 11102 and the CCU 11201 may be performed wirelessly.

An example of the endoscopic surgery system to which the technique according to the present disclosure can be applied has been described above. The technique according to the present disclosure is applicable to the imaging unit 11402 and the like among the configurations described above. When the technique according to the present disclosure is applied to the imaging unit 11402 or the like, a clearer surgical site image can be obtained, and thus the operator can see the surgical site with reliability.

Note that although the endoscopic surgery system has been described here as an example, the technique according to the present disclosure may also be applied to, for example, a microscopic surgery system or the like.

16. Supplement

As described above, the favorable embodiments of the present disclosure have been described in detail with reference to the accompanying drawings, but the technical scope of the present disclosure is not limited to such examples. It is obvious that persons having ordinary knowledge in the technical field of the present disclosure can conceive various changes and alterations within the scope of the technical idea described in the claims, and it is naturally understood that these changes and alterations belong to the technical scope of the present disclosure.

Further, the effects described in the present specification are only illustrative or exemplary rather than being restrictive. That is, the technique according to the present disclosure can accomplish other effects apparent to those skilled in the art from the description of the present specification, in addition to or instead of the effects described above.

Note that the following configuration also belong to the technical scope of the present disclosure.

(1)
A solid-state image sensor comprising
a stacked structure that includes
a semiconductor substrate,
a first photoelectric converter provided above the semiconductor substrate and converting light into charges, and
a second photoelectric converter provided above the first photoelectric converter and converting light into charges,
wherein the first photoelectric converter and the second photoelectric converter include a photoelectric conversion stacked structure in which a common electrode, a photoelectric conversion film, and a readout electrode are stacked so that the first photoelectric converter and the second photoelectric converter are in a line-symmetrical relationship with each other with a vertical plane perpendicular to a stacking direction of the stacked structure as an axis of symmetry.

(2)
The solid-state image sensor according to (1), wherein the photoelectric conversion stacked structure of the first photoelectric converter has a structure in which the photoelectric conversion stacked structure of the second photoelectric converter is inverted around the vertical plane as an axis.

(3)
The solid-state image sensor according to (1) or (2), wherein
the photoelectric conversion stacked structure further includes a semiconductor layer sandwiched between the photoelectric conversion film and the readout electrode.

(4)
The solid-state image sensor according to any one of (1) to (3), wherein
the photoelectric conversion stacked structure further includes a storage electrode facing a first surface located on a side opposite to the common electrode of the photoelectric conversion film through an insulating film.

(5)
The solid-state image sensor according to (4), wherein the photoelectric conversion stacked structure further includes a transfer electrode facing the first surface through the insulating film and controlling transfer of charges.

(6)
The solid-state image sensor according to (4) or (5), wherein
the photoelectric conversion stacked structure further includes a shield electrode facing the first surface through the insulating film.

(7)
The solid-state image sensor according to any one of (1) to (6), wherein
the photoelectric conversion stacked structure of the first photoelectric converter includes
a first readout electrode,
a first photoelectric conversion film provided above the first readout electrode, and
a first common electrode provided above the first photoelectric conversion film, and
the photoelectric conversion stacked structure of the second photoelectric converter includes
a second common electrode,
a second photoelectric conversion film provided above the second common electrode, and
a second readout electrode provided above the second photoelectric conversion film.

(8)
The solid-state image sensor according to (7), wherein the first common electrode and the second common electrode are integrated electrodes that are common to the first photoelectric converter and the second photoelectric converter.

(9)
The solid-state image sensor according to (7) or (8), wherein
the stacked structure further includes a third photoelectric converter provided below the first photoelectric converter and converting light into charges.

(10)
The solid-state image sensor according to (9), wherein the stacked structure further includes a first controller provided above the second photoelectric converter and having a plurality of pixel transistors electrically connected to the second photoelectric converter.

(11)
The solid-state image sensor according to (10), wherein the first controller includes another semiconductor layer, the other semiconductor layer has an aperture that exposes a part of the second photoelectric converter when viewed from above a light incident surface.

(12)
The solid-state image sensor according to (7) or (8), wherein
the stacked structure further includes
a third photoelectric converter provided above the second photoelectric converter and converting light into charges, and
a second controller provided so as to be sandwiched between the second photoelectric converter and the third photoelectric converter and including a plurality of pixel transistors electrically connected to the second photoelectric converter and the third photoelectric converter.

(13)
The solid-state image sensor according to any one of (9) to (12), wherein
the third photoelectric converter includes
a third readout electrode,
a third photoelectric conversion film provided above the third readout electrode, and
a third common electrode provided above the third photoelectric conversion film.

(14)
The solid-state image sensor according to (13), wherein the first photoelectric conversion film, the second photoelectric conversion film, and the third photoelectric conversion film are formed of an organic photoelectric conversion film.

(15)
The solid-state image sensor according to (7), wherein
the second common electrode extends long along an extending direction of the vertical plane, as compared to the second photoelectric conversion film, and
the second photoelectric conversion film and the second common electrode, which are stacked, are formed in a stepwise shape at an end.

(16)
The solid-state image sensor according to any one of (1) to (15), wherein the semiconductor substrate includes a fourth photoelectric converter converting light into charges.

(17)
A solid-state imaging device comprising a plurality of solid-state image sensors,
each of the solid-state image sensors including
a stacked structure that includes
a first photoelectric converter provided above a semiconductor substrate and converting light into charges, and
a second photoelectric converter provided above the first photoelectric converter and converting light into charges, wherein
the first photoelectric converter and the second photoelectric converter include a photoelectric conversion stacked structure in which a common electrode, a photoelectric conversion film, and a readout electrode are stacked so that the first photoelectric converter and the second photoelectric converter are in a line-symmetrical relationship with each other with a vertical plane perpendicular to a stacking direction of the stacked structure as an axis of symmetry.

(18)
An electronic apparatus comprising a solid-state imaging device including a plurality of solid-state image sensors,
each of the solid-state image sensors including
a stacked structure that includes
a first photoelectric converter provided above a semiconductor substrate and converting light into charges, and
a second photoelectric converter provided above the first photoelectric converter and converting light into charges, wherein
the first photoelectric converter and the second photoelectric converter include a photoelectric conversion stacked structure in which a common electrode, a photoelectric conversion film, and a readout electrode are stacked so that the first photoelectric converter and the second photoelectric converter are in a line-symmetrical relationship with each other with a vertical plane perpendicular to a stacking direction of the stacked structure as an axis of symmetry.

(19)
A method of manufacturing a solid-state image sensor, comprising:
sequentially stacking a first readout electrode, a first photoelectric conversion film, and a first common electrode on a first substrate;
sequentially stacking a second readout electrode, a second photoelectric conversion film, and a second common electrode on a second substrate; and
bonding the first substrate to the second substrate so that the first common electrode and the second common electrode face each other.

(20)
A method of manufacturing a solid-state image sensor, comprising:
bonding a third substrate on which a first photoelectric converter and a second photoelectric converter converting light into charges are stacked to a fourth substrate on which a plurality of pixel transistors is formed; and
removing the plurality of pixel transistors located in a predetermined region.

(21)
The method of manufacturing a solid-state image sensor according to (20), further comprising:
forming a plurality of the second photoelectric converters on a plane of the third substrate at a first interval; and
forming the plurality of pixel transistors on a plane of the fourth substrate at a second interval shorter than the first interval.

REFERENCE SIGNS LIST

1 SOLID-STATE IMAGING DEVICE
2 PIXEL ARRAY UNIT
10, 10a, 10b, 10c, 10d, 12, 12b, 12c, 12d, 90, 90a, 92a SOLID-STATE IMAGE SENSOR
32 VERTICAL DRIVE CIRCUIT UNIT
36 COLUMN SIGNAL PROCESSING CIRCUIT UNIT
100, 200, 300, 400 PHOTOELECTRIC CONVERSION ELEMENT
102, 202 COMMON ELECTRODE
104, 204 PHOTOELECTRIC CONVERSION FILM
106, 206, 702 SEMICONDUCTOR LAYER
108, 208 READOUT ELECTRODE
110, 210 STORAGE ELECTRODE 120, 220 TRANSFER ELECTRODE
130, 230 SHIELD ELECTRODE
210a TRANSPARENT CONDUCTIVE FILM
250 ON-CHIP LENS
252 HIGH REFRACTIVE INDEX LAYER
340, 342, 344, 346, 346a, 346b, 540, 542, 642, 740 INSULATING FILM
402 ANTI-REFLECTION FILM
430, 522, 530, 630, 730 WIRING LINE
500, 600, 750, 760 SEMICONDUCTOR SUBSTRATE
500a, 600a BONDING SURFACE
502, 512, 514, 714 SEMICONDUCTOR REGION
514a FLOATING DIFFUSION PORTION
520 THROUGH ELECTRODE
532, 632, 732 ELECTRODE
700 PIXEL TRANSISTOR/WIRING LINE LAYER
710 PIXEL TRANSISTOR
800, 802, 804 APERTURE
900 ELECTRONIC APPARATUS
902 IMAGING DEVICE
910 OPTICAL LENS
912 SHUTTER MECHANISM
914 DRIVE CIRCUIT UNIT
916 SIGNAL PROCESSING CIRCUIT UNIT
950 REGION

What is claimed is:

1. A solid-state image sensor, comprising:
a stacked structure that includes:
a semiconductor substrate;
a first photoelectric converter provided above the semiconductor substrate and converting light into first charges; and
a second photoelectric converter provided above the first photoelectric converter and converting the light into second charges,
wherein the first photoelectric converter and the second photoelectric converter each includes a photoelectric conversion stacked structure including a common electrode, a photoelectric conversion film, a readout electrode, and a semiconductor layer provided between the photoelectric conversion film and the readout electrode, stacked so that the first photoelectric converter and the second photoelectric converter are in a line-symmetrical relationship with each other with a vertical plane perpendicular to a stacking direction of the stacked structure as an axis of symmetry, and
wherein the semiconductor layer includes oxide semiconductor materials.

2. The solid-state image sensor according to claim 1, wherein the photoelectric conversion stacked structure of the first photoelectric converter has a structure in which the photoelectric conversion stacked structure of the second photoelectric converter is inverted around the vertical plane.

3. The solid-state image sensor according to claim 1, wherein the photoelectric conversion stacked structure for the first photoelectric converter and the photoelectric conversion stacked structure for the second photoelectric converter each further includes a storage electrode facing a first surface located on a side opposite to the common electrode of the photoelectric conversion film through an insulating film.

4. The solid-state image sensor according to claim 3, wherein the photoelectric conversion stacked structure for the first photoelectric converter and the photoelectric conversion stacked structure for the second photoelectric converter each further includes a transfer electrode facing the first surface through the insulating film and controlling transfer of charges.

5. The solid-state image sensor according to claim 3, wherein the photoelectric conversion stacked structure for the first photoelectric converter and the photoelectric conversion stacked structure for the second photoelectric converter each further includes a shield electrode facing the first surface through the insulating film.

6. The solid-state image sensor according to claim 1,
wherein the photoelectric conversion stacked structure of the first photoelectric converter includes:
a first readout electrode as the readout electrode;
a first photoelectric conversion film as the photoelectric conversion film provided above the first readout electrode; and
a first common electrode as the common electrode provided above the first photoelectric conversion film, and
wherein the photoelectric conversion stacked structure of the second photoelectric converter includes:
a second common electrode as the common electrode;
a second photoelectric conversion film as the photoelectric conversion film provided above the second common electrode;
and
a second readout electrode as the readout electrode provided above the second photoelectric conversion film.

7. The solid-state image sensor according to claim 6, wherein the first common electrode and the second common electrode are integrated electrodes that are common to the first photoelectric converter and the second photoelectric converter.

8. The solid-state image sensor according to claim 6, wherein the stacked structure further includes a third photoelectric converter provided below the first photoelectric converter and converting the light into third charges.

9. The solid-state image sensor according to claim 8, wherein the stacked structure further includes a first controller provided above the second photoelectric converter and having a plurality of pixel transistors electrically connected to the second photoelectric converter.

10. The solid-state image sensor according to claim 8, wherein the third photoelectric converter includes:
a third readout electrode;
a third photoelectric conversion film provided above the third readout electrode; and
a third common electrode provided above the third photoelectric conversion film.

11. The solid-state image sensor according to claim 10, wherein the first photoelectric conversion film, the second photoelectric conversion film, and the third photoelectric conversion film each are formed of an organic photoelectric conversion film.

12. The solid-state image sensor according to claim 6, wherein the stacked structure further includes:
a third photoelectric converter provided above the second photoelectric converter and converting the light into third charges; and
a second controller provided so as to be sandwiched between the second photoelectric converter and the third photoelectric converter and including a plurality of pixel transistors electrically connected to the second photoelectric converter and the third photoelectric converter.

13. The solid-state image sensor according to claim 6,
wherein the second common electrode extends long along an extending direction of the vertical plane, as compared to the second photoelectric conversion film, and
wherein the second photoelectric conversion film and the second common electrode, which are stacked, are formed in a stepwise shape at an end.

14. The solid-state image sensor according to claim 1, wherein the semiconductor substrate includes a photoelectric converter provided within the semiconductor substrate converting the light into third charges different than the first charges and the second charges.

15. The solid-state image sensor according to claim 1, wherein the semiconductor layer includes at least one of organic semiconductor materials and indium gallium zinc oxide.

16. The solid-state image sensor according to claim 15, wherein the organic semiconductor materials includes transition metal dichalcogenide, silicon carbide, diamond, graphene, carbon nanotube, condensed polycyclic hydrocarbon compounds, or condensed heterocyclic compound.

17. A solid-state imaging device, comprising:
a plurality of solid-state image sensors,
wherein each of the solid-state image sensors includes:
a stacked structure that includes:
a first photoelectric converter provided above a semiconductor substrate and converting light into first charges, and
a second photoelectric converter provided above the first photoelectric converter and converting the light into second charges,
wherein the first photoelectric converter and the second photoelectric converter each includes a photoelectric conversion stacked structure including a common electrode, a photoelectric conversion film, a readout electrode, and a semiconductor layer provided between the photoelectric conversion film and the readout electrode, stacked so that the first photoelectric converter and the second photoelectric converter are in a line-symmetrical relationship with each other with a vertical plane perpendicular to a stacking direction of the stacked structure as an axis of symmetry, and
wherein the semiconductor layer includes oxide semiconductor materials.

18. An electronic apparatus, comprising:
a solid-state imaging device including:
a plurality of solid-state image sensors,
wherein each of the solid-state image sensors includes:
a stacked structure that includes:
a first photoelectric converter provided above a semiconductor substrate and converting light into first charges; and
a second photoelectric converter provided above the first photoelectric converter and converting the light into second charges,
wherein the first photoelectric converter and the second photoelectric converter each includes a photoelectric conversion stacked structure including a common electrode, a photoelectric conversion film, a readout electrode, and a semiconductor layer provided between the photoelectric conversion film and the readout electrode, stacked so that the first photoelectric converter and the second photoelectric converter are in a line-symmetrical relationship with each other with a vertical plane perpendicular to a stacking direction of the stacked structure as an axis of symmetry, and
wherein the semiconductor layer includes oxide semiconductor materials.

19. A method of manufacturing a solid-state image sensor, comprising:
sequentially stacking a first readout electrode, a first semiconductor layer, a first photoelectric conversion film, and a first common electrode on a first substrate;
sequentially stacking a second readout electrode, a second semiconductor layer, a second photoelectric conversion film, and a second common electrode on a second substrate; and
bonding the first substrate to the second substrate so that the first common electrode and the second common electrode face each other,
wherein the first semiconductor layer and the second semiconductor layer each includes oxide semiconductor materials.

* * * * *